United States Patent [19]

Tanigashira et al.

[11] Patent Number: 5,434,526

[45] Date of Patent: Jul. 18, 1995

[54] OUTPUT CIRCUIT AND SEMICONDUCTOR INTEGRATED CIRCUIT DEVICE

[75] Inventors: Syouichi Tanigashira, Satsuma; Fumitaka Asami, Kawasaki, both of Japan

[73] Assignees: Fujitsu Limited, Kawasaki; Kyushu Fujitsu Electronics Ltd., Satsuma, both of Japan

[21] Appl. No.: 284,291

[22] Filed: Aug. 2, 1994

Related U.S. Application Data

[63] Continuation of Ser. No. 904,010, Jun. 24, 1992, abandoned.

[30] Foreign Application Priority Data

Jun. 27, 1991 [JP] Japan .................. 3-156868

[51] Int. Cl.⁶ ............................................. H03K 17/16
[52] U.S. Cl. ..................................... 327/389; 327/108; 327/188; 327/391; 327/436; 327/437; 327/534
[58] Field of Search ............ 307/246, 264, 280, 296.1, 307/296.2, 296.4, 296.5, 296.8, 571, 575, 576, 577, 572, 579, 583, 585; 327/108, 188, 313, 374, 379, 383, 384, 389, 391, 425, 436, 437, 534

[56] References Cited

U.S. PATENT DOCUMENTS

| | | | |
|---|---|---|---|
| 3,657,575 | 4/1972 | Taniguchi et al. | 307/304 |
| 4,259,686 | 3/1981 | Suzuki et al. | 307/262 |
| 4,324,991 | 4/1982 | Tamaki | 307/585 |
| 4,368,524 | 1/1983 | Nakamura | 307/296.2 |
| 4,371,797 | 2/1983 | Frank | 307/577 |
| 4,529,897 | 7/1985 | Suzuki et al. | 307/583 |
| 4,725,813 | 2/1988 | Miyada | 307/572 |
| 4,728,825 | 3/1988 | Sugayama et al. | 307/577 |
| 5,004,936 | 4/1991 | Andresen | 307/443 |
| 5,041,739 | 8/1991 | Goto | 307/296.2 |
| 5,157,280 | 10/1992 | Schreck et al. | 307/296.5 |
| 5,157,291 | 10/1992 | Shimoda | 307/573 |
| 5,172,013 | 12/1992 | Matsumura | 307/296.2 |

FOREIGN PATENT DOCUMENTS 0139746 2/1985 Japan ................................ 307/572

OTHER PUBLICATIONS

IBM Technical Disclosure Bulletin-Luckett, "Substrate Voltage Generator With Compensation For Depletion-Mode and Enhancement-Mode Field-Effect Transistors", 12/81, p. 3537.

*Primary Examiner*—Terry D. Cunningham
*Attorney, Agent, or Firm*—Staas & Halsey

[57] ABSTRACT

The present invention relates to an output circuit and a semiconductor integrated circuit. It is an object of the present invention to cut off a passage of a current through a forward parasitic diode of a transistor connected to a power supply line and a ground line at a time of suspension of output operation of the relevant circuit, and to raise an output high level to the utmost and lower an output low level to the utmost at time of normal output operation. A complementary MOS high impedance output circuit composed of a first field effect transistor and a second field effect transistor is structured so as to include provision of a third field effect transistor for controlling one of a state of a backgate of the first field effect transistor and a state of a backgate of the second field effect transistor and also to include provision of a fourth field effect transistor for controlling one of the state of the backgate of the first and second field effect transistor complementarily to the control of the state of the backgate of the third field effect transistor.

12 Claims, 41 Drawing Sheets

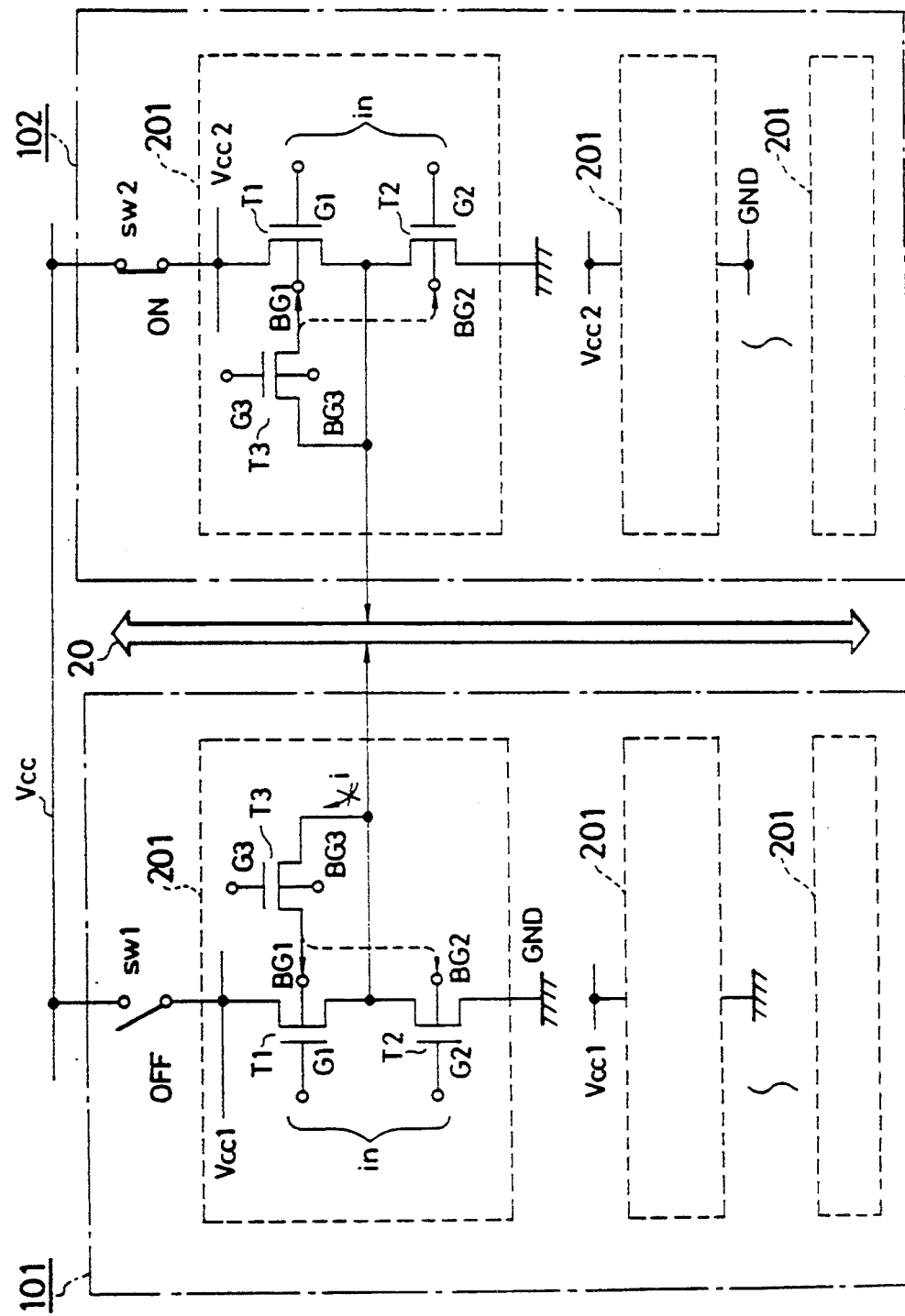

OUTPUT CIRCUIT AND SEMICONDUCTOR INTEGRATED CIRCUIT DEVICE

This application is a continuation of application Ser. No. 07/904,010, filed Jun. 24, 1992, now abandoned.

BACKGROUND OF THE INVENTION

The present invention relates to an output circuit, and more particularly, to an improvement of an output voltage level of a circuit for amplifying and outputting a logical signal and the like.

A multi-function and high-performance data processing unit has been demanded recently as the quantity of information increases, and the processing unit, generally having a semiconductor integrated circuit device Including N- and P-channel type field effect transistors formed with high accumulation and high density, is packaged on a printed circuit board and the like, and output terminals of these field effect transistors are connected to a common bus for use.

In such a case, power supply control is sometimes adopted such that the output operation of the relevant semiconductor integrated circuit device is sustained and the output operation of another semiconductor integrated circuit device is continued. As a result, the output level of a common bus is lowered sometimes, caused by a forward diode of a transistor connected to a power supply line of the semiconductor integrated circuit device in which the output operation has been sustained.

Further, a tendency that output circuits, which are to satisfy the standard of RS422 are integrated, is shown. With a tendency, an output circuit using N-channel type field effect transistors is the likeliest, but the output level at the time of normal operation is lowered sometimes, due to dependency of the backgate thereof.

Thus, an output circuit which is able to cut off a current passage with a forward parasitic diode of a transistor connected to one of a power supply line and a ground line as a path and is also able to lower the output low level to the utmost by increasing the output high level to the utmost at the time of normal output operation is desired.

FIGS. 39(a) to 41(b) are explanatory diagrams related to conventional examples. FIGS. 39(a) and 39(b) are explanatory diagrams of a first output circuit related to a conventional example and a semiconductor integrated circuit thereof.

FIG. 39(a) shows a complementary output circuit (CMOS circuit) such as a buffer circuit and a bus driver circuit for amplifying and outputting an input signal. The relevant output circuit is composed of, for example, P-channel and N-channel MOS transistors (hereinafter referred to simply as a first and second transistors) Tp and Tn connected in series between a power supply line Vcc and a ground line GND as shown in FIG. 39(a). Besides, a backgate BG of the first transistor Tp is connected to the power supply line Vcc, and a backgate BG of the second transistor Tn is connected to the ground line GND. This is made for the purpose of preventing an electrical floating state of the first and the second transistors Tp and Tn from being produced.

The function of the relevant circuit is such that, when a high ("H") level is inputted to the gates G1, G2 of the first and the second transistors Tp and Tn as an input signal, an output signal=low ("L") level is outputted at drain D=output terminal out of both transistors Tp and Tn. Further, when an "L" level is inputted to the gates G1, G2 of the first and the second transistors Tp and Tn as an input signal, an output signal="H" level is outputted at the drain D=output terminal out of both transistors Tp and Tn. With this, a logical signal and the like applied to an input terminal in are amplified and outputted.

Besides, D1 represents a first parasitic diode, which is a forward junction being parasitic between the drain D and the power supply line Vcc when the first transistor Tp is seen from the output terminal out. Further, D2 represents a second parasitic diode, which is a forward junction being parasitic between the drain D and the ground line GND when the second transistor Tn is seen from the output terminal out.

FIG. 39(b) shows a sectional structural view of a semiconductor device of the relevant output circuit. In FIG. 39(b), a semiconductor device in which the output circuit is integrated is provided with, for example, the first transistor Tp and the second transistor Tn on an n-type semiconductor substrate 1.

The first transistor Tp includes a pair of P+ type diffused layers 3A and 3B and an N+ type diffused layer (backgate lead electrode) 4A in the n-type semiconductor substrate 1, and a first gate electrode 6A is provided on the channel regions of the P+ type diffused layers 3A and 3B through a first gate oxide film 5A.

The second transistor Tn includes a pair of N+ type diffused layers 3C and 3D and a P+ type diffused layer (backgate lead electrode) 4B in a P+-well layer 2, and a second gate electrode 6B is provided on the channel regions of the N+ type diffused layers 3C and 3D through a second gate oxide film 5B.

Further, one P+ type diffused layer 3A of the first transistor Tp and one N+ type diffused layer 3C of the second transistor Tn are connected to each other and extended to the output terminal out. The other P+ type diffused layer 3B and the N+ type diffused layer 4A of the first transistor Tp are connected to each other and further to the power supply line Vcc, and the other N+ type diffused layer 3D and the P+ diffused layer 4B of the second transistor Tn are connected to each other and extended to the ground line GND.

Besides, the first parasitic diode D1 is a pn junction being parasitic among the P+ diffused layer 3B of the first transistor Tp, the N-type semiconductor substrate 1 and the N+ type diffused layer 4A. Further, the second parasitic diode D2 is a pn junction being parasitic among the N+ type diffused layer 3D, the P-well layer 2 and the P+ diffused layer 4B.

FIGS. 40(a) and 40(b) are explanatory diagrams of a second output circuit related to a conventional example and a semiconductor integrated circuit device thereof.

FIG. 40(a) shows an output circuit such as a buffer circuit and a bus driver circuit for amplifying and outputting an input signal. The relevant output circuit is composed of, for example, N-channel MOS transistors (hereinafter referred to simply as the first and the second transistors) TN1 and TN2 connected in series between the power supply line Vcc and the ground line GND as shown in FIG. 40(a). Besides, backgate BG of the first and the second transistors TN1 and TN2 are connected to each other, which are connected further to the ground line GND.

The function of the relevant circuit is such that, when a high ("H") level is applied as an input signal to the gate G of the first transistor TN1 and a low ("L") level is applied to the gate G of the second transistor TN2, an output signal="H" level is outputted at the drain D=output terminal out of both transistors TN1 and TN2. Further, when an "L" level is inputted to the gate G of the first transistor TN1 and a "H" level is inputted to the gate G of the second transistor TN2, an output signal="L" level is outputted at the output terminal out of both transistors TN1 and TN2. With this, a logical signal and the like applied to the input terminal in are amplified and outputted. Besides, Dn represents a parasitic diode, which is a forward junction being parasitic between the drain D and the ground line GND when the second transistor TN2 is seen from the output terminal out.

FIG. 40(b) shows a sectional structural view of a semiconductor device of the relevant output circuit. In FIG. 40(b), the semiconductor device with the output circuit accumulated therein is provided with, for example, the first transistor TN1 and the second transistor TN2 in an n-type semiconductor substrate 1.

The first transistor TN1 includes a pair of first n-type diffused layers 3E and 3F and a first P+ type diffused layer (backgate lead layer) 4C in a first P-well layer 2A, and a first gate electrode 6C is provided on channel regions of the N+ type diffused layers 3E and 3F through a first gate oxide film 5C.

The second transistor TN2 includes a pair of second N+ type diffused layers 3G and 3H and a second P+ type diffused layer (backgate lead electrode) 4D in a second P-well layer 2B, and a second gate electrode 6D is provided on channel regions of the N+ type diffused layers 3G and 3H through a second gate oxide film 5D.

Further, one N+ type diffused layer 3E of the first transistor TN1 and one N+ type diffused layer 3G of the second transistor T2 are connected to each other and extended to the output terminal out, the other N+ type diffused layer 3F of the transistor TN1 is connected to the power supply line Vcc, and the other N+ type diffused layer 3H and the second P+ type diffused layer 4D of the second transistor TN2 are connected to each other and extended further to the ground line GND.

Besides, the parasitic diode Dn represents a pn junction being parasitic among the N+ type diffused layer 3H, the first P-well layer 2B and the first P+ type diffused layer 4D, and the output impedance is increased because the parasitic diode Dn is reversed in direction when the first and the second transistors TN1 and TN2 are seen from the output terminal out.

Now, in a conventional example, a semiconductor integrated circuit device, on which the first output circuit is integrated, is packaged on a printed circuit board and the like, and the output terminals out thereof are connected to a common bus 9 for use, sometimes, as shown In FIG. 41(a). At this time, power supply control, such that the output operation of a semiconductor integrated circuit device 7 is sustained and the output operation of another semiconductor integrated circuit device 8 is continued, is adopted sometimes.

In this case, the first power supply line Vcc1 of the semiconductor integrated circuit device 7 is deactivated (OFF) so as to stop the output operation thereof and the second power supply line Vcc2 of another semiconductor integrated device 8 is activated (ON) so as to continue the output operation thereof due to the necessity of selecting the logical output signal.

As a result, it sometimes happens that the output "H" level of the common bus 9 is lowered because of the first parasitic diode (forward diode) D1 of the semiconductor integrated circuit device 7 in which the output operation is sustained. It is conceivable to occur because of the reason that a forward current i, that charges wiring capacitor CO and the like of the power supply line Vcc1 by flowing from the output terminal out of the semiconductor integrated circuit device 7 through the first parasitic diode D1 of the device 7 at time when the output operation has been stopped (FIG. 41(a)).

This poses a first problem that the output "H" level outputted from another semiconductor integrated circuit device 8 to the common bus 9 is lowered remarkably unless the output impedance of the semiconductor integrated circuit device 7 in which the output operation has been sustained is increased.

Further, the output circuit composed of the first and the second transistors TN1 and TN2 having a high output impedance when seen from the output terminal out, i.e., the output circuit which is to satisfy the standard of RS422 (high speed operation standard) is integrated, as shown in FIG. 40(a), solves the first problem.

However, there is a second problem in that the output "H" level at the time of normal operation is lowered due to dependency of the backgate BG of the first and the second transistors TN1 and TN2. In this case, when in "H" level is applied to the gate G of the first transistor TN1, the voltage level at the output terminal out should be ideally at 4.2(V), obtained by subtracting a threshold voltage Vth=voltage drop at one stage in case it is assumed that the threshold voltage Vth of the first transistor TN1 is Vth=0.8(V) and the potential of the power supply line is at 5(V) for instance, but the voltage level is lowered to 4.2(V) or less practically.

Since the backgate BG of the first transistor TN1, i.e., the potential of the P-well layer 2A, is connected to the ground line GND through the P+ type diffused layer 4C as shown in FIG. 40(b), the potential is at 0(V). This is equivalent to a negative bias voltage being applied when the backgate BG is seen from the source S (output terminal out) of the first transistor TN1, and the state that reverse bias is applied is presented more distinctly as the voltage level of the output terminal out is increased. With this, an apparent threshold voltage Vthb of the first transistor TN1 exceeds Vth=0.8(V), and a voltage equal to the ideal threshold voltage Vth=a voltage drop at one stage is not obtainable (FIG. 41(b)).

Besides, in FIG. 39(a) and FIG. 40(a), when an output level at potential 0(V) or less of the ground line GND is applied to the output terminal out, it flows out of the ground line GND to the output terminal out sometimes by means of the second parasitic diode D2 and the parasitic diode Dn, respectively. With this, the output level of the output circuit becomes unstable, and hence, the reliability of the semiconductor integrated circuit device is lowered sometimes.

SUMMARY OF THE INVENTION

It is an object of the present invention to overcome such problems of a conventional example and to provide an output circuit capable of cutting off a current passage with forward parasitic diodes of transistors connected to a power supply line and a ground line as a path when output operation of the circuit is suspended, and also is capable of lowering the output low level to the utmost by increasing the output high level at a time of normal output operation to the utmost.

Further, it is another object of the present invention to provide a semiconductor integrated circuit device using the above-described output circuit.

FIG. 1 is a principle diagram (1) of an output circuit according to the present invention, FIG. 2 is a principle diagram (2) of an output circuit according to the present invention, and FIG. 3 is a principle diagram of a semiconductor integrated circuit device according to the present invention, respectively.

First to eighth output circuits of the present invention are characterized in that, in an output circuit in which a first field effect transistor of one conductivity type and a second field effect transistor of one conductivity type are connected in series with each other between a first power supply line and a second ground line and a drain junction of the first field effect transistor and the second field effect transistor is connected to an output terminal as shown in FIG. 1, a third field effect transistor for controlling one of the state of the backgate of the first field effect transistor and the state of the backgate of the second field effect transistor is provided.

According to the first to the eighth output circuits of the present invention, an n-type third field effect transistor for controlling the state of the backgate of the first field effect transistor is provided, in which the gate of the transistor is connected to one of the first power supply line and the gate of the first field effect transistor and the backgate thereof is connected to one of the second power supply line and the backgate of the first field effect transistor.

As a result, even if a voltage at a level higher than that of the power supply line is applied to the output terminals at the time of suspension of output operation of the first to the eighth output circuits, the backgate of the first field effect transistor is brought to an electrically floating state by means of an OFF operation of the third field effect transistor. With this, it becomes possible to maintain the output terminals of the first to the eighth output circuits in a high impedance state, and also to cut off a current passage originating from forward diodes being parasitic between the first power supply line and the backgate of the first field effect transistor.

Besides, at time of normal operation of the first to eighth output circuits, it is possible to reduce the backgate dependency of the first and the second field effect transistors because the third field effect transistor performs an ON operation.

Furthermore, 9th to 16th output circuits of the present invention, which are output circuits in which an n-type first field effect transistor and a p-type second field effect transistor are connected in series with each other, the first field effect transistor is connected to a first power supply line on a high potential side, the second field effect transistor is connected to a second power supply line on a low potential side, and the drain junction of the n-type first field effect transistor and the p-type second field effect transistor is connected to the output terminal, comprise a third field effect transistor for controlling one of the state of the backgate of the first field effect transistor and the state of the backgate of the second field effect transistor.

According to the 9th to the 16th output circuits of the present invention, the n-type third field effect transistor for controlling the state of the backgate of the second field effect transistor is provided, the gate of the transistor is connected to one of the second power supply line and the gate of the second field effect transistor, and the backgate thereof is connected to one of the first power supply line and the backgate of the second field effect transistor.

As a result, even if a voltage at a level lower than that of the second power supply line is applied to the output terminals at a time of suspension of the output operation of the 9th to the 16th output circuits, the backgate of the second field effect transistor is brought to an electrically floating state by means of an OFF operation of the third field effect transistor. With this, it becomes possible to cut off a current passage originating from the forward diode being parasitic between the second power supply line and the backgate of the second field effect transistor.

Besides, at a time of normal operation of the 9th to the 16th output circuits, it is possible to reduce the backgate dependency of the second field effect transistor because the third field effect transistor performs an ON operation.

Furthermore, 17th to 24th output circuits of the present invention are characterized in that, in an output circuit in which a first field effect transistor and a second field effect transistor both of one conductive type are connected in series between a first power supply line and a second ground line and drain junction of the first field effect transistor and the second field effect transistor is connected to an output terminal, a third field effect transistor for controlling the state of the backgate of the first field effect transistor and the backgate of the second field effect transistor is provided, and a fourth field effect transistor for controlling the state of the backgate of the third field effect transistor and a signal inversion element for supplying an input signal to the fourth field effect transistor are further provided.

According to the 17th to the 24th output circuits, the n-type fourth field effect transistor for assisting the third field effect transistor of the 1st to the 16th output circuits and the signal inversion element for supplying an input signal to the fourth field effect transistor are provided.

As a result, even if a voltage at a level higher than that of the power supply line is applied to the output terminals at a time of suspension of output operation of the 17th to the 24th output circuits, it becomes possible to bring the backgate of the first field effect transistor to the potential level of the second power supply line without bringing the backgate of the first field effect transistor to an electrically floating state as in the first to the eighth output circuits by means of an OFF operation of the third field effect transistor and an ON operation of the fourth field effect transistor. With this, it becomes possible to cut off a current passage originating from a forward diode being parasitic between the first power supply line and the backgate of the first field effect transistor as in the first to the eighth output circuits. Besides, at the time of normal operation of the 17th to the 24th output circuits, it is possible to reduce backgate dependency of the first field effect transistor by means of an ON operation of the third field effect transistor and an OFF operation of the fourth field effect transistor.

Furthermore, a 25th to a 32nd output circuits of the present invention, which are output circuits in which as shown in FIG. 2, an n-type first field effect transistor and a p-type second field effect transistor are connected in series with each other, the first Field effect transistor is connected to a first power supply line on the high potential side, the second field effect transistor is connected to a second power supply line on the low potential side, and a drain junction of the n-type first field effect transistor and the p-type second field effect transistor is connected to an output terminal, comprise a third field effect transistor for controlling one of the state of the backgate of the first field effect transistor and the state of the backgate of the second field effect transistor, a fourth field effect transistor for controlling the state of the backgate of the third field effect transistor and a signal inversion element for supplying an input signal to the fourth field effect transistor.

Furthermore, according to the 25th to the 32nd output circuits of the present invention, the p-type fourth field effect transistor for assisting the third field effect transistor is provided, the gate of the third field effect transistor is connected to the second power supply line and the gate of the second field effect transistor, and the backgate thereof is connected to one of the first power supply line and the backgate of the second field effect transistor.

As a result, even if a voltage at a level lower than that of the second power supply line is applied to the output terminals at the time of suspension of output operation of the 25th to the 32nd output circuits, it becomes possible to bring the backgate of the transistor to the level of the first power supply line without bringing the backgate of the second field effect transistor to an electrically floating state as in the 9th to the 16th output circuits by means of an OFF operation of the third field effect transistor and ON operation of the fourth field effect transistor. With this, it becomes possible to cut off a current passage originating from a forward diode being parasitic between the second power supply line and the backgate of the second field effect transistor.

Besides, at time of normal operation of the 25th to the 32nd output circuits, it becomes possible to reduce backgate dependency of the second field effect transistor by means of an ON operation of the third field effect transistor and an OFF operation of the fourth field effect transistor.

Thus, it becomes possible to manufacture a semiconductor integrated circuit device such as a bus buffer and an output buffer of high reliability.

Incidentally, a semiconductor integrated circuit device of the present invention is characterized in that the 1st to the 32nd output circuits of the present invention are applied to a complementary MOS high impedance output circuit of a semiconductor integrated device connected to a signal transmission line for common use as shown in FIG. 3, thus achieving the object described previously.

Further, according to a semiconductor integrated circuit of the present invention, the 1st to the 32nd output circuits of the present invention are applied to a complementary MOS high impedance circuit of a semiconductor integrated circuit device applied to a signal transmission line for common use. As a result, it becomes possible to maintain the impedance of the output terminal at a high resistance value by the third and the fourth field effect transistors. Thus, even in a case where power supply control is adapted such that the output operation of the semiconductor integrated circuit device is sustained and the output operation of another semiconductor integrated circuit devices is continued, a forward diode parasitic in the power supply direction from the output side of the semiconductor integrated circuit device in which the output operation is sustained is eliminated. Thus,it becomes possible to suppress lowering of the output "H" level of the signal transmission line to the utmost. With tills, it becomes possible to maintain, irrespective of suspension the output operation of the semiconductor integrated circuit device, existence of power supply and the like, the output level of another semiconductor integrated circuit device in a state of a predetermined voltage level. Thus, contributions to improvement of the reliability of the semiconductor integrated circuit device are great.

BRIEF DESCRIPTION OF THE DRAWINGS

FIGS. 26(a) and 26(b) shows a circuit diagram of an output circuit according to a 22nd embodiment of the present invention and an operation explanatory diagram thereof;

FIG. 37 is an explanatory diagram (1) of a semiconductor integrated circuit device according to respective embodiments to the present invention;

DETAILED DESCRIPTION OF PREFERRED EMBODIMENTS

Embodiments of the present invention will be described with reference to the drawings. FIGS. 4(a) to 38 are the figures for explaining output circuits according to 1st to a 32nd embodiments of the present invention and a semiconductor integrated circuit device according to the applicable thereof.

(1) Description of the 1st embodiment

Figure 4A:
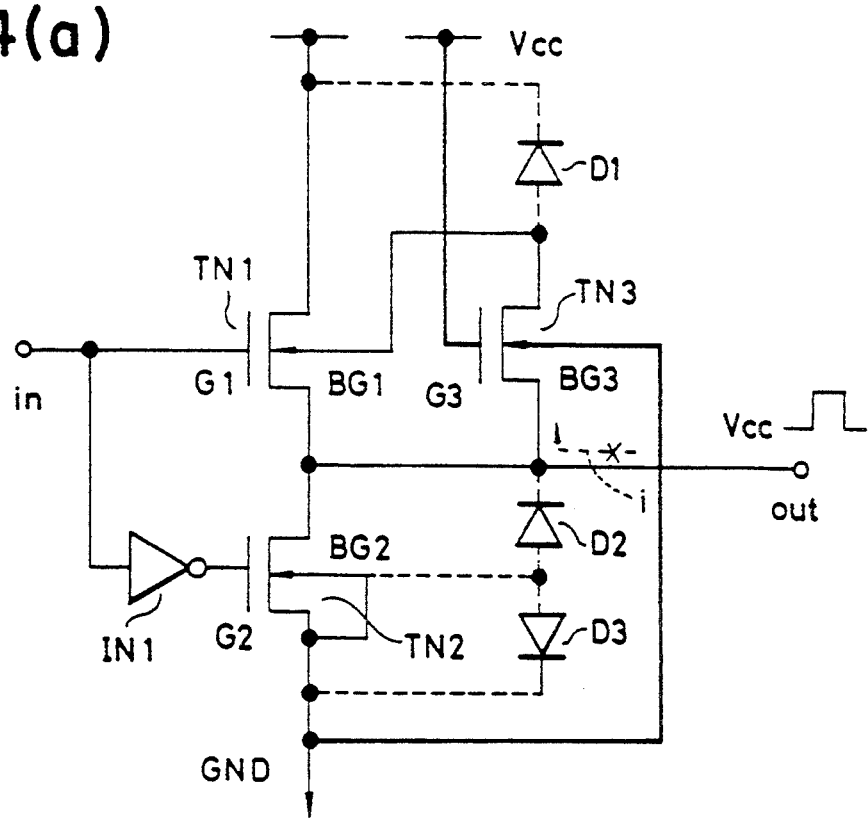
FIGS. 4(a) and 4(b) shows a circuit diagram of an output circuit according to a 1st embodiment of the present invention and an operation explanatory diagram thereof.

FIGS. 4(a), 4(b), 5(a) and 5(b) are figures for explaining an output circuit according to the 1st embodiment of the present invention, and FIG. 4(a) shows a circuit diagram thereof. In FIG. 4(a), a first output circuit of the present invention includes an n-type field effect transistor TN1 representing an embodiment of a first field effect transistor T1 (hereinafter referred to simply as a first transistor) and an n-type field effect transistor TN2 representing an embodiment of a second field effect transistor (hereinafter referred to simply as a second transistor) connected in series with each other between a first power supply line (hereinafter referred to simply as a power supply line) Vcc and a second power supply line (hereinafter referred to simply as a ground line) GND.

Further, a gate G1 of the first transistor TN1 is connected to an input terminal in, and a gate G2 of the second transistor TN2 is connected to the input terminal in through an inverter IN1, for instance. Furthermore, a junction (a common drain and the like) of the first transistor TN1 and the second transistor TN2 is connected to an output terminal out, and a third transistor TN3 is connected to a backgate BG1 of the first transistor TN1. Namely, the third transistor TN3 is an n-type field effect transistor representing an embodiment of the third field effect transistor T3 (hereinafter referred to simply as a third transistor TN3), and controls the backgate BG1 of the first transistor TN1. Besides, the third transistor TN3 is connected between the backgate BG1 of the first transistor TN1 and the output terminal out, and a gate G3 of the transistor TN3 is connected the power supply line Vcc and a backgate BG3 thereof is connected to the ground line GND.

Further, a backgate BG2 of the second transistor TN2 is connected to the ground line GND.

Figure 5A:
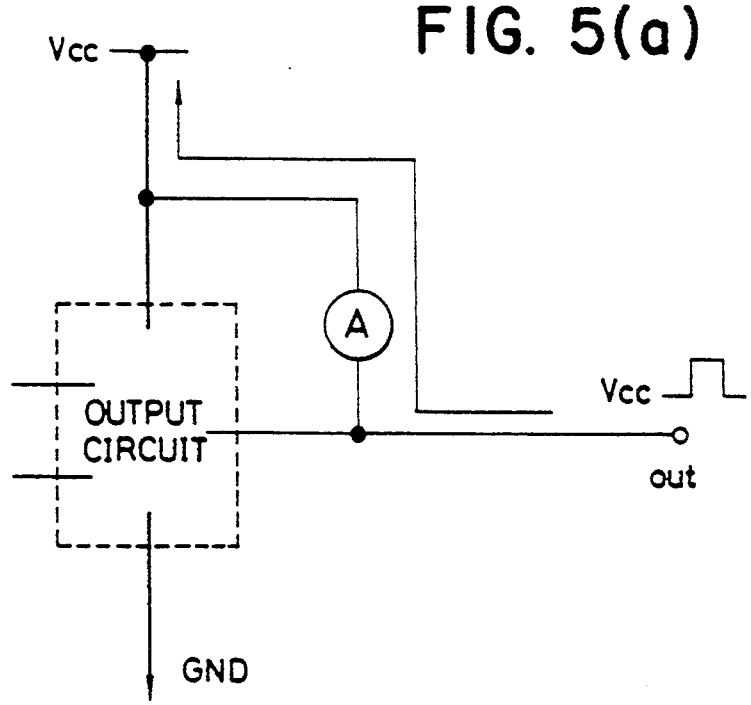
FIGS. 5(a) and 5(b) shows explanatory diagrams for current measurement of output circuits according to respective embodiments of the present invention.
Figure 5B:
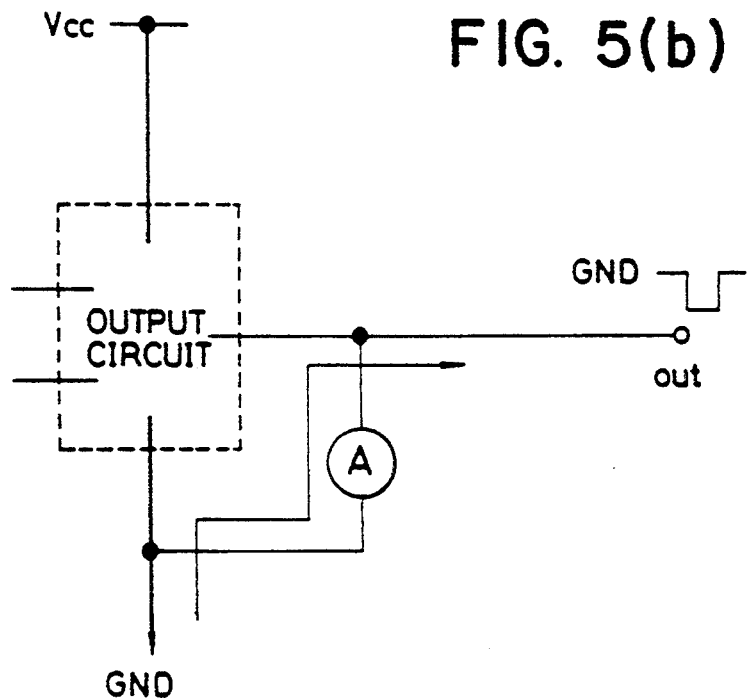

Further, FIGS. 5(a) and 5(b) show current measurement circuit examples of output circuits according to respective embodiments of the present invention, and FIG. 5(a) shows a circuit example for measuring a current i flowing into between the output terminal out and the power supply line Vcc when a voltage at a level higher than that of the power supply line Vcc is applied to the output terminal out. Furthermore, FIG. 5(b) shows a circuit example for measuring a current i flowing out of the ground line GND to the output terminal out when a voltage at a level lower than that of the power supply line Vcc is applied to the output terminal out.

Figure 4B:
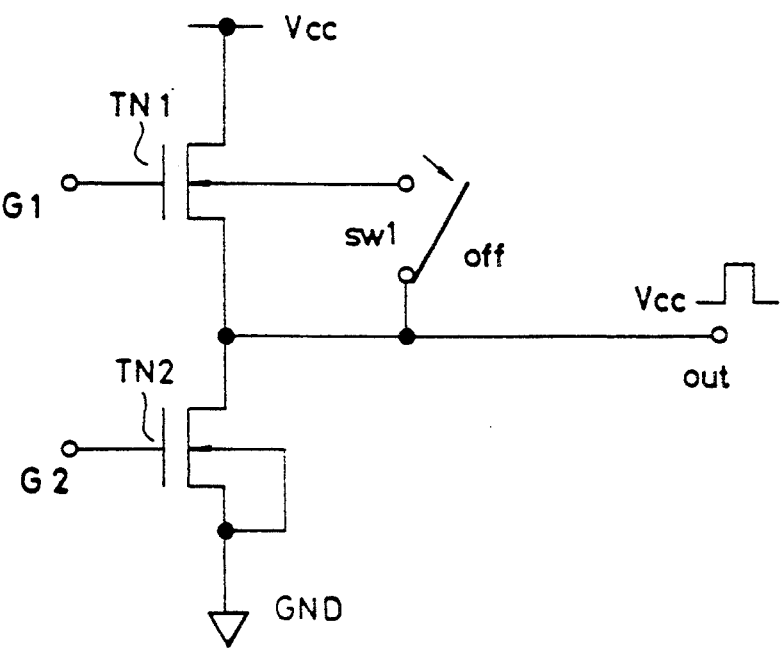

As described above, in the output circuit according to the 1st embodiment of the present invention, the third transistor TN3 for controlling the backgate BG1 of the first transistor TN1 is provided, and the gate G3 of the third field effect transistor TN3 is connected to the power supply line Vcc as shown in FIG. 4(a). As a result, even if a voltage at a level higher than that of the power supply line Vcc is applied to the output terminal out, for instance, at the time of suspension of output operation of the first output circuit as shown in FIG. 4(b), the third transistor TN3 (=SW1) performs OFF operation, and the backgate BG1 of the first transistor TN1 is brought to an electrically floating state. Thus, it becomes possible to cut off a passage of a current i which is going to flow to the power supply line Vcc through a forward diode (pn junction) D1 which is parasitic between the power supply line Vcc and the backgate BG1 of the first transistor TN1.

Besides, the influence by a forward diode D3 which is parasitic between the backgate BG2 of the second transistor TN2 and the ground line GND is removed by a forward diode D2 which is parasitic between the backgate BG2 of the transistor TN2 and the output terminal out, and the output terminal out is held in a high impedance state. Further, at time of normal operation of the first output circuit, the third transistor performs ON operation based on the supply with the power supply line Vcc. Thus, a potential equivalent to the output level of the output terminal out is supplied to the backgate BG1 of the first transistor TN1, thereby enabling reduction of backgate dependency of the first transistor TN1 to the utmost. With this, it becomes possible to maintain the output terminal out of the first output circuit in a high impedance state at time of suspension of output operation, and to increase the output "H" level to the utmost at time of normal operation.

Due to the foregoing, even in a case that a semiconductor integrated circuit device in which the first output circuit is integrated is packaged on a printed circuit board similar to other semiconductor integrated circuit devices and the output terminals out thereof are connected to a common bus for use, and such power supply control that output operation of the semiconductor integrated circuit device is suspended and output operation of other semiconductor integrated circuit devices is continued is adopted, it becomes possible to maintain the impedance of the output terminal out at a high impedance value by means of the third transistor TN3, thereby to improving the reliability of the semiconductor integrated circuit device.

(2) Description of the 2nd embodiment

Figure 6A:
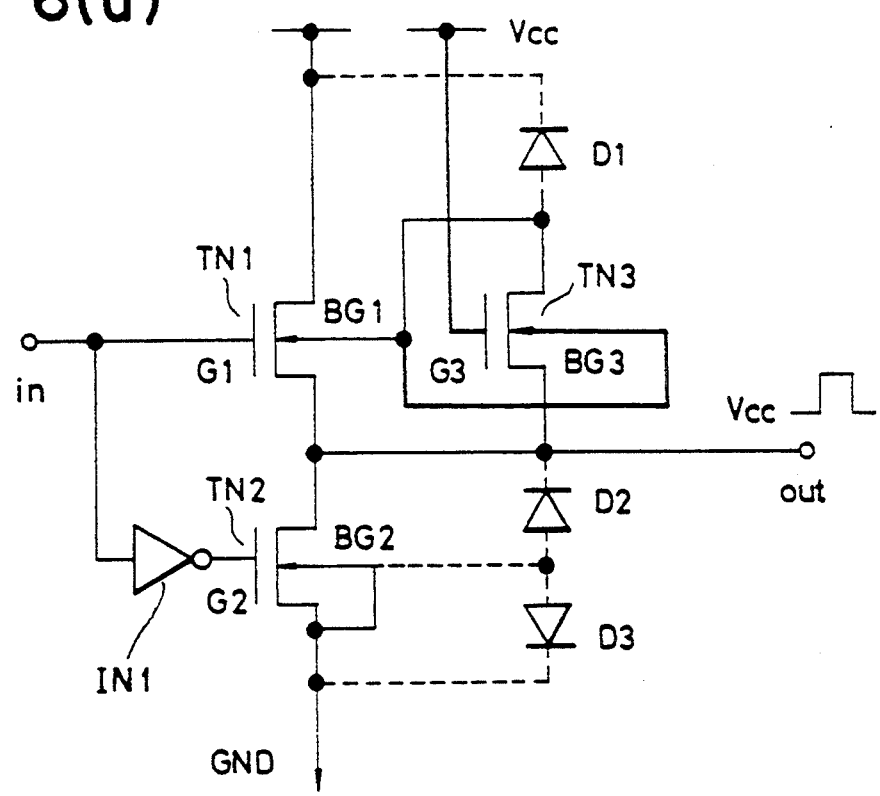
FIGS. 6(a) and 6(b) shows a circuit diagram of an output circuit according to a 2nd embodiment of the present invention and an operation explanatory diagram thereof.
Figure 6B:
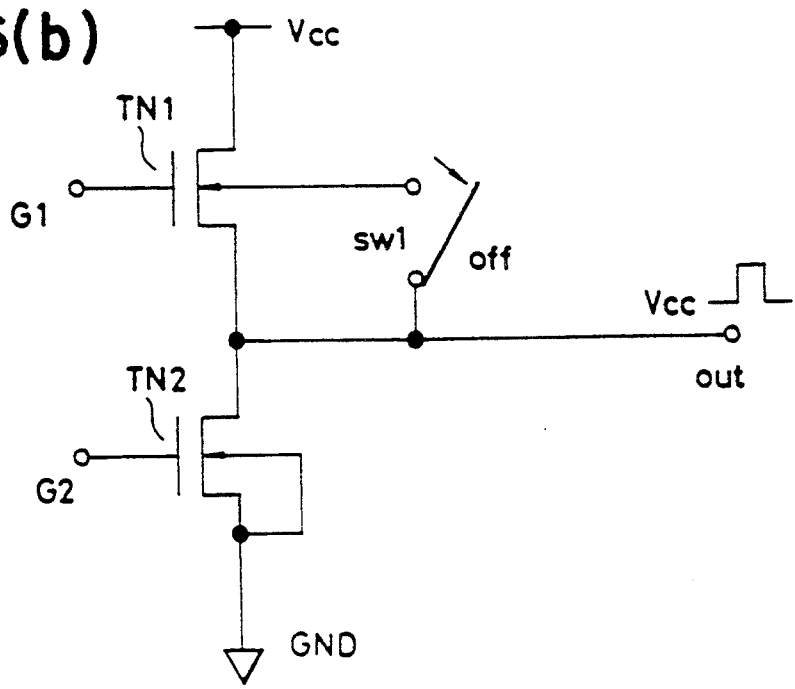

FIGS. 6(a) and 6(b) show a circuit diagram of an output circuit according to the 2nd embodiment of the present invention and an operation explanatory diagram thereof, respectively. In FIG. 6(a), what differs from the 1st embodiment is that the backgate BG3 of the third transistor TN3 is connected to the backgate BG1 of the first transistor TN1 in the 2nd embodiment.

Namely, the first to the third field effect transistors T1 to T3 are composed of n-type field effect transistors TN1, TN2 and TN3 similarly to the 1st embodiment, and the third transistor TN3 is connected between the backgate BG1 of the first transistor TN1 and the output terminal out. Further, the gate G3 of the transistor TN3 is connected to the power supply line Vcc, and the backgate BG2 of the second transistor TN2 is connected to the ground line GND. Thus, according to the output circuit in the 2nd embodiment of the present invention shown in FIG. 6(a), the backgate BG3 of the third transistor TN3 is connected to the backgate BG1 of the first transistor TN1 in place of the ground line GND.

As a result, even if a voltage at a level higher than that of the power supply line Vcc is applied to the output terminal out as shown in FIG. 6(a) at time of suspension of output operation of the second output circuit, the third transistor TN3 (=SW1) performs OFF operation, and the backgate BG1 of the first transistor TN1 is brought to an electrically floating state. Thus, it becomes possible to cut off the passage of the current which is going to flow to the power supply line Vcc through the forward diode D1 which is parasitic between the power supply line Vcc and the backgate BG1 of the first transistor TN1. Besides, the influence by the forward diode D3 which is parasitic between the backgate BG2 of the second transistor TN2 and the ground line GND is removed by the forward diode D2 which is parasitic between the backgate BG2 of the second transistor TN2 and the output terminal out, and the output terminal out is held in a high impedance state.

Further, at time of normal operation of the second output circuit, the third transistor TN3 performs ON operation similarly to the first output circuit. Thus, a potential equivalent to the output level of the output terminal out is supplied to the backgate BG1 of the first transistor TN1 and the backgate BG3 of the third transistor TN3, thereby enabling a reduction in backgate dependency of the first and the third transistors TN1 and TN3 to the utmost.

With this, it becomes possible to maintain the output terminal out of the second output circuit in a high impedance state similarly to the first output circuit, and to increase the output "H" level to the utmost at time of normal operation thereof. Thus, when the second output circuit is integrated, stabilization of the output level is aimed at in a similar manner to the first output circuit, thus making it possible to aim at improvement of the reliability of the semiconductor integrated circuit device.

(3) Description of the 3rd embodiment

Figure 7A:
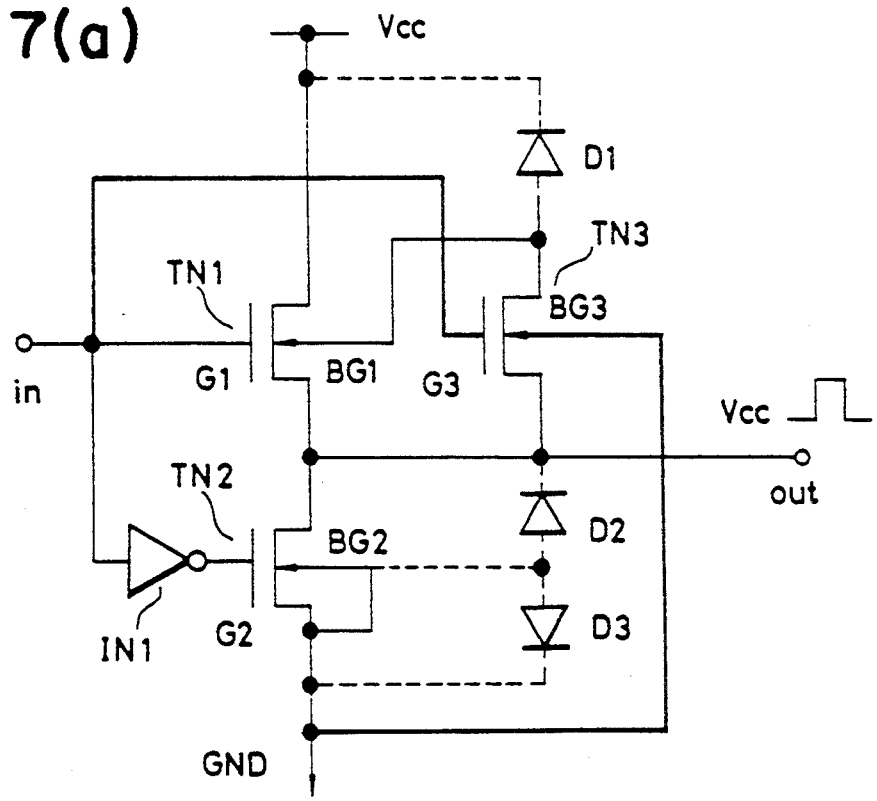
FIGS. 7(a) and 7(b) shows a circuit diagram of an output circuit according to a 3rd embodiment of the present invention and an operation explanatory diagram thereof.
Figure 7B:
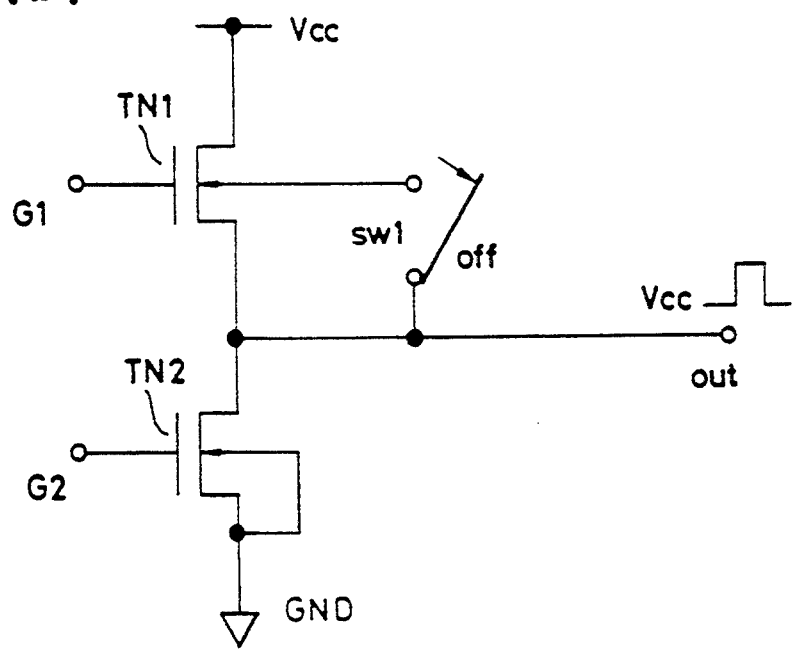

FIGS. 7(a) and 7(b) show a circuit diagram of an output circuit according to the 3rd embodiment of the present invention and an operation explanatory diagram thereof, respectively. In FIG. 7(a), what differs from the 1st and the 2nd embodiments is that the gate G3 of the third transistor TN3 is connected to the gate G1 of the first transistor TN1 in the 3rd embodiment.

Namely, the first, the second and the third transistors T1, T2 and T3 are composed of n-type field effect transistors TN1, TN2 and TN3 similarly to the 1st and the 2nd embodiments, and the third transistor T3 is connected between the backgate BG1 of the first transistor TN1 and the output terminal out. Further, the backgate BG3 of the third transistor TN3 is connected to one of the ground line GND and the backgate BG1 of the first transistor TN1, and the backgate BG2 of the second transistor TN2 is connected to the ground line GND. Thus, according to an output circuit in the 3rd embodiment of the present invention, the gate G3 of the third transistor TN3 for controlling the state of the backgate BG1 of the first transistor TN1 is connected to the gate G1 of the first transistor TN1, and the backgate BG3 of the transistor TN3 is connected to the ground line GND as shown in FIG. 7(a).

As a result, even if a voltage at a level higher than that of the power supply line Vcc is applied to the output terminal out as shown in FIG. 7(b) at time of suspension of output operation of the third output circuit, the third transistor TN3 performs OFF operation and the backgate BG1 of the first transistor TN1 is brought into an electrically floating state. Thus, it becomes possible to cut off a passage of a current which is going to flow into the power supply line Vcc through the forward diode D1 which is parasitic between the power supply line Vcc and the backgate BG1 of the first transistor TN1. Besides, the influence by the forward diode D3 which is parasitic between the backgate BG2 of the second transistor TN2 and the ground line GND is removed by the forward diode D2 which is parasitic between the backgate BG2 of the transistor TN2 and the output terminal out, and the output terminal out is held in a high impedance state.

Further, at time of normal operation of the third output circuit, the third transistor TN3 performs ON operation based on the input level of the gate G1 of the first transistor TN1. Thus, a potential equivalent to the output level of the output terminal out is applied to the backgate BG1 of the first transistor TN1, thereby reducing backgate dependency thereof to the utmost.

With this, it becomes possible to maintain the output terminal out of the third output circuit in a high impedance state similarly to the first and the second output circuits, and to increase the output "H" level to the utmost at time of normal operation thereof. Thus, when the third output circuit is integrated, stabilization or the output level is aimed at in a similar manner as the first and the second output circuits, thus making it possible to improve of the reliability of the semiconductor integrated circuit device.

(4) Description of the 4th embodiment

Figure 8A:
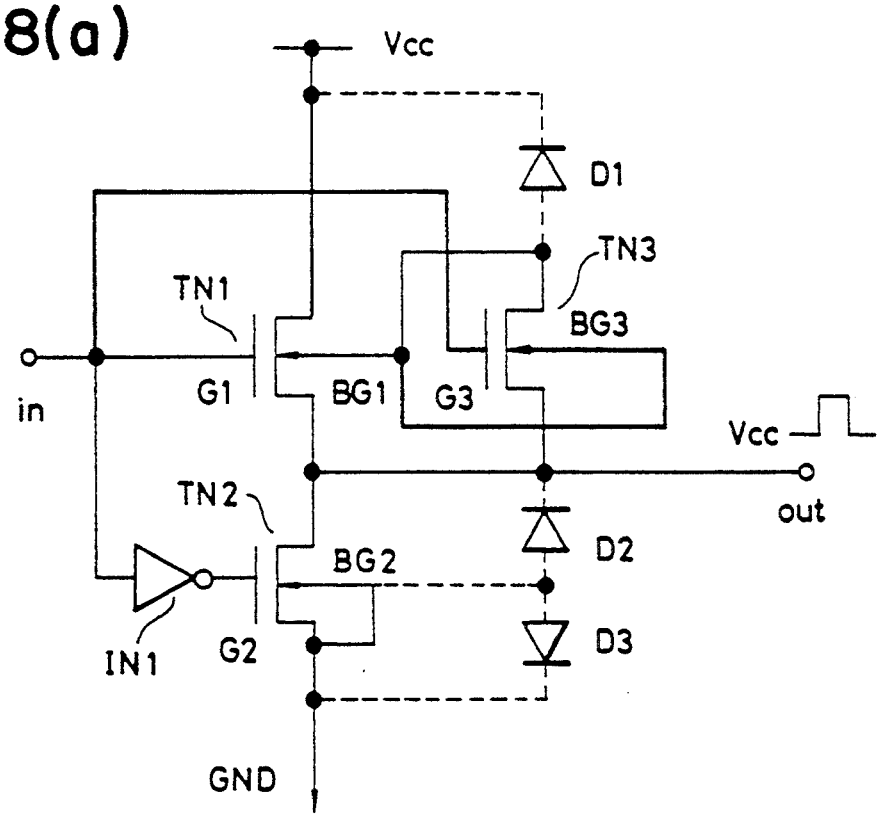
FIGS. 8(a) and 8(b) shows a circuit diagram of an output circuit according to a 4th embodiment of the present invention and an operation explanatory diagram thereof.
Figure 8B:
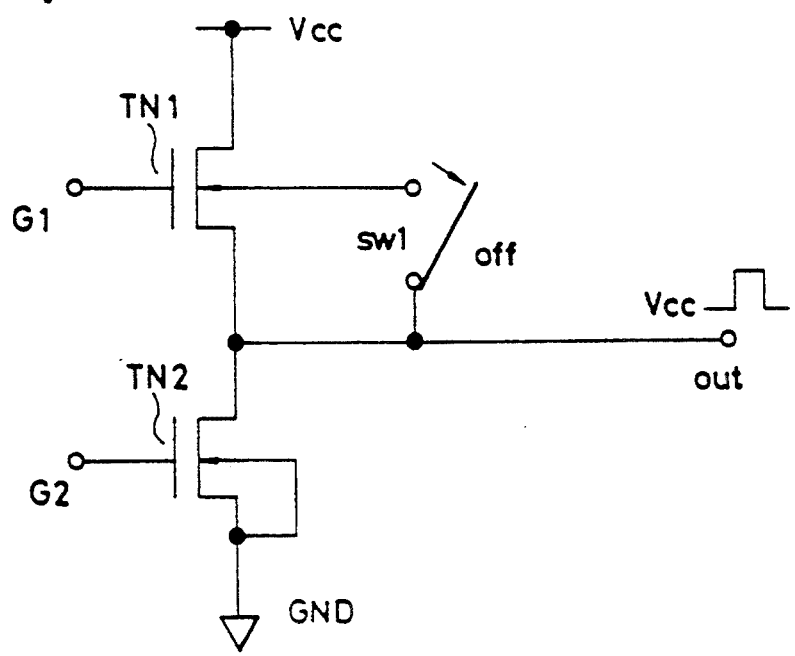

FIGS. 8(a) and 8(b) show a circuit diagram of an output circuit according to the 4th embodiment of the present invention and an operation explanatory diagram thereof, respectively. In FIG. 8(a), what differs from the 1st and the 3rd embodiments is that the backgate BG3 of the third transistor TN3 is connected to the backgate BG1 of the first transistor TN1 in the 4th embodiment.

Namely, the first, the second and the third transistors T1, T2 and T3 are composed of n-type field effect transistors TN1, TN2 and TN3 similarly to the 1st to the 3rd embodiments, and the third transistor TN3 is connected between the backgate BG1 of the first transistor TN1 and the output terminal out. Besides, the gate G3 of the third transistor TN3 is connected to a gate G1 of the first transistor TN1, and the backgate BG2 of the second transistor TN2 is connected to the ground line GND. Thus, according to an output circuit in the 4th embodiment of the present invention as shown in FIG. 8(a), the gate G3 of the third transistor TN3 for controlling the backgate BG1 of the first transistor TN1 is connected to the gate G1 of the first transistor TN1, and the backgate BG3 of the third transistor TN3 is connected to the backgate BG1 of the first transistor TN1.

As a result, even if a voltage at a level higher than that of the power supply line Vcc is applied to the output terminal out as shown in FIG. 8(b) at time of suspension of output operation of the fourth output circuit, the third transistor TN3 performs OFF operation and the backgate BG1 of the first transistor TN1 is brought into an electrically floating state. Thus, it becomes possible to cut off a passage of a current which is going to flow into the power supply line Vcc through the forward diode D1 which is parasitic between the power supply line Vcc and the backgate BG1 of the first transistor TN1. Besides, the influence by the forward diode D3 which is parasitic between the backgate BG2 of the second transistor TN2 and the ground line GND is removed by the forward diode D2 which is parasitic between the backgate BG2 of the transistor TN2 and the output terminal out, and the output terminal out is held in a high impedance state.

Further, at time of normal operation of the fourth output circuit, the third transistor TN3 performs ON operation based on the input level of the gate G1 of the first transistor TN1. Thus, a potential equivalent to the output level of the output terminal out is applied to the backgate BG1 of the first transistor TN1 and the backgate BG3 of the third transistor TN3, thereby reducing backgate dependency thereof to the utmost.

With this, it becomes possible to maintain the output terminal out of the fourth output circuit in a high Impedance state similarly to the first to the third output circuits, and to increase the output "H" level to the utmost at time of normal operation thereof. Thus, when the fourth output circuit is integrated, stabilization of the output level is aimed at in a similar manner as the first to the third output circuits, thus making it possible to improve the reliability of the semiconductor integrated circuit device.

(5) Description of the 5th embodiment

Figure 1:
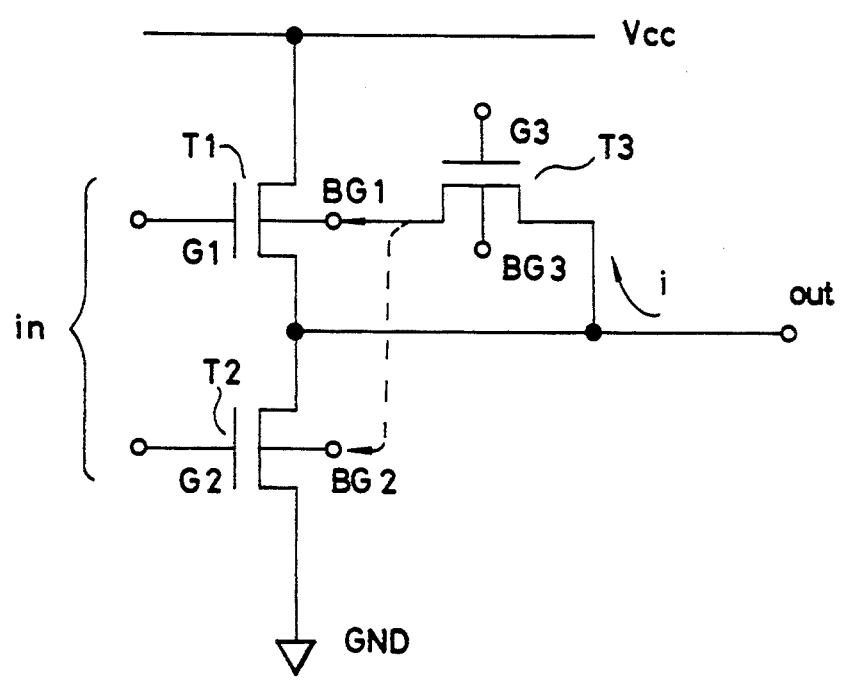
FIG. 1 is a principle diagram (1) of an output circuit according to the present invention.
Figure 9A:
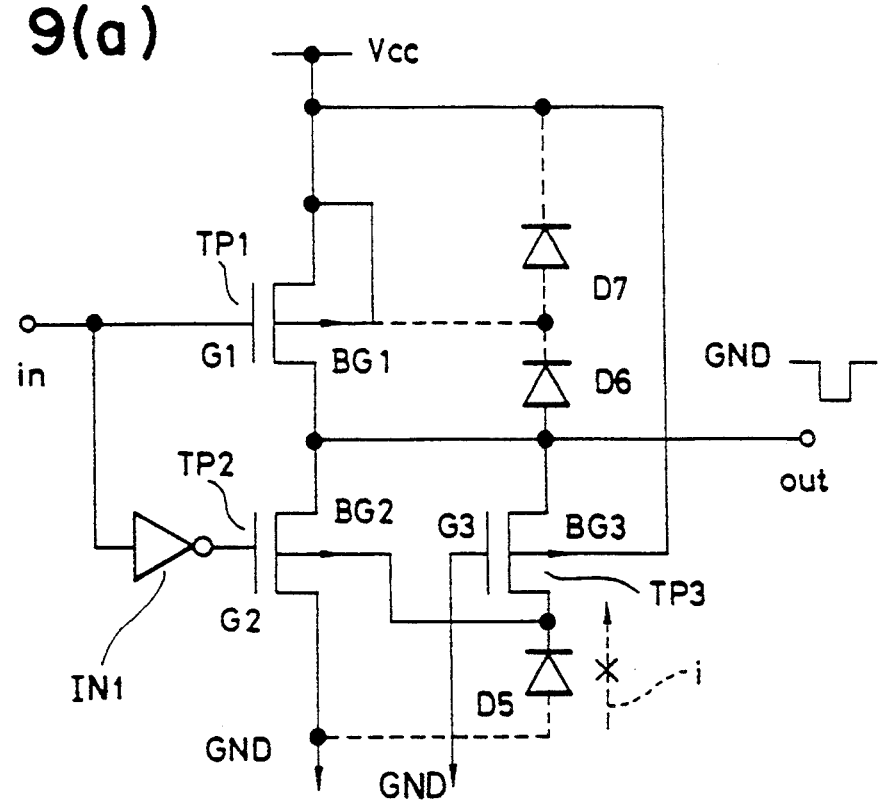
FIGS. 9(a) and 9(b) shows a circuit diagram of an output circuit according to a 5th embodiment of the present invention and an operation explanatory diagram thereof.
Figure 9B:
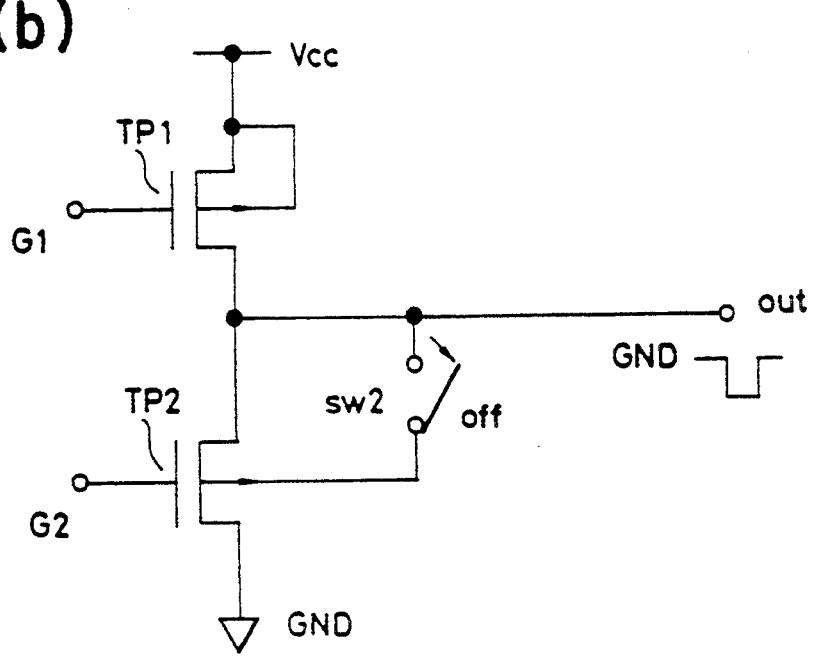

FIGS. 9(a) and 9(b) show a circuit diagram of an output circuit according to the 5th embodiment of the present invention and an operation explanatory diagram thereof. In FIG. 9(a), what differs from the 1st to the 4th embodiments is that the first, the second and the third field effect transistors T1, T2 and T3 in the principle diagram (1) shown in FIG. 1 are composed of p-type field effect transistors TP1, TP2 and TP3 (hereinafter referred to simply as the first to the third transistors).

Further, the gate G1 of the first transistor TP1 is connected to the input terminal in, and the gate G2 of the second transistor TP2 is connected to the input terminal in through an inverter IN1. Besides, the backgate BG1 of the first transistor TP1 is connected to the power supply line Vcc, the third transistor TP3 is connected between the backgate BG2 of the second transistor TP2 and the output terminal out, and the gate G3 of the third transistor TP3 is connected to the ground line GND. Furthermore, the backgate BG3 of the third transistor TP3 is connected to the power supply line Vcc. Thus, according to an output according to the 5th embodiment of the present invention, the third transistor TP3 for controlling the backgate BG2 of the second transistor TP2 is provided as shown in FIG. 9(a).

As a result, even if a voltage at a level lower than that of the power supply line GND is applied to the output terminal out conversely to the 1st to the 4th embodiments, for instance, as shown in FIG. 9(b) at time of suspension of output operation of the fifth output circuit, the third transistor TP3 (=SW2) performs OFF operation and the backgate BG2 of the second transistor TP2 is brought into an electrically floating state. Thus, it becomes possible to cut off a passage of a current i which is going to flow out to the output terminal out from the ground line GND through a forward diode (pn junction) D5 which is parasitic between the ground line GND and the backgate BG2 of the second transistor TP2 as in a conventional circuit. Besides, the output terminal out is held in a high impedance state by means of a reverse diode D6 which is parasitic between the backgate BG1 of the First transistor TP1 and the power supply line Vcc and a reverse diode D7 which is parasitic between the backgate BG1 and the output terminal out.

Further, at time of normal operation of the fifth output circuit, the third transistor TP3 performs ON operation based on the potential of the ground line GND. Thus, a potential equivalent to the output level of the output terminal out is supplied to the backgate BG2 of the second transistor TP2, thereby reducing backgate dependency of the second transistor TP2 to the utmost.

With this, it becomes possible to maintain the output terminal out of the fifth output circuit in a high impedance state, and to lower the output "L" level to the utmost at time of normal operation thereof. Thus, when the fifth output circuit is integrated, stabilization of the output level is aimed at in a similar manner as the first to the fourth output circuits, thus making it possible to improve the reliability of the semiconductor integrated circuit device.

(6) Description of the 6th embodiment

Figure 10A:
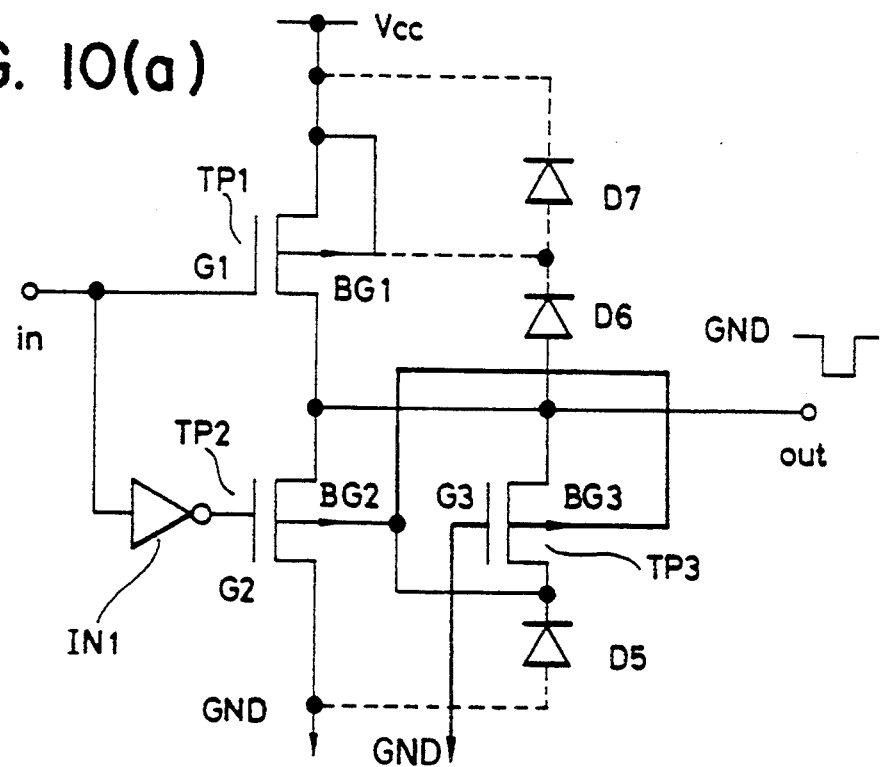
FIGS. 10(a) and 10(b) shows a circuit diagram of an output circuit according to a 6th embodiment of the present invention and an operation explanatory diagram thereof.
Figure 10B:
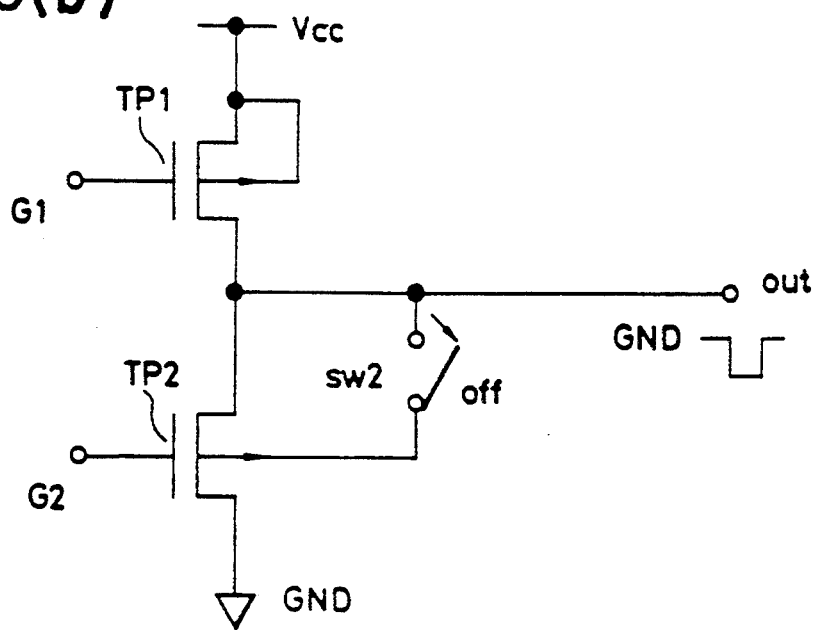

FIGS. 10(a) and 10(b) show a circuit diagram of an output circuit according to the 6th embodiment of the present invention and an operation explanatory diagram thereof, respectively. In FIG. 10(a), what differs from the 5th embodiment is that the backgate BG3 of the third transistor TP3 is connected to the backgate BG2 of the second transistor TP2 in the 6th embodiment.

Namely, the first to the third field effect transistors T1, T2 and T3 in the principle diagram (1) shown in FIG. 1 are composed of p-type field effect transistors TP1, TP2 and TP3 (hereinafter referred to simply as the first to the third transistors) similarly to the 5th embodiment, and a third transistor TP3 is connected between the backgate BG2 of the second transistor TP2 and the output terminal out. Further, the gate G3 of the third transistor TP3 is connected to the ground line GND, and the backgate BG1 of the first transistor TP1 is connected to the power supply line Vcc. Thus, according to an output circuit of the 6th embodiment of the present invention shown in FIG. 10(a), the third transistor TP3 for controlling the backgate BG2 of the second transistor TP2 is provided, and the gate G3 of the third transistor TP3 is connected to the ground line GND and the backgate BG3 thereof is connected to the backgate BG2 of the second transistor TP2.

As a result, even if a voltage at a level lower than that of the power supply line GND is applied to the output terminal out as shown in FIG. 10(b) at time of suspension of output operation of the sixth output circuit, the third transistor TP3 (=SW2) performs OFF operation and the backgate BG2 of the second transistor TP2 is brought into an electrically floating state. Thus, it becomes possible to cut off a passage of a current i which is going to flow out to the output terminal out from the ground line GND through a forward diode D5 which is parasitic between the ground line GND and the backgate BG2 of the second transistor TP2. Besides, the output terminal out is held in a high impedance state by means of a reverse diode D6 which is parasitic between the backgate BG1 of the first transistor TP1 and the power supply line Vcc and a reverse diode D7 which is parasitic between the backgate BG1 and the output terminal out.

Further, at time of normal operation of the sixth output circuit, the third transistor TP3 performs ON operation based on the potential of the ground line GND. Thus, a potential equivalent to the output level of the output terminal out is supplied to the backgate BG2 of the second transistor TP2 and the backgate BG3 of the third transistor TP3, thereby reducing backgate dependency of the second transistor TP2 to the utmost.

With this, it becomes possible to maintain the output terminal out of the sixth output circuit in a high impedance state similarly to the 5th embodiment, and to lower the output "L" level to the utmost at time of normal operation thereof. Thus, when the sixth output circuit is integrated, stabilization of the output level is aimed at in a similar manner as the first to the fifth output circuits, thus making possible to, improve the reliability of the semiconductor integrated circuit device.

(7) Description of the 7th embodiment

Figure 11A:
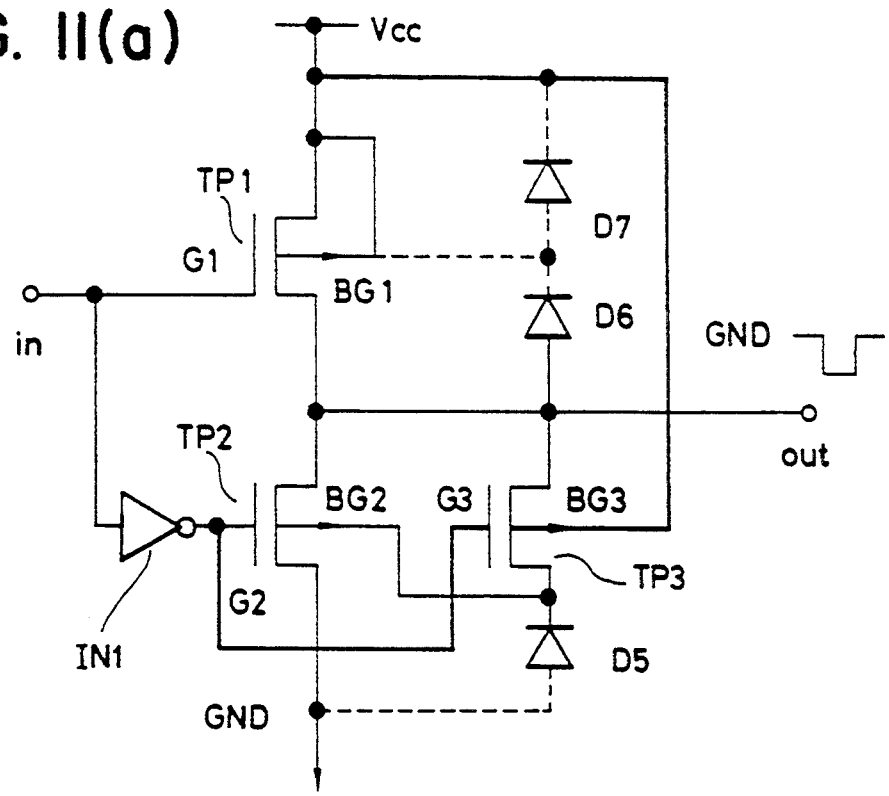
FIGS. 11(a) and 11(b) shows a circuit diagram of an output circuit according to a 7th embodiment of the present invention and an operation explanatory diagram thereof.
Figure 11B:
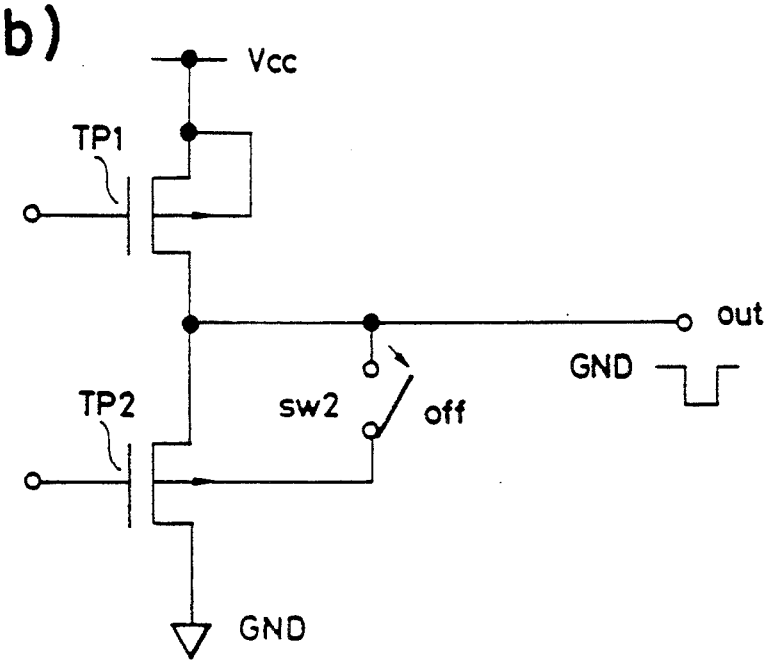

FIGS. 11(a) and 11(b) show a circuit diagram of an output circuit according to the 7th embodiment of the present invention and an operation explanatory diagram thereof, respectively. In FIG. 11(a), what differs from the 5th and the 6th embodiments is that the gate G3 of the third transistor TP3 is connected to the gate G2 of the second transistor TP2 in the 7th embodiment.

Namely, the first to the third field effect transistors T1, T2 and T3 in the principle diagram (1) shown in FIG. 1 are composed of p-type field effect transistors TP1, TP2 and TP3 (hereinafter referred to simply as the first to the third transistors) similarly to the 5th and the 6th embodiments, and the backgate BG1 of the first transistor TP1 is connected to the power supply line Vcc. Further, the third transistor TP3 is connected between the backgate BG2 of the second transistor TP2 and the output terminal and the gate G3 of the third transistor TP3 is connected to the gate G2 of the second transistor TP2. Furthermore, the backgate BG3 of the third transistor TP3 is connected to the power supply line Vcc. Thus, according to an output circuit of the 7th embodiment of the present invention shown in FIG. 11(a), the third transistor TP3 for controlling the backgate BG2 of the second transistor TP2 is provided, and the gate G3 of the transistor TP3 is connected to the gate G2 of the second transistor TP2 and the backgate BG3 thereof is connected to the power supply line Vcc.

As a result, even if a voltage at a level lower than that of the power supply line Vcc is applied to the output terminal out as shown in FIG. 11(b) at time of suspension of output operation of the seventh output circuit, the third transistor TP3 (=SW2) performs OFF operation and the backgate BG2 of the second transistor TP2 is brought into an electrically floating state. Thus, it becomes possible to cut off a passage of a current i which is going to flow out to the output terminal out from the ground line GND through a forward diode D5 which is parasitic between the power supply line Vcc and the backgate BG2 of the second transistor TP2.

Besides, the output terminal out is held in a high impedance state by means of a reverse diode D6 which is parasitic between the backgate BG1 of the first transistor TP1 and the power supply line Vcc and a reverse diode D7 which is parasitic between the backgate BG1 and the output terminal out.

Further, at time of normal operation of the seventh output circuit, the third transistor TP3 performs ON operation based on the potential of the ground line GND. Thus, a potential equivalent to the output level of the output terminal out is supplied to the backgate BG2 of the second transistor TP2, thereby reducing backgate dependency of the second transistor TP2 to the utmost.

With this, it becomes possible to maintain the output terminal out of the seventh output circuit in a high impedance state similarly to the fifth and the sixth output circuits and to lower the output "L" level to the utmost at time of normal operation thereof. Thus, when the seventh output circuit is integrated, stabilization of the output level is aimed at in a similar manner as the first to the sixth output circuits, thus making it possible to improve the reliability of the semiconductor integrated circuit device.

(8) Description of the 8th embodiment

Figure 12A:
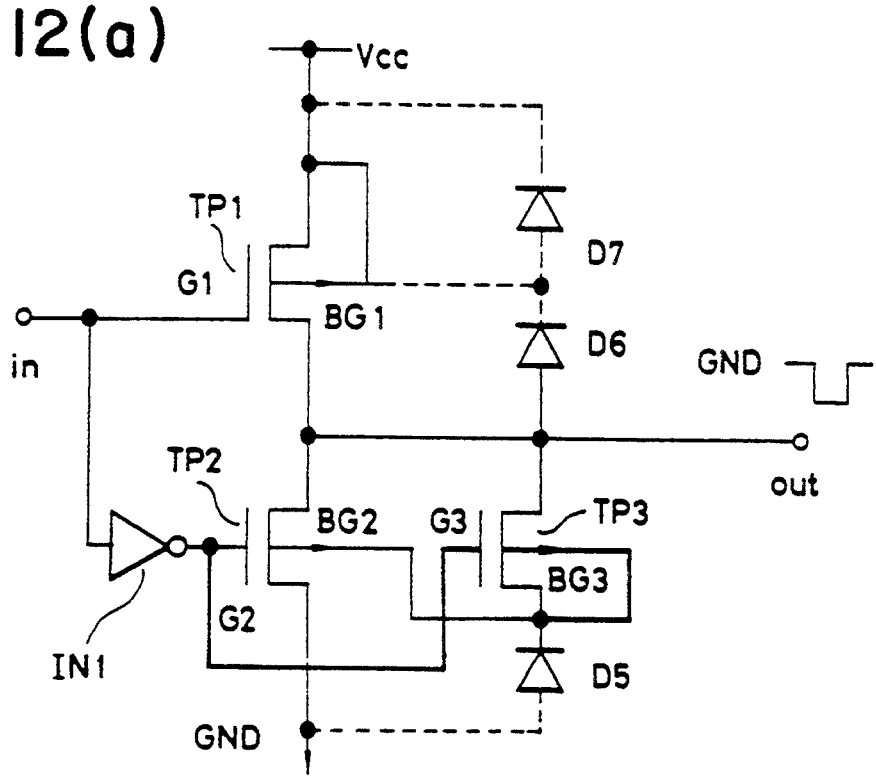
FIGS. 12(a) and 12(b) shows a circuit diagram of an output circuit according to a 8th embodiment of the present invention and an operation explanatory diagram thereof.
Figure 12B:
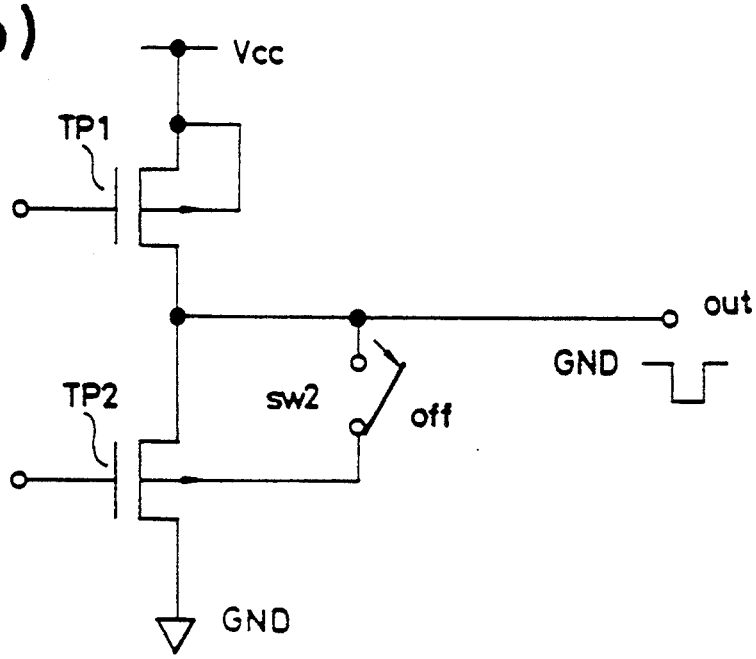

FIGS. 12(a) and 12(b) show a circuit diagram of an output circuit according to the 8th embodiment of the present invention and an operation explanatory diagram thereof, respectively. In FIG. 12(a), what differs from the 5th and the 7th embodiments is that the backgate BG3 of the third transistor TP3 is connected to the backgate BG2 of the second transistor TP2 in the 8th embodiment.

Namely, the first to the third field effect transistors T1, T2 and T3 in the principle diagram (1) shown in FIG. 1 are composed of p-type field effect transistors TP1, TP2 and TP3 (hereinafter referred to simply as the first to the third transistors) similarly to the 5th to the 7th embodiments, and the backgate BG1 of the first transistor TP1 is connected to the power supply line Vcc. Further, the third transistor TP3 is connected between the backgate BG2 of the second transistor TP2 and the output terminal out, and the gate G3 of the third transistor TP3 is connected to the gate G2 of the second transistor TP2. Furthermore, the backgate BG3 of the third transistor TP3 is connected to the backgate BG2 of the second transistor TP2. Thus, according to an output circuit of the 8th embodiment of the present invention shown in FIG. 12(a), the third transistor TP3 for controlling the backgate BG2 of the second transistor TP2 is provided, and the gate G3 of the transistor TP3 is connected to the gate G2 of the second transistor TP2 and the backgate BG3 thereof is connected to the backgate BG2 of the second transistor TP2.

As a result, even if a voltage at a level lower than that of the power supply line Vcc is applied to the output terminal out as shown in FIG. 12(a) at time of suspension of output operation of the eighth output circuit, the third transistor TP3 (=SW2) performs OFF operation and the backgate BG2 of the second transistor TP2 is brought into an electrically floating state. Thus, it becomes possible to cut off a passage of a current which is going to flow out to the output terminal out from the ground line GND through a forward diode D5 which is parasitic between the power supply line Vcc and the backgate BG2 of the second transistor TP2. Besides, the output terminal out is held in a high impedance state by means of a reverse diode D6 which is parasitic between the backgate BG1 of the first transistor TP1 and the power supply line Vcc and a reverse diode D7 which is parasitic between the backgate BG1 and the output terminal out.

Further, at time of normal operation of the eighth output circuit, the third transistor TP3 performs ON operation based on the potential of the ground line GND. Thus, a potential equivalent to the output level of the output terminal out is supplied to the backgate BG2 of the second transistor TP2 and the backgate BG3 of the third transistor TP3, thereby reducing backgate dependency of the second transistor TP2 to the utmost.

With this, it becomes possible to maintain the output terminal out of the eighth output circuit in a high impedance state similarly to the fifth to the seventh output circuits and to lower the output "L" level to the utmost at time of normal operation thereof. Thus, when the eighth output circuit is integrated, stabilization of the output level is aimed at in a similar manner as the first to the seventh output circuits, thus making it possible to improve the reliability of the semiconductor integrated circuit device.

(9) Description of the 9th embodiment

Figure 13A:
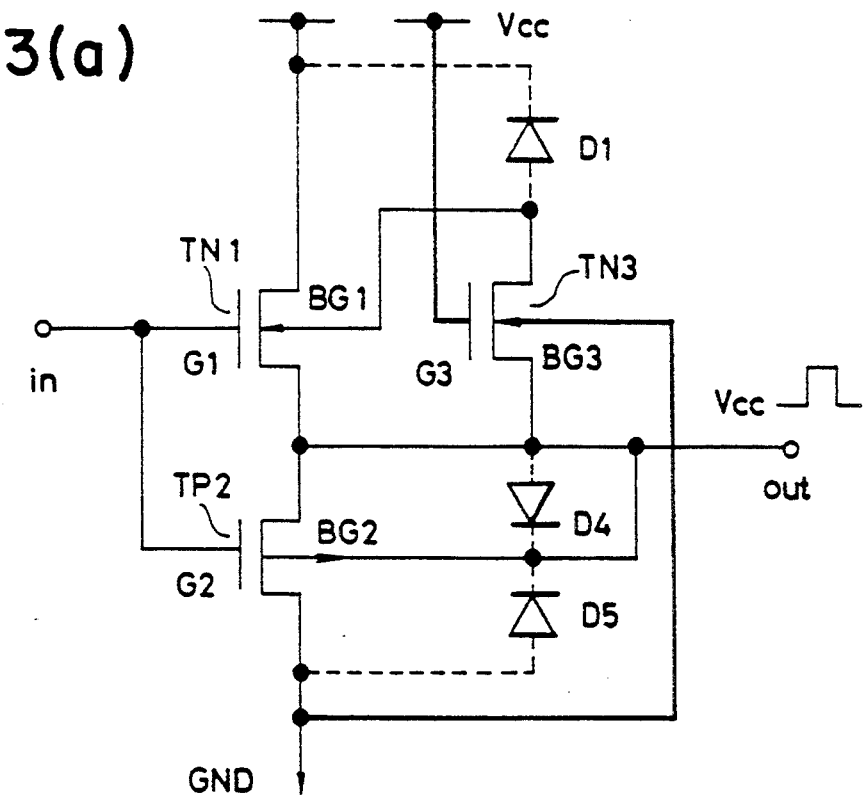
FIGS. 13(a) and 13(b) shows a circuit diagram of an output circuit according to a 9th embodiment of the present invention and an operation explanatory diagram thereof.
Figure 13B:
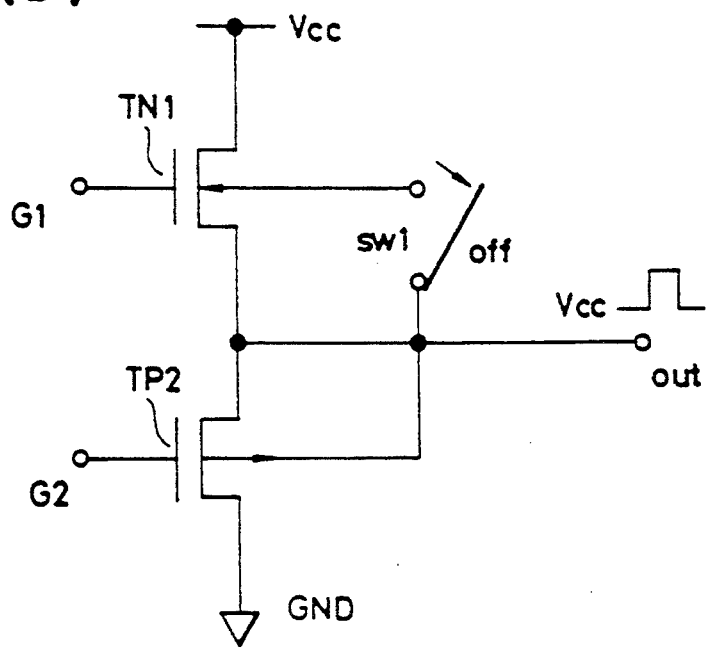

FIGS. 13(a) and 13(b) show a circuit diagram of an output circuit according to the 9th embodiment of the present invention and an operation explanatory diagram thereof, respectively. In FIG. 13(a), what differs from the 1st to the 8th embodiments is that the second field effect transistor T2 in the first output circuit is replaced with a p-type field effect transistor and the inverter IN1 is removed In the 9th embodiment. Further, the gates G1 and G2 of the first and the second transistors T1 and T2 are made common to each other so as to form a CMOS circuit (a complementary output circuit).

Namely, the first and the third field effect transistors T1 and T3 are composed of n-type field effect transistors TN1 and TN3 (hereinafter referred to simply as the first and the third transistors) and the second field effect transistor T2 is composed of a p-type field effect transistor TP2 (hereinafter referred to simply as the second transistor) similarly to the 1st to the 8th embodiments. Further, the third transistor TN3 is connected between the backgate BG1 of the first transistor TN1 and the output terminal out, and the gate G3 of the third transistor TN3 is connected to the power supply line (high potential side) Vcc. Furthermore, the backgate BG3 of the third transistor TN3 is connected to the ground line (low potential side) GND, and the backgate BG2 of the second transistor TP2 is connected to the output terminal out. Thus, according to an output circuit related to the 9th embodiment of the present invention, the first and the third transistors TN1 and TN3 are composed of n-type field effect transistors, and the second transistor T2 is composed of a p-type field effect transistor. Further, the gate G3 of the third transistor TN3 is connected to the power supply line Vcc.

As a result, even if a voltage at a level higher than that of the power supply line Vcc is applied to the output terminal out as shown in FIG. 13(b) at time of suspension of output operation of the ninth output circuit, the third transistor TN3 (=SW1) performs OFF operation and the backgate BG1 of the first transistor TN1 is brought into an electrically floating state. Thus, it becomes possible to cut off a passage of a current which is going to flow out to the power supply line Vcc through a forward diode D1 which is parasitic between the power supply line Vcc and the backgate BG1 of the first transistor TN1. Besides, since the backgate BG2 of the second transistor TP2 is connected to the output terminal out, the influence by a forward diode D4 which is parasitic between the backgate BG2 of the transistor TP2 and the output terminal out is removed by a reverse diode D5 which is parasitic between the backgate BG2 of the transistor TP2 and the ground line GND, and the output terminal out is held in a high impedance state.

Further, at time of normal operation of the ninth output circuit, the third transistor TN3 performs ON operation based on the potential of the power supply line Vcc. Thus, a potential equivalent to the output level of the output terminal out is supplied to the backgate BG1 of the first transistor TN1, thereby reducing backgate dependency of the first transistor TN1 to the utmost.

With this, it becomes possible to maintain the output terminal out of the ninth output circuit in a high impedance state similarly to the first to the eighth output circuits and to raise the output "H" level to the utmost at time of normal operation thereof. Thus, when the ninth output circuit is integrated, stabilization of the output level is aimed at in a similar manner as the first to the eighth output circuits, thus making it possible to improve the reliability of the semiconductor integrated circuit device.

(10) Description of the 10th embodiment

Figure 14A:
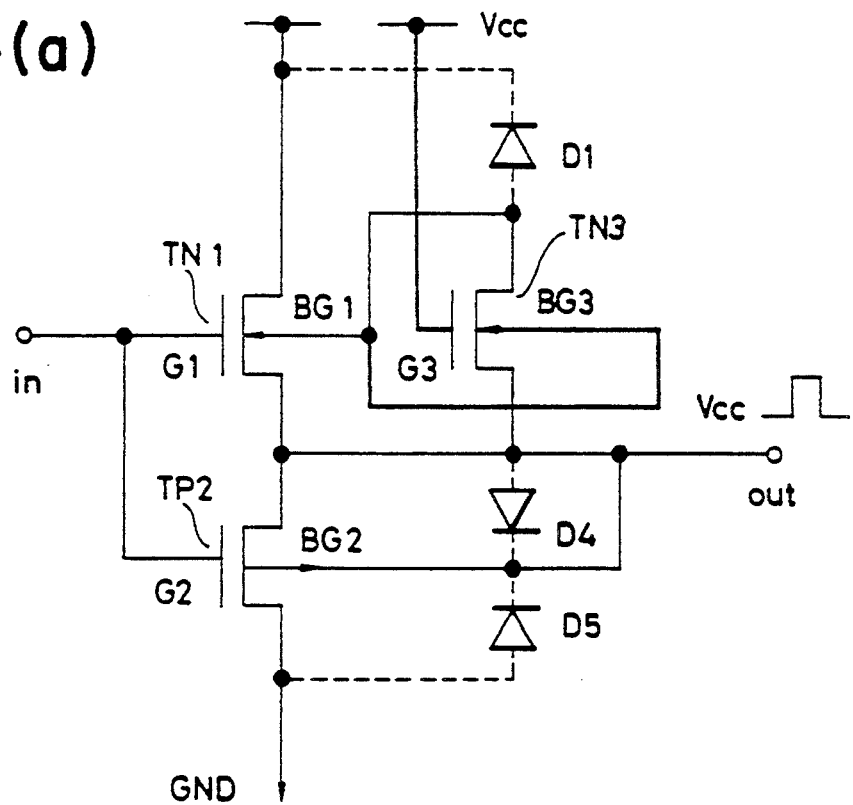
FIGS. 14(a) and 14(b) shows a circuit diagram of an output circuit according to a 10th embodiment of the present invention and an operation explanatory diagram thereof.
Figure 14B:
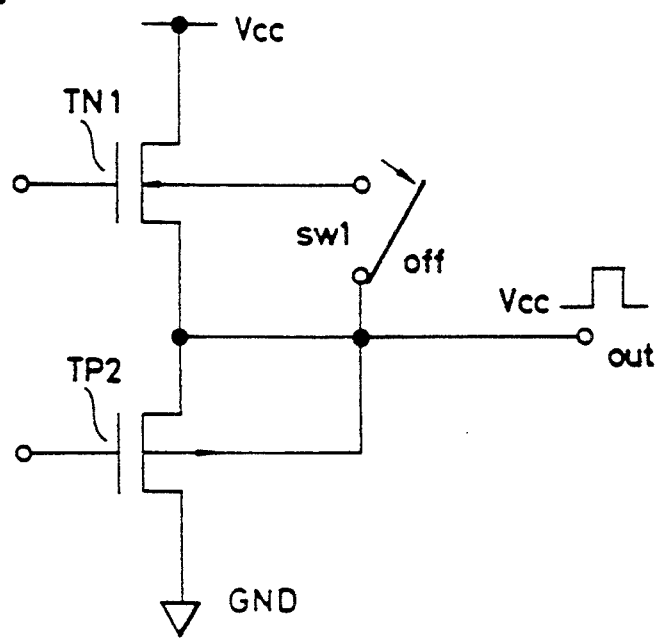

FIGS. 14(a) and 14(b) show a circuit diagram of an output circuit according to the 10th embodiment of the present invention and an operation explanatory diagram thereof, respectively. In FIG. 14(a), what differs from the 1st to the 8th embodiments is that the second transistor TN2 in the second output circuit is replaced with a p-type field effect transistor TP2 in the 10th embodiment.

Namely, the first and the third field effect transistors T1 and T3 are composed of n-type field effect transistors TN1 and TN3 (hereinafter referred to simply as the first and the third transistors) and the second field effect transistor T2 is composed of a p-type field effect transistor TP2 (hereinafter referred to simply as the second transistor). Further, the third transistor TN3 is connected between the backgate BG1 of the first transistor TN1 and the output terminal out, and the gate G3 of the third transistor TN3 is connected to the power supply line Vcc. Furthermore, the backgate BG3 of the third transistor TN3 is connected to the backgate BG1 of the first transistor TN1, and the backgate BG2 of the second transistor TP2 is connected to the output terminal out. Thus, according to an output circuit related to the 10th embodiment of the present invention, it is composed of the n-type field effect transistors TN1 and TN3 and the p-type field effect transistor TP2, and the gate G3 of the third transistor is connected to the power supply line Vcc.

As a result, even if a voltage at a level higher than that of the power supply line Vcc is applied to the output terminal out as shown In FIG. 14(b) at time of suspension of output operation of the tenth output circuit, the third transistor TN3 (=SW1) performs OFF operation and the backgate BG1 of the first transistor TN1 is brought into an electrically floating state. Thus, it becomes possible to cut off a passage of a current which is going to flow out to the power supply line Vcc through a forward diode D1 which is parasitic between the power supply line Vcc and the backgate BG1 of the first transistor TN1. Besides, since the backgate BG2 of the second transistor TP2 is connected to the output terminal out, the influence by a forward diode D4 which is parasitic between the backgate BG2 of the transistor TP2 and the output terminal out is removed by a reverse diode D5, and the output terminal out is held in a high impedance state.

Further, at time of normal operation of the tenth output circuit, the third transistor TN3 performs ON operation based on the potential of the power supply line Vcc. Thus, a potential equivalent to the output level of the output terminal out is supplied to the backgate BG1 of the first transistor TN1 and the backgate BG3 of the third transistor TN3, thereby reducing backgate dependency thereof to the utmost.

With this, it becomes possible to maintain the output terminal out of the tenth output circuit in a high impedance state similarly to the fifth and the ninth output circuits and to raise the output "H" level to the utmost at time of normal operation thereof. Thus, when the tenth output circuit is integrated, stabilization of the output level is aimed at in a similar manner as the first to the ninth output circuits, thus making it possible to improve the reliability of the semiconductor integrated circuit device.

(11) Description of the 11th embodiment

Figure 15A:
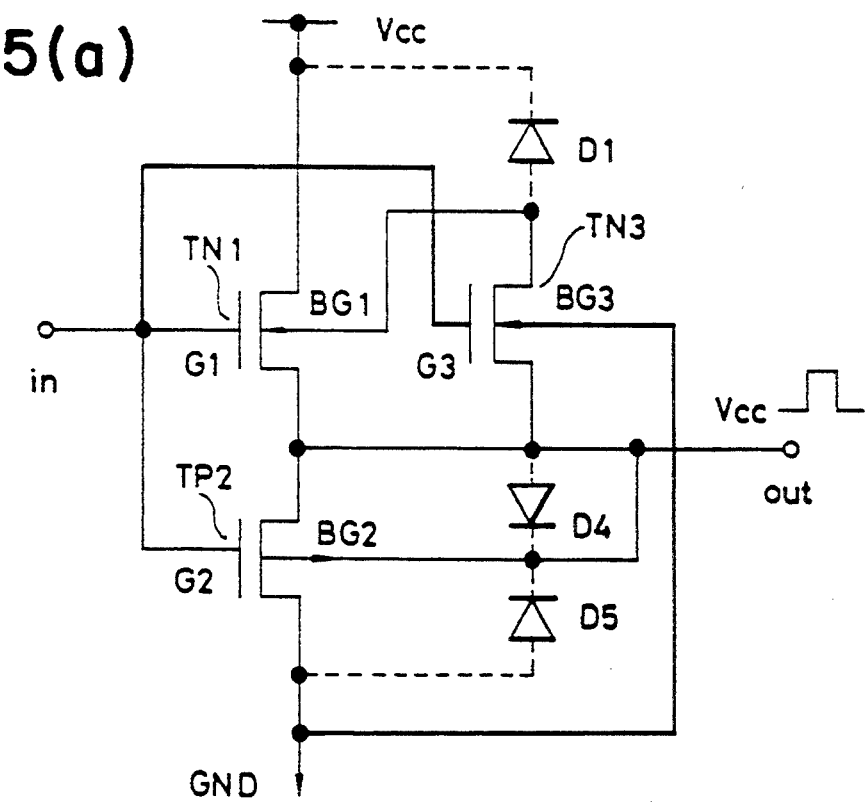
FIGS. 15(a) and 15(b) shows a circuit diagram of an output circuit according to a 11th embodiment of the present invention and an operation explanatory diagram thereof.
Figure 15B:
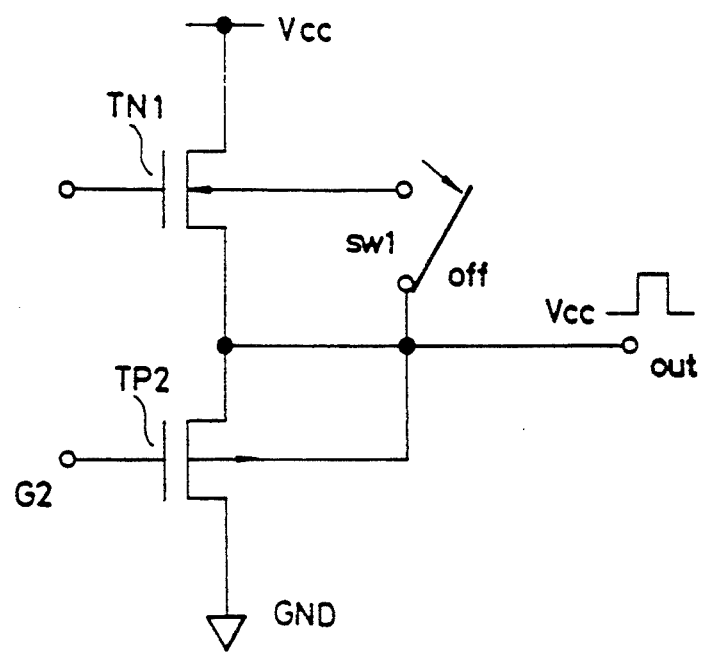

FIGS. 15(a) and 15(b) show a circuit diagram of an output circuit according to the 11th embodiment of the present invention and an operation explanatory diagram thereof, respectively. In FIG. 15(a), what differs from the 1st to the 8th embodiments is that the second transistor TN2 in the third output circuit is replaced with a p-type field effect transistor TP2 in the 11th embodiment.

Namely, the first and the third field effect transistors T1 and T3 are composed of n-type field effect transistors TN1 and TN3 (hereinafter referred to simply as the first and the third transistors) and the second field effect transistor T2 is composed of a p-type field effect transistor TP2 (hereinafter referred to simply as the second transistor). Further, the third transistor TN3 is connected between the backgate BG1 of the first transistor TN1 and the output terminal out, and the gate G3 of the third transistor TN3 is connected to the gate G1 of the first transistor TN1. Furthermore, the backgate BG3 of the third transistor TN3 is connected to the ground line GND, and the backgate BG2 of the second transistor TP2 is connected to the output terminal out. Thus, according to an output circuit related to 11th embodiment of the present invention shown in FIG. 15(a), the gate G3 of the third transistor TN3 for controlling the backgate BG1 of the first transistor TN1 is connected to the gate G1 of the first transistor TN1, and the backgate BG3 of the third transistor TN3 is connected to the ground line GND.

As a result, even If a voltage at a level higher than that of the power supply line Vcc is applied to the output terminal out as shown in FIG. 15(b) at time of suspension of output operation of the eleventh output circuit, the third transistor TN3 (=SW1) performs OFF operation and the backgate BG1 of the first transistor TN1 is brought into an electrically floating state. Thus, it becomes possible to cut off a passage of a current which is going to flow out to the power supply line Vcc through a forward diode D1 which is parasitic between the power supply line Vcc and the backgate BG1 of the first transistor TN1. Besides, since the backgate BG2 of the second transistor TP2 is connected to the output terminal out, the influence by a forward diode D4 which is parasitic between the backgate BG2 of the transistor TP2 and the output terminal out is removed by a reverse diode D5, and the output terminal out is held in a high impedance state.

Further, at time of normal operation of the eleventh output circuit, the third transistor TN3 performs ON operation based on the input level of the gate G1 of the first transistor TN1. Thus, a potential equivalent to the output level of the output terminal out is supplied to the backgate BG1 of the first transistor TN1, thereby reducing backgate dependency thereof to the utmost.

With this, it becomes possible to maintain the output terminal out of the eleventh output circuit in a high impedance state similarly to the first to the tenth output circuits and to raise the output "H" level to the utmost at time of normal operation thereof. Thus, when the eleventh output circuit is integrated, stabilization of the output level is aimed at In a similar manner as the first to the tenth output circuits, thus making it possible to improve the reliability of the semiconductor integrated circuit device.

(12) Description of the 12th embodiment

Figure 16A:
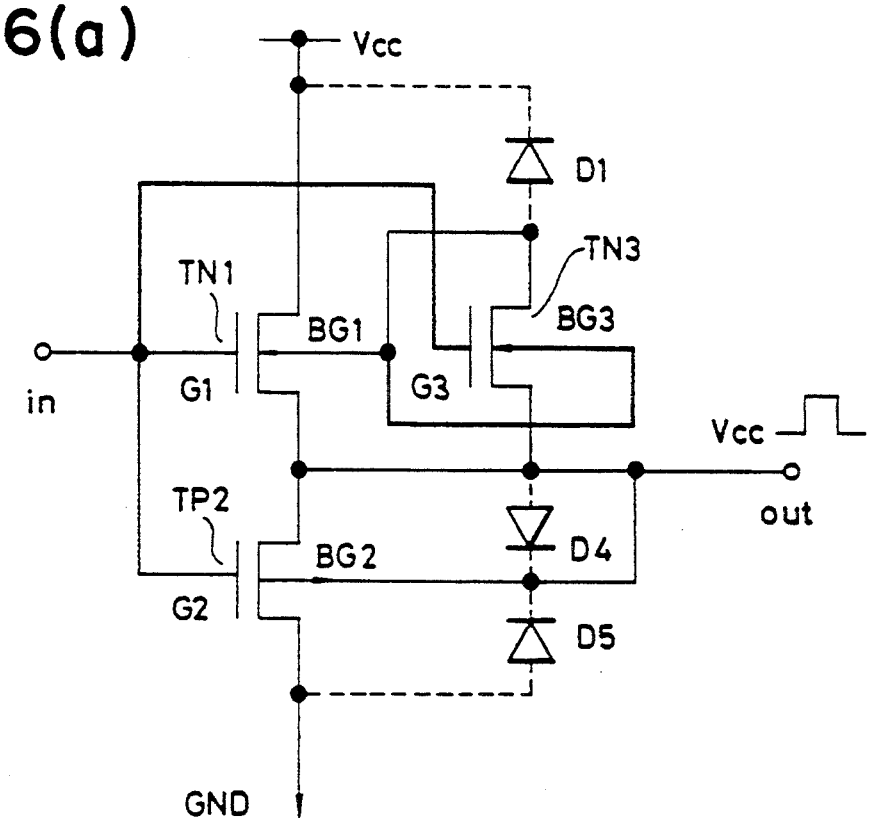
FIGS. 16(a) and 16(b) shows a circuit diagram of an output circuit according to a 12th embodiment of the present invention and an operation explanatory diagram thereof.
Figure 16B:
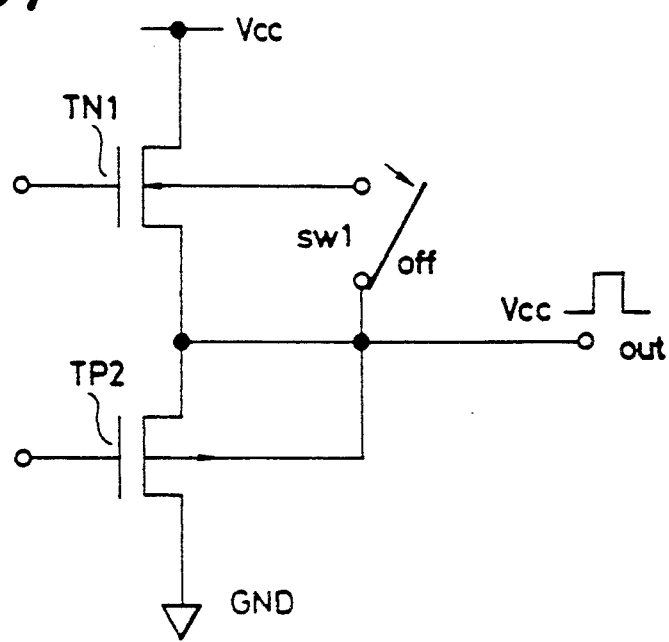

FIGS. 16(a) and 16(b) show a circuit diagram of an output circuit according to the 12th embodiment of the present invention and an operation explanatory diagram thereof, respectively. In FIG. 16(a), what differs from the 1st to the 8th embodiments is that the second transistor TN2 in the fourth output circuit is replaced with a p-type field effect transistor TP2 in the 12th embodiment.

Namely, the first and the third field effect transistors T1 and T3 are composed of n-type field effect transistors TN1 and TN3 (hereinafter referred to simply as the first and the third transistors) and the second field effect transistor T2 is composed of a p-type field effect transistor TP2 (hereinafter referred to simply as the second transistor). Further, the third transistor TN3 is connected between the backgate BG1 of the first transistor TN1 and the output terminal out, and the gate G3 of the third transistor TN3 is connected to the gate G1 of the first transistor T1. Furthermore, the backgate BG3 of the third transistor TN3 is connected to the backgate BG1 of the first transistor TN1, and the backgate BG2 of the second transistor TP2 is connected to the output terminal out. Thus, according to an output circuit related to the 12th embodiment of the present invention, the gate G3 of the third transistor TN3 for controlling the backgate BG1 of the first transistor TN1 is connected to the gate G1 of the first transistor TN1, and the backgate BG3 of the third transistor TN3 is connected to the backgate BG1 of the first transistor TN1.

As a result, even if a voltage at a level higher than that of the power supply line Vcc is applied to the output terminal out as shown in FIG. 16(b) at time of suspension of output operation of the eleventh output circuit, the third transistor TP3 (=SW1) performs OFF operation and the backgate BG1 of the first transistor TN1 is brought into an electrically floating state. Thus, it becomes possible to cut off a passage of a current which is going to flow out to the power supply line Vcc through a forward diode D1 which is parasitic between the power supply line Vcc and the backgate BG1 of the first transistor TN1. Besides, since the backgate BG2 of the second transistor TP2 is connected to the output terminal out, the influence by a forward diode D4 which is parasitic between the backgate BG2 of the second transistor TP2 and the output terminal out is removed by the reverse diode D5, and the output terminal out is held in a high impedance state.

Further, at time of normal operation of the twelfth output circuit, the third transistor TN3 performs ON operation based on the input level of the gate G1 of the first transistor TN1. Thus, a potential equivalent to the output level of the output terminal out is supplied to the backgate BG1 of the first transistor TN1 and the backgate BG3 of the third transistor TN3, thereby reducing backgate dependency thereof to the utmost.

With this, it becomes possible to maintain the output terminal out of the twelfth output circuit in a high impedance state similarly to the first to the eleventh output circuits and to raise the output "H" level to the utmost at time of normal operation thereof. Thus, when the twelfth output circuit is integrated, stabilization of the output level is aimed at in a similar manner as the first to the eleventh output circuits, thus making it possible to improve the rollability of the semiconductor integrated circuit device.

(13) Description of the 13th embodiment

Figure 17A:
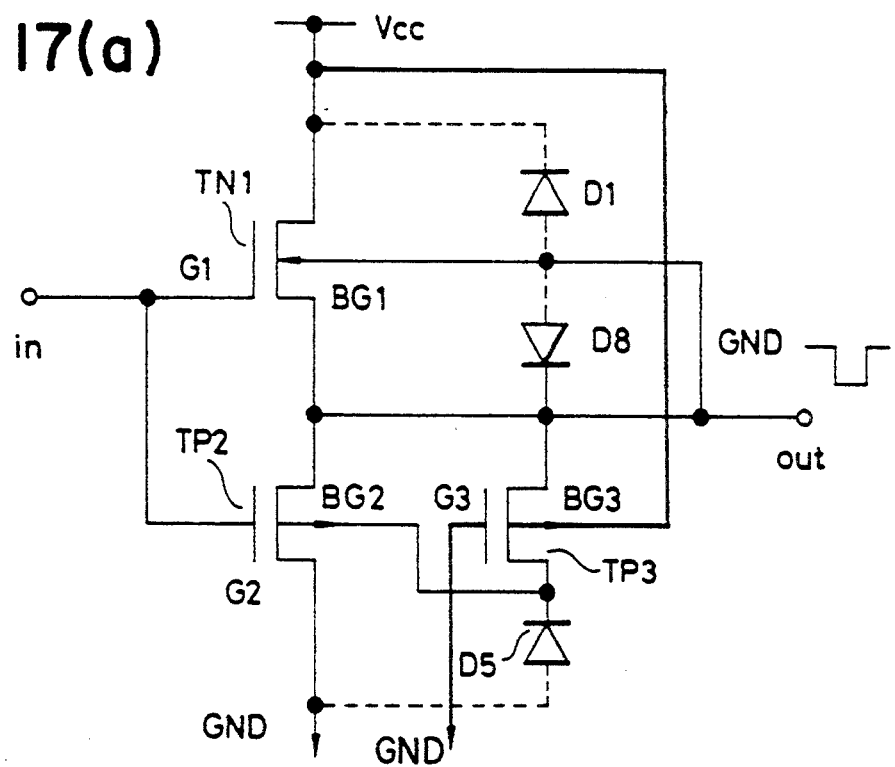
FIGS. 17(a) and 17(b) shows a circuit diagram of an output circuit according to a 13th embodiment of the present invention and an operation explanatory diagram thereof.
Figure 17B:
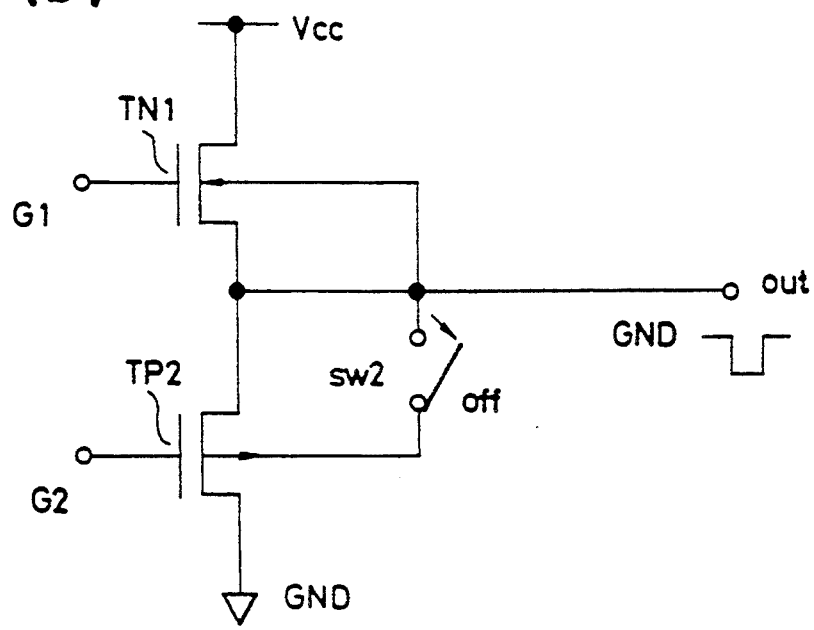

FIGS. 17(a) and 17(b) show a circuit diagram of an output circuit according to the 13th embodiment of the present invention and an operation explanatory diagram thereof, respectively. In FIG. 17(a), what differs from the 9th to the 12th embodiments is that the third transistor TP3 is replaced with a p-type field effect transistor, and the gates G1 and G2 of the first and the second transistors TN1 and TP2 are made common to each other so as to form a CMOS circuit.

Namely, the first field effect transistor T1 in the principle diagram (1) shown in FIG. 1 is composed of an n-type field effect transistor TN1 (hereinafter referred to simply as the first transistor), and the second and the third field effect transistors T2 and T3 are composed of p-type field effect transistors TP2 and TP3 (hereinafter referred to simply as the second and the third transistors). Further, the backgate BG1 of the first transistor TN1 is connected to the output terminal out, and the third transistor TP3 is connected between the backgate BG2 of the second transistor TP2 and the output terminal out. Furthermore, the gate G3 of the third transistor TP3 is connected to the ground line GND, and the backgate BG3 of the third transistor TP3 is connected to the power supply line Vcc.

Thus, according to the output circuit related to the 13th invention shown in FIG. 17(a) of the present embodiment, the third transistor TP3 for controlling the backgate BG2 of the second transistor TP2 is provided, and the gate G3 of the third transistor TP3 is connected to the ground line GND and the backgate BG3 thereof is connected to the power supply line Vcc.

As a result, even if a voltage at a level lower than that of the power supply line GND is applied to the output terminal out as shown in FIG. 17(b) at time of suspension of output operation of the 13th output circuit, the third transistor TP3 (=SW2) performs OFF operation, and the backgate BG2 of the second transistor TP2 is brought into an electrically floating state. Thus, it becomes possible to cut off a passage of a current which is going to flow out to the output terminal out from the ground line GND through a forward diode D5 which is parasitic between the ground line GND and the backgate BG2 of the second transistor TP2. Besides, the influence by a reverse diode D8 which is parasitic between the backgate BG1 of the first transistor TN1 and the power output terminal out is removed by the forward diode D1 which is parasitic between the backgate BG1 of the first transistor TN1 and the power supply line Vcc, so that the output terminal out is held in a high impedance state.

Further, at time of normal operation of the 13th output circuit, the third transistor TP3 performs ON operation based on the potential of the ground line GND. Thus, a potential equivalent to the output level of the output terminal out is supplied to the backgate BG2 of the second transistor TP2, thereby reducing backgate dependency of the second transistor TP2 to the utmost.

With this, it becomes possible to maintain the output terminal out of the 13th output circuit in a high impedance state similarly to the 9th and the 12th embodiments, and also to lower the output "L" level to the utmost at time of normal operation. Thus, when the 13th output circuit is integrated, stabilization of the output level is aimed at similarly to the to the 12th output circuits, thus making it possible to improve the reliability of the semiconductor integrated circuit device.

(14) Description of the 14th embodiment

Figure 18A:
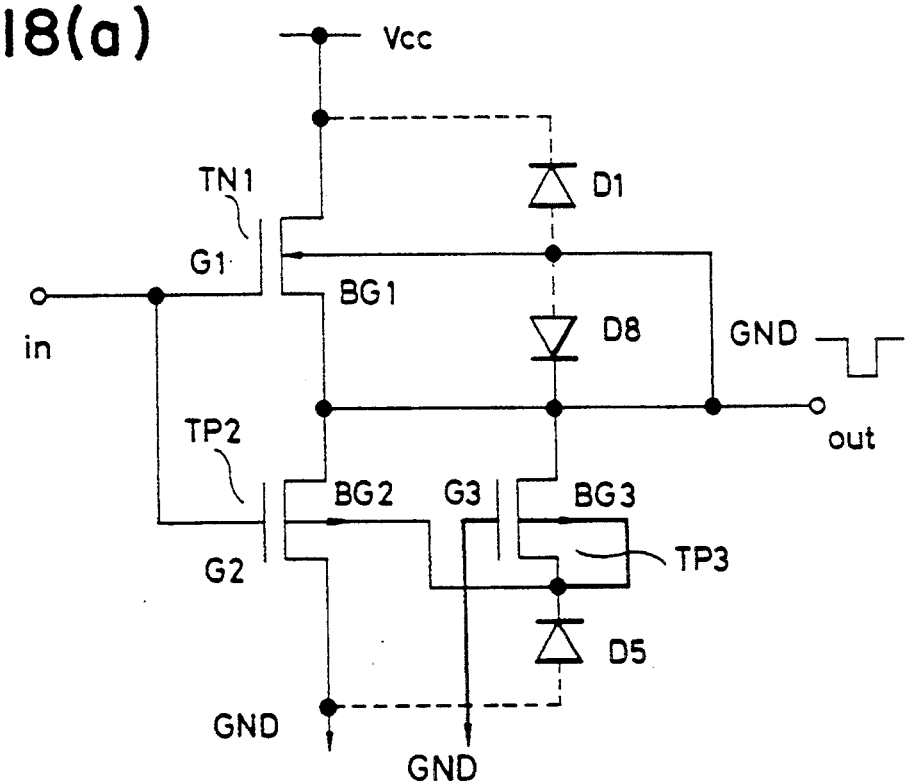
FIGS. 18(a) and 18(b) shows a circuit diagram of an output circuit according to a 14th embodiment of the present invention and an operation explanatory diagram thereof.
Figure 18B:
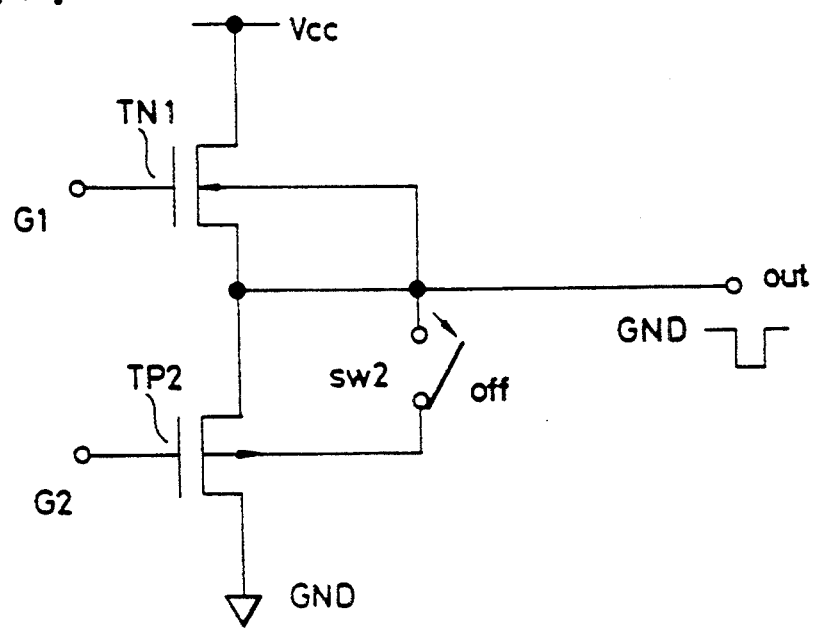

FIGS. 18(a) and 18(b) show a circuit diagram according to the 14th embodiment of the present invention and an operation explanatory diagram thereof, respectively. In FIG. 18(a), what differs from the 9th to the 13th embodiments is that the backgate BG3 of the third transistor TP3 is connected to the backgate BG2 of the second transistor TP2 in the 14th embodiment.

Namely, the first field effect transistor T1 in the principle diagram (1) shown in FIG. 1 is composed of an n-type field effect transistor TN1, and the second and the third field effect transistors T2 and T3 are composed of p-type field effect transistors TP2 and TP3 similarly to the 13th embodiment. Further, the backgate BG1 of the first transistor TN1 is connected to the output terminal out, and the third transistor TP3 is connected between the backgate BG2 of the second transistor TP2 and the output terminal out. Furthermore, the gate G3 of the third transistor TP3 is connected to the ground line GND, and the backgate BG3 of the third transistor TP3 is connected to the backgate BG2 of the second transistor TP2.

Thus, according to the output circuit related to the 14th invention of the present embodiment, the third transistor TP3 for controlling the backgate BG2 of the second transistor TP2 is provided, and the gate G3 of the third transistor TP3 is connected to the ground line GND and the backgate BG3 thereof is connected to the backgate BG2 of the second transistor TP2 as shown in FIG. 18(a).

As a result, even if a voltage at a level lower than that of the power supply line GND is applied to the output terminal out as shown in FIG. 18(b) at time of suspension of output operation of the 14th output circuit, the third transistor TP3 (=SW2) performs OFF operation, and the backgate BG2 of the second transistor TP2 is brought into an electrically floating state. Thus, it becomes possible to cut off a passage of a current which is going to flow out to the output terminal out from the ground line GND through a forward diode D9 which is parasitic between the ground line GND and the backgate BG2 of the second transistor TP2. Besides, the influence by a reverse diode D8 which is parasitic between the backgate BG1 of the first transistor TN1 and the output terminal out is removed by the forward diode D1 which is parasitic between the backgate BG1 of the first transistor TN1 and the power supply line Vcc, so that the output terminal out is held in a high impedance state.

Further, at time of normal operation of the 14th output circuit, the third transistor TP3 performs ON operation based on the potential of the ground line GND. Thus, a potential equivalent to the output level of the output terminal out is supplied to the backgate BG2 of the second transistor TP2 and the backgate BG3 of the third transistor TP3, thereby reducing backgate dependency of the second transistor TP2 to the utmost.

With this, it becomes possible to maintain the output terminal out of the 14th output circuit similarly to the 9th and the 13th embodiments in a high impedance state, and also to lower the output "L" level to the utmost at time of normal operation. Thus, when the 14th output circuit is integrated, stabilization of the output level is aimed at similarly to the 1st to the 13th output circuits, thus making it possible to improve the reliability of the semiconductor integrated circuit device.

(15) Description of the 15th embodiment

Figure 19A:
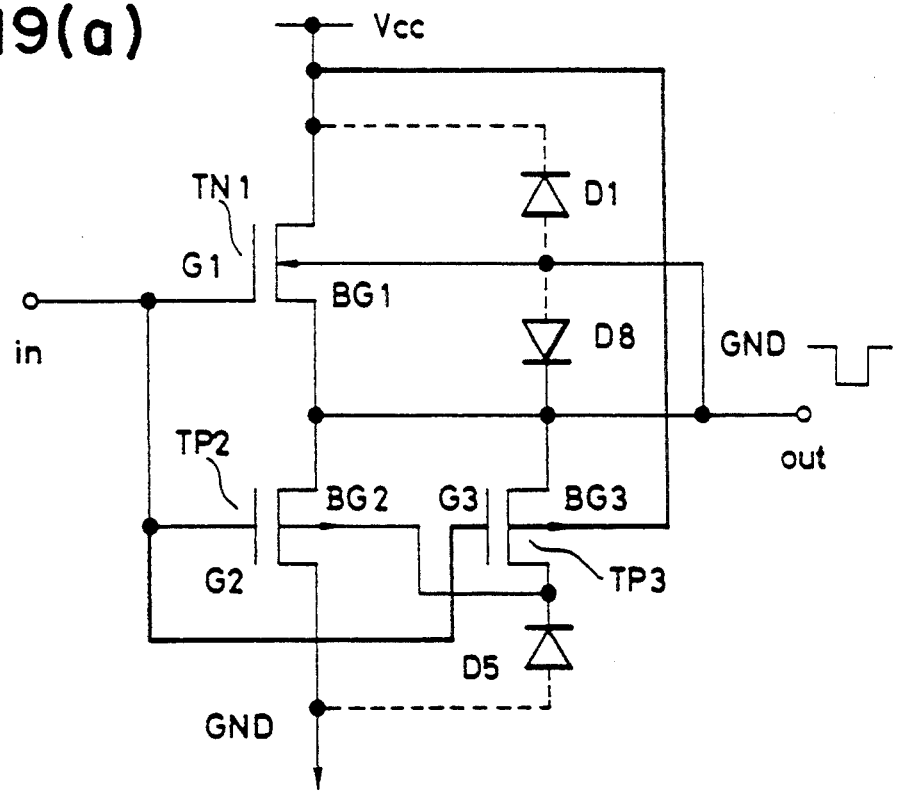
FIGS. 19(a) and 19(b) shows a circuit diagram of an output circuit according to a 15th embodiment of the present invention and an operation explanatory diagram thereof.
Figure 19B:
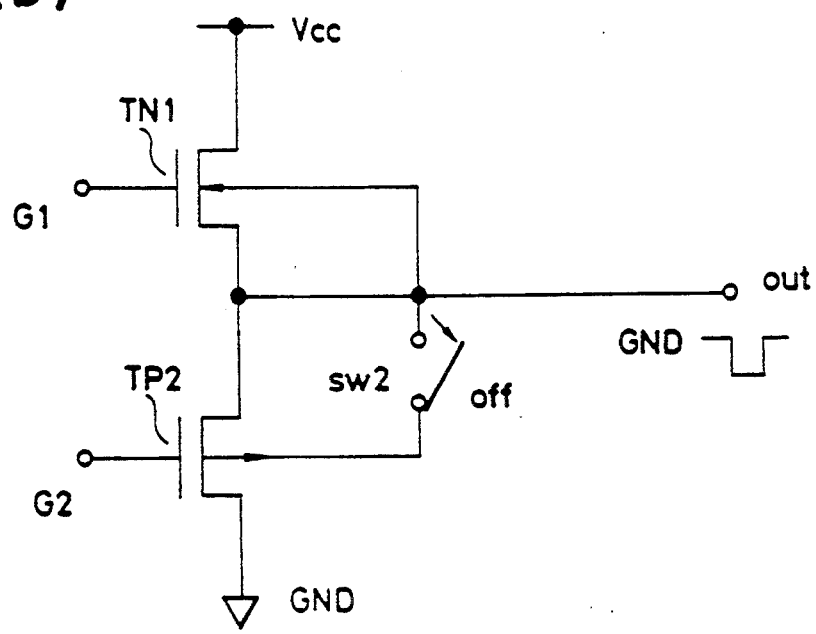

FIGS. 19(a) and 19(b) show a circuit diagram of an output circuit according to the 15th embodiment of the present invention and an operation explanatory diagram thereof, respectively. In FIG. 19(a), what differs from the 9th to the 14th embodiments is that the backgate BG3 of the third transistor TP3 is connected to the power supply line Vcc and the gate G3 thereof is connected to the gate G2 of the second transistor TP2 in the 15th embodiment.

Namely, the first field effect transistor T1 in the principle diagram (1) shown in FIG. 1 is composed of an n-type field effect transistor TN1 (hereinafter referred to simply as the first transistor), and the second and the third field effect transistors T2 and T3 are composed of p-type field effect transistors TP2 and TP3 (hereinafter referred to simply as the second and the third transistors). Further, the backgate BG1 of the first transistor TN1 is connected to the output terminal out and the third transistor TP3 is connected between the backgate BG2 of the second transistor TP2 and the output terminal out. Furthermore, the gate G3 of the third transistor TP3 is connected to the gate G2 of the second transistor TP2, and the backgate BG3 of the third transistor TP3 is connected to the power supply line Vcc.

Thus, according to the output circuit related to the 15th invention shown in FIG. 19(a) of the present embodiment, the third transistor TP3 for controlling the backgate BG2 of the second transistor TP2 is provided, and the gate G3 of the third transistor TP3 is connected to the gate G2 of the second transistor TP2 and the backgate BG3 thereof is connected to the power supply line Vcc.

As a result, even if a voltage at a level lower than that of the power supply line GND is applied to the output terminal out, as shown in FIG. 19(b) at time of suspension of output operation of the 15th output circuit, the third transistor TP3 (=SW2) performs OFF operation, and the backgate BG2 of the second transistor TP2 is brought into an electrically floating state. Thus, it becomes possible to cut off a passage of a current which is going to flow out to the output terminal out from the ground line GND through a forward diode D5 which is parasitic between the ground line GND and the backgate BG2 of the second transistor TP2. Besides, the influence by a reverse diode D8 which is parasitic between the backgate BG1 of the first transistor TN1 and the output terminal out is removed by the forward diode D1 which is parasitic between the backgate BG1 of the first transistor TN1 and the power supply line Vcc, so that the output terminal out is held in a high impedance state.

Further, at time of normal operation of the 15th output circuit, the third transistor TP3 performs ON operation based on the input level of the gate G2 of the second transistor TP2. Thus, a potential equivalent to the output level of the output terminal out is supplied to the backgate BG2 of the second transistor TP2 and the backgate BG3 of the third transistor TP3, thereby reducing backgate dependency of the second transistor TP2 to the utmost.

With this, it becomes possible to maintain the output terminal out of the 15th output circuit similarly to the 13th and the 14th output circuits in a high impedance state, and also to lower the output "L" level to the utmost at time of normal operation. Thus, when the 15th output circuit is integrated, stabilization of the output level is aimed at similarly to the 1st to the 14th output circuits, thus making it possible to improve the reliability of the semiconductor integrated circuit device.

(16) Description of the 16th embodiment

Figure 20A:
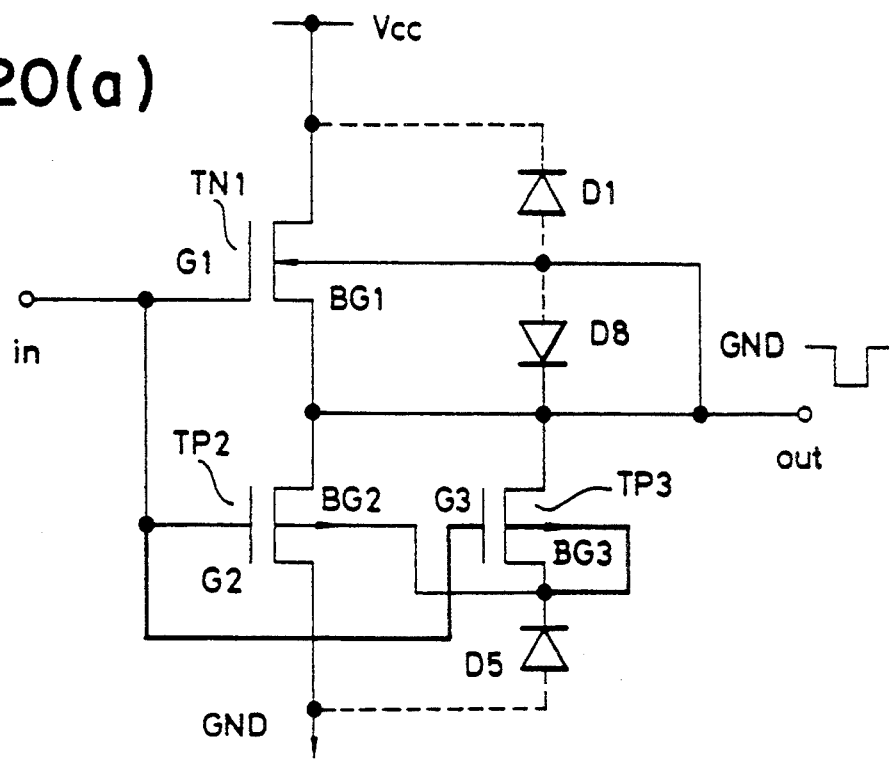
FIGS. 20(a) and 20(b) shows a circuit diagram of an output circuit according to a 16th embodiment of the present invention and an operation explanatory diagram thereof.
Figure 20B:
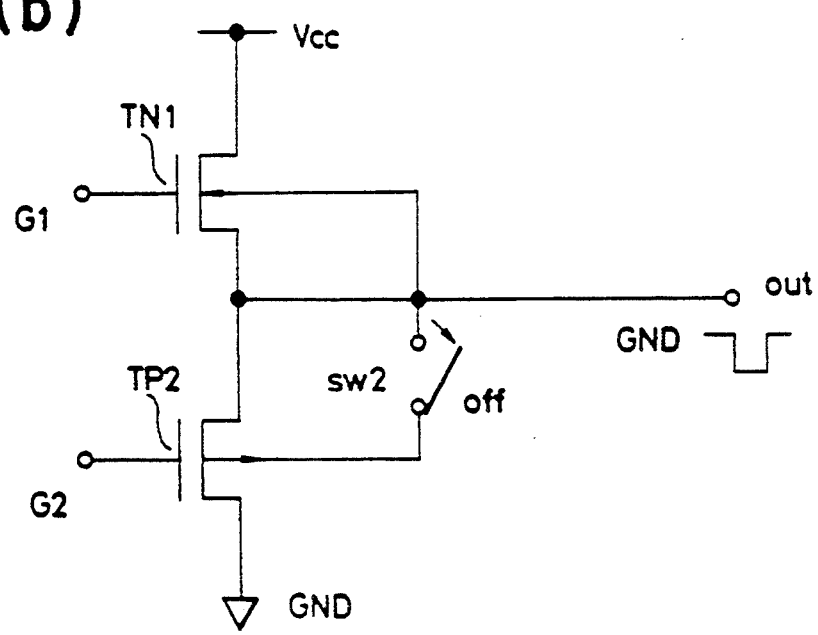

FIGS. 20(a) and 20(b) show a circuit diagram of an output circuit according to the 16th embodiment of the present Invention and an operation explanatory diagram thereof, respectively. In FIG. 20(a), what differs from the 13th to the 15th embodiments is that the backgate BG3 of the third transistor TP3 is connected to the backgate BG2 of the second transistor TP2 and the gate G3 thereof is connected to the gate G2 of the second transistor TP2 in the 16th embodiment.

Namely, the first field effect transistor T1 in the principle diagram (1) shown in FIG. 1 is composed of an n-type field effect transistor TN1 (hereinafter referred to simply as the first transistor), and the second and the third field effect transistors T2 and T3 are composed of p-type field effect transistors TP2 and TP3 (hereinafter referred to simply as the second and the third transistors). Further, the backgate BG1 of the first transistor TN1 is connected to the output terminal out, and the third transistor TP3 is connected between the backgate BG2 of the second transistor TP2 and the output terminal out. Furthermore, the gate G3 of the third transistor TP3 is connected to the gate 62 of the second transistor TP2, and the backgate BG3 of the third transistor TP3 is connected to the backgate BG2 of the second transistor TP2.

Thus, according to the output circuit related to the 16th invention of the present embodiment, the third transistor TP3 for controlling the backgate BG2 of the second transistor TP2 is provided, and the gate G3 of the third transistor TP3 is connected to the gate G2 of the second transistor TP2 and the backgate BG3 thereof is connected to the backgate BG2 of the second transistor TP2 as shown in FIG. 20(a).

As a result, even If a voltage at a level lower than that of the power supply line GND is applied to the output terminal out as shown in FIG. 20(b) at time of suspension of output operation of the 16th output circuit, the third transistor TP3 (=SW2) performs OFF operation, and the backgate BG2 of the second transistor TP2 is brought into an electrically floating state. Thus, it becomes possible to cut off a passage of a current which is going to flow out to the output terminal out from the ground line GND through a forward diode D13 which is parasitic between the ground line GND and the backgate BG2 of the second transistor TP2. Further, at time of normal operation of the 16th output circuit, the third transistor TP3 performs ON operation based on the input level of the gate G2 of the second transistor TP2. Thus, a potential equivalent to the output level of the output terminal out is supplied to the backgate BG2 of the second transistor TP2 and the backgate BG3 of the third transistor TP3, thereby reducing backgate dependency of the second transistor TP2 to the utmost.

With this, it becomes possible to maintain the output terminal out of the 16th output circuit similarly to the 13th to the 15th output circuits in a high impedance state, and also to lower the output "L" level to the utmost at time of normal operation. Thus, when the 16th output circuit is integrated, stabilization of the output level is aimed at similarly to the 1st to the 15th output circuits, thus making it possible to improve the reliability of the semiconductor integrated circuit device.

Cases such that one transistor TN3 or TP3, is provide for controlling the state of the backgate BG1 and BG2 of the first transistors TN1 and TP1 and the second transistors TN2 and TP2 have been described so far, but a fourth transistor TN4 or TP4 for assisting the transistor TN3 or TP3 is connected in the 17th to the 32nd embodiments.

(17) Description of the 17th embodiment

Figure 21A:
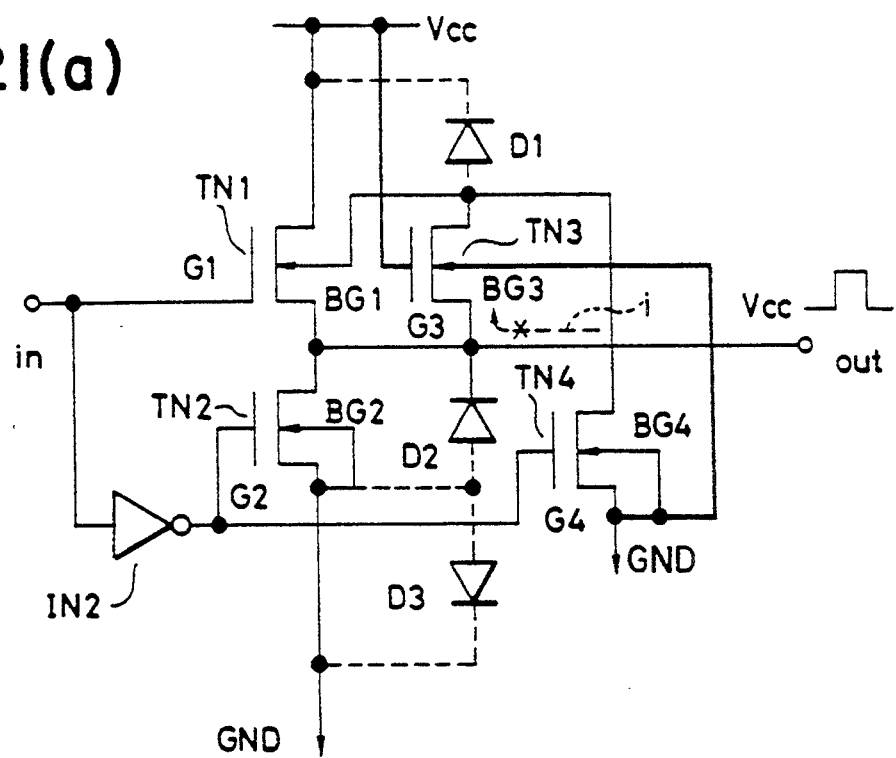
FIGS. 21(a) and 21(b) shows a circuit diagram of an output circuit according to a 17th embodiment of the present invention and an operation explanatory diagram thereof.
Figure 21B:
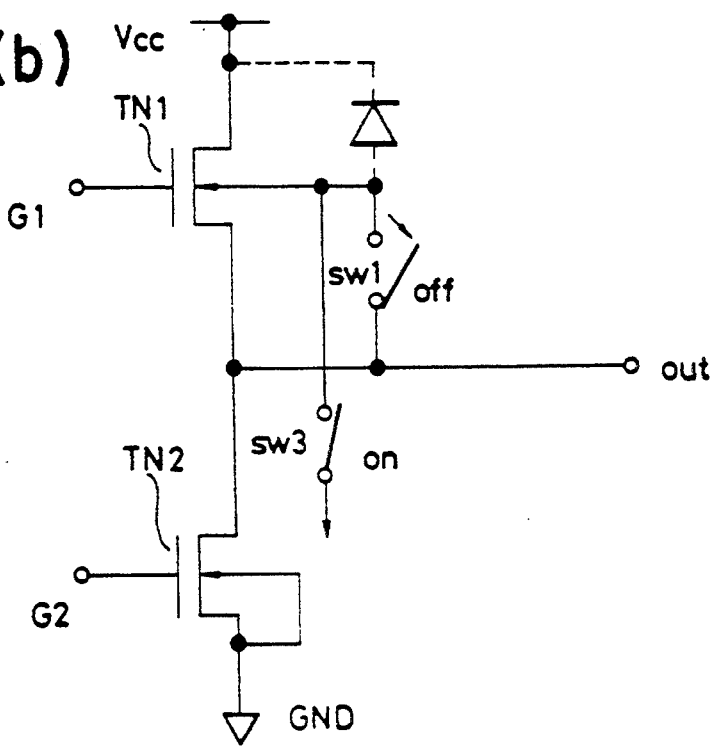

FIGS. 21(a) and 21(b) show a circuit diagram of an output circuit according to the 17th embodiment of the present Invention and an operation explanatory diagram thereof, respectively. In FIG. 21(a), what differs from the first to the 16th embodiments is that a fourth transistor TN4 for assisting backgate state control of the third transistor TN3 and a signal inversion element IN2 for supplying an input signal to the transistor TN4 are provided in the 17th embodiment.

Figure 2:
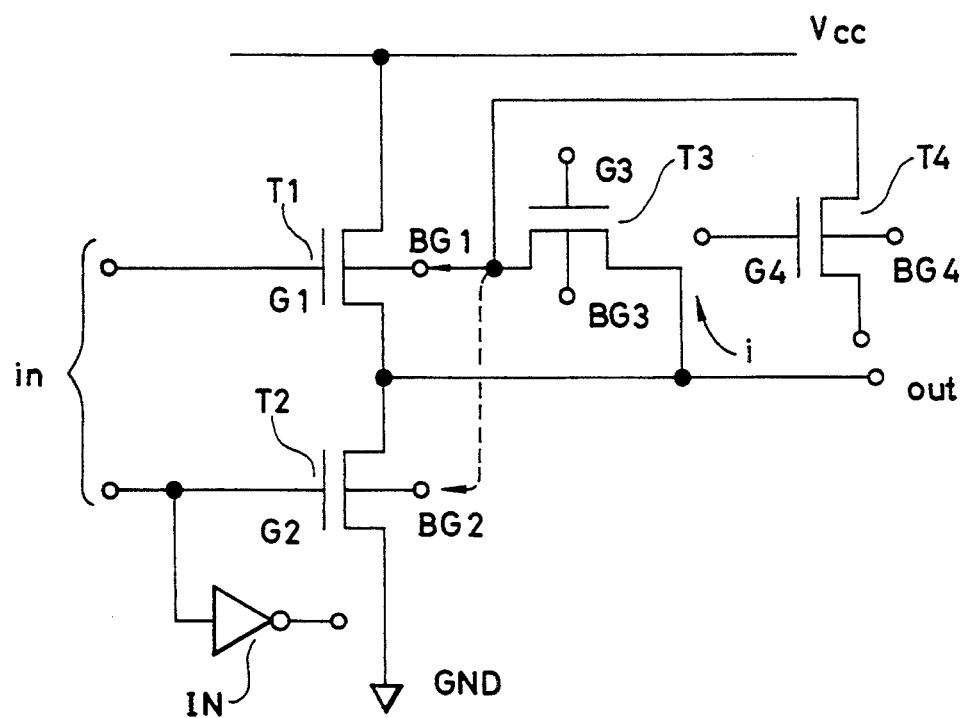
FIG. 2 is a principle diagram (2) of an output circuit according to the present invention.

Namely, the first, the second, the third and the fourth field effect transistors T1, T2, T3 and T4, respectively, in the principle diagram (2) shown in FIG. 2 are composed of n-type field effect transistors TN1, TN2, TN3 and TN4 (hereinafter referred to simply as the first to the fourth transistors). Further, the third transistor TN3 is connected between the backgate BG1 of the first transistor TN1 and the output terminal out, and the gate G3 of the third transistor TN3 is connected to the power supply line Vcc. Furthermore, the backgate BG3 of the third transistor TN3 is connected to the ground line GND, and the backgate BG2 of the second transistor TN2 is connected to the ground line GND. Besides, the fourth transistor TN4 is connected between the backgate BG1 of the first transistor TN1 and the ground line GND, and the gate G4 of the transistor TN4 is connected to the inverter IN2 representing an example of the signal inversion element IN. Further, the backgate BG4 of the fourth transistor TN4 is connected to the ground line GND. Thus, according to the output circuit related to the 17th embodiment of the present invention, the fourth transistor TN4 for aiding backgate control of the third transistor TN3 and the inverter IN2 for supplying an input signal to the transistor TN4 are provided as shown in FIG. 21(a).

As a result, even if a voltage at a level higher than that of the power supply line Vcc is applied as shown in FIG. 21(b) at time of suspension of output operation of the 17th output circuit, the third transistor TN3 (=SW1) performs OFF operation, and the fourth transistor TN4 (=SW3) performs ON operation. Thus, it becomes possible to bring the backgate BG1 of the transistor TN1 to the potential level of the ground line GND without bringing the backgate BG1 of the first transistor TN1 to an electrically floating state as in the first output circuit.

With this, it becomes possible to cut off a passage of a current i which is going to flow to the power supply line Vcc through a forward diode D1 which is parasitic between the power supply line Vcc and the backgate BG1 of the first transistor TN1 as in the first output circuit. Besides, the influence by the forward diode D3 which is parasitic between the backgate BG1 of the second transistor TN2 and the ground line GND is removed by the forward diode D2 which is parasitic between the backgate BG1 of the transistor TN2 and the output terminal out, and the output terminal out is held in a high impedance state.

Further, at time of normal operation of the 17th output circuit, the third transistor TN3 performs ON operation based on the potential of the power supply line Vcc, and the fourth transistor TN4 performs OFF operation in accordance with the output level of the inverter IN2. Thus, a potential equivalent to the output level of the output terminal out is supplied to the backgate BG1 of the first transistor TN1, thereby reducing backgate dependency of the first transistor TN1 to the utmost.

With this, it becomes possible to maintain the output terminal out of the 17th output circuit in a high impedance state similarly to the first output circuit, and to false the output "H" level to the utmost at time of normal operation thereof. With this, when the 17th output circuit is integrated, stabilization of the output level is aimed at similarly to the first to the 16th output circuits, thus making it possible to improve the reliability of the semiconductor integrated circuit device.

(18) Description of the 18th embodiment

Figure 22A:
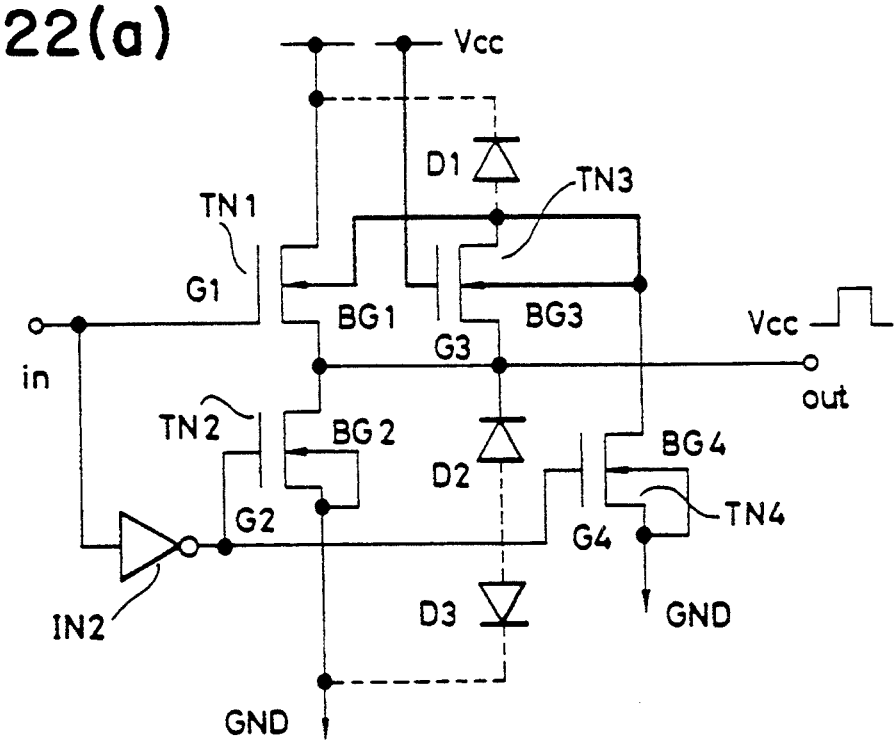
FIGS. 22(a) and 22(b) shows a circuit diagram of an output circuit according to a 18th embodiment of the present invention and an operation explanatory diagram thereof.
Figure 22B:
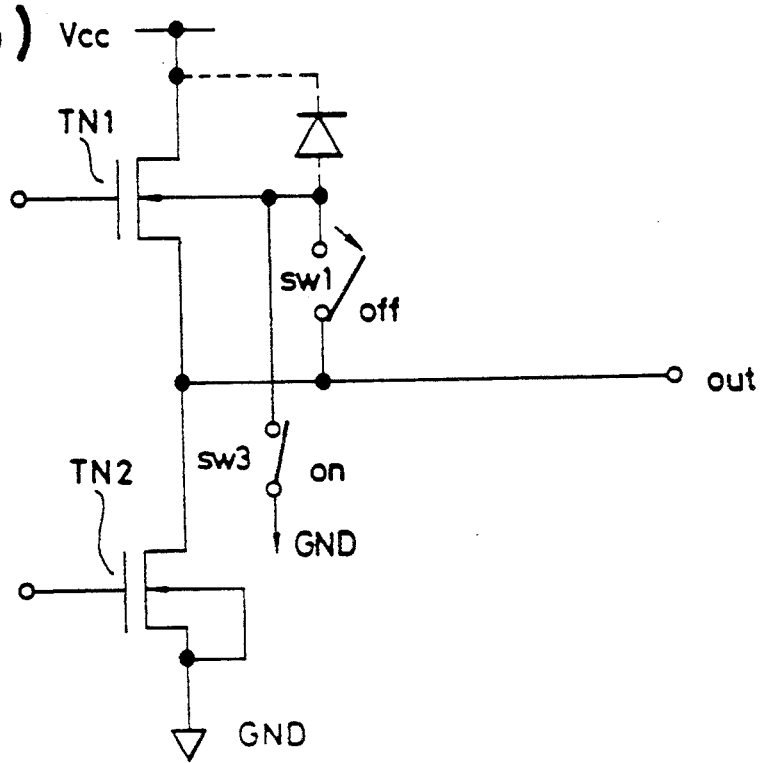

FIGS. 22(a) and 22(b) show a circuit diagram of an output circuit according to the 18th embodiment of the present invention and an operation explanatory diagram thereof, respectively. In FIG. 22(a), what differs from the 17th embodiment is that the backgate BG3 of the third transistor TN3 is connected to the backgate BG1 of the first transistor TN1 in the 18th embodiment.

Namely, the first, the second, the third and the fourth field effect transistors T1, T2, T3 and T4, respectively in the principle diagram (2) shown in FIG. 21 are composed of n-type field effect transistors TN1, TN2, TN3 and TN4 (hereinafter referred to simply as the first to the fourth transistors) similarly to the 17th embodiment. Further, the third transistor TN3 is connected between the backgate BG1 of the first transistor TN1 and the output terminal out, and the gate G3 of the third transistor TN3 is connected to the power supply line Vcc. Furthermore, the backgate BG3 of the third transistor TN3 is connected to the backgate BG1 of the first transistor TN1, and the backgate BG2 of the second transistor TN2 is connected to the ground line GND. Besides, the fourth transistor TN4 is connected between the backgate BG1 of the first transistor TN1 and the ground line GND, and the gate G4 of the fourth transistor TN4 is connected to the inverter IN2. Further, the backgate BG4 of the fourth transistor TN4 is connected to the ground line GND. Thus, according to the output circuit related to the 18th embodiment of the present invention shown in FIG. 22(a), the fourth transistor TN4 for aiding backgate control of the third transistor TN3 is provided, and the backgate BG3 of the third transistor TN3 is connected to the backgate BG1 of the first transistor TN1 in place of the ground line GND.

As a result, even if a voltage at a level higher than that of the power supply line Vcc is applied to the output terminal out as shown in FIG. 22(b) at time of suspension of output operation of the 18th output circuit, the third transistor TN3 (=SW1) performs OFF operation and the fourth field effect transistor TN4 (=SW3) performs ON operation. Thus, it becomes possible to bring the backgate BG1 of the transistor TN1 to the level of the ground line GND as in the 17th output circuit without bringing the backgate BG1 of the first transistor TN1 to an electrically floating state as in the second output circuit. With this, it becomes possible to cut off a passage of a current which is going to flow to the power supply line Vcc through the forward diode D1 which is parasitic between the power supply line Vcc and the backgate BG1 of the first transistor TN1. Besides, the influence by the forward diode D3 which is parasitic between the backgate BG1 of the second transistor TN2 and the ground line GND is removed by the forward diode D2 which is parasitic between the backgate BG1 of the transistor TN2 and the output terminal out, and the output terminal out is held in a high impedance state.

Further, at time of normal operation of the 18th output circuit, the third transistor TN3 performs ON operation based on the power supply line Vcc and the fourth transistor TN4 performs OFF operation in accordance with the output level of the inverter IN2. Thus, a potential equivalent to the output level of the output terminal out is supplied to the backgate BG1 of the first transistor TN1 and the backgate BG3 of the third transistor TN3, and it becomes possible to reduce backgate dependency of the first and the third transistors TN1 and TN3 to the utmost.

With this, it becomes possible to maintain the output terminal out of the 18th output circuit in a high impedance state similarly to the 17th output circuit, and to raise the output "H" level to the utmost at time of normal operation. Thus, when the 18th output circuit is integrated, stabilization of the output level thereof is aimed at similarly to the first to the 17th output circuits, thereby improving the reliability of the semiconductor integrated circuit device.

(19) Description of the 19th embodiment

Figure 23A:
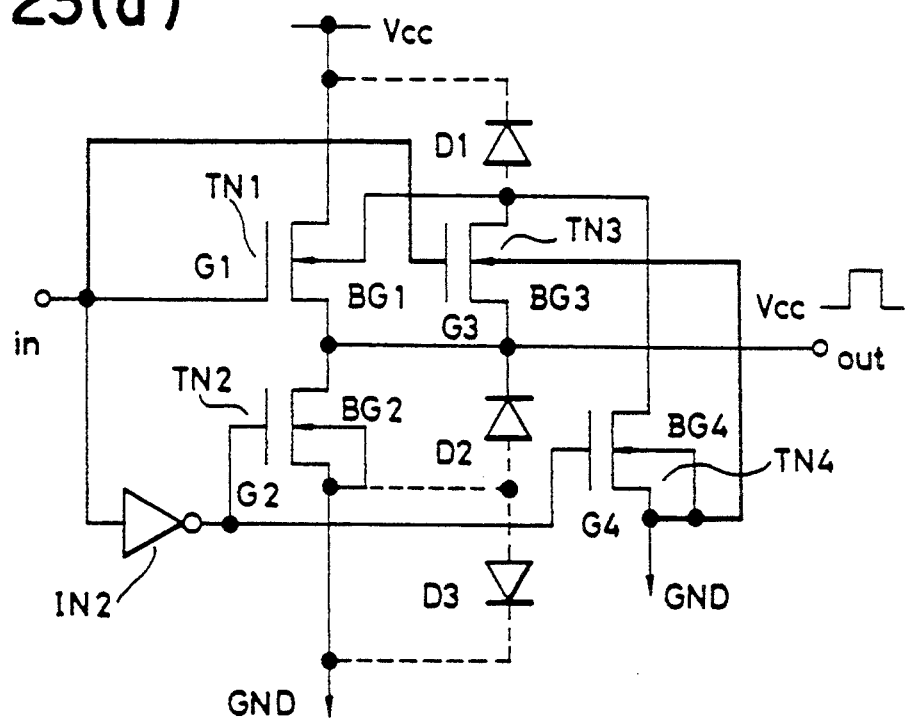
FIGS. 23(a) and 23(b) shows a circuit diagram of an output circuit according to a 19th embodiment of the present invention and an operation explanatory diagram thereof.
Figure 23B:
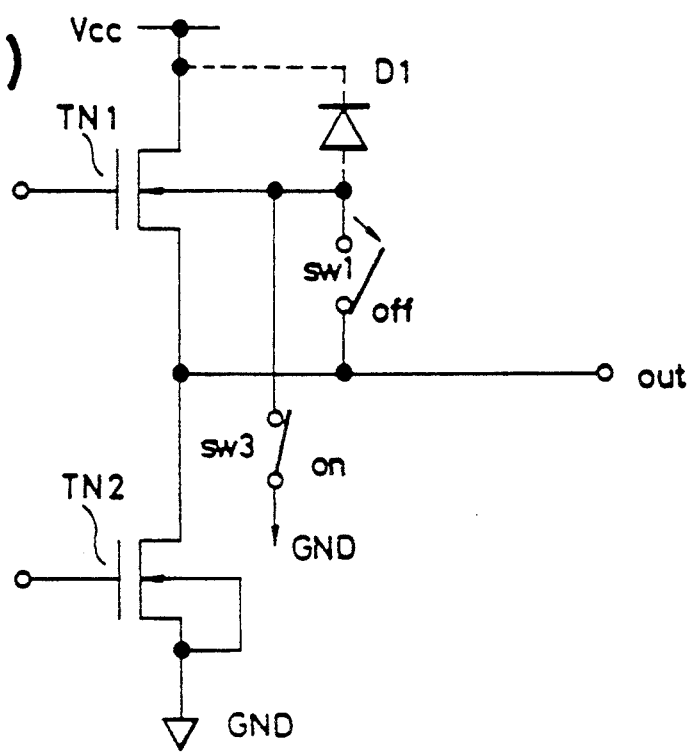

FIGS. 23(a) and 23(b) show a circuit diagram of an output circuit according to the 19th embodiment of the present invention and an operation explanatory diagram thereof, respectively. In FIG. 23(a), what differs from the 17th and the 18th embodiments is that the gate G3 of the third transistor TN3 is connected to the gate G1 of the first transistor TN1 in the 19th embodiment.

Namely, the first, the second, the third and the fourth field effect transistors T1, T2, T3 and T4, respectively, in the principle diagram (2) shown in FIG. 21 are composed of n-type field effect transistors TN1, TN2, TN3 and TN4 (hereinafter referred to simply as the first to the fourth transistors) similarly to the 17th and the 18th embodiments. Further, the third transistor TN3 is connected between the backgate BG1 of the first transistor TN1 and the output terminal out, and the gate G3 of the third transistor TN3 is connected to the gate G1 of the first transistor TN1. Furthermore, the backgate BG3 of the third transistor TN3 is connected to the ground line GND, and the backgate BG2 of the second transistor TN2 is connected to the ground line GND. Besides, the fourth transistor TN4 is connected between the backgate BG1 of the first transistor TN1 and the ground line GND, and the gate G4 of the fourth transistor TN4 is connected to the inverter IN2. Further, the backgate BG4 of the fourth transistor TN4 is connected to the ground line GND. Thus, according to the output circuit related to the 19th embodiment of the present invention, the fourth transistor TN4 is provided between the backgate BG1 of the first transistor TN1 and the ground line GND, the gate G3 of the third transistor TN3 is connected to the gate G1 of the first transistor TN1, and the backgate BG3 of the third transistor TN3 is connected to the ground line GND as shown in FIG. 23(a).

As a result, even if a voltage at a level higher than that of the power supply line Vcc is applied to the output terminal out as shown in FIG. 23(b) at time of suspension of output operation of the 19th output circuit, the third transistor TN3 (=SW1) performs OFF operation and the fourth transistor TN4 (=SW3) performs ON operation. Thus, it becomes possible to bring the backgate BG1 of the transistor TN1 to the level of the ground line GND as in the 17th output circuit without bringing the backgate BG1 of the first transistor TN1 to an electrically floating state as in the third output circuit. With this, it becomes possible to cut off a passage of a current which is going to flow to the power supply line Vcc through the forward diode D1 which is parasitic between the power supply line Vcc and the backgate BG1 of the first transistor TN1. Besides, the influence by the forward diode D3 which is parasitic between the backgate BG2 of the second transistor TN2 and the ground line GND is removed by the forward diode D2 which is parasitic between the backgate BG2 of the transistor TN2 and the output terminal out, and the output terminal out is held in a high impedance state.

Further, at time of normal operation of the 19th output circuit, the third transistor TN3 performs ON operation based on the input level of the gate G1 of the first transistor TN1 and the fourth transistor TN4 performs OFF operation in accordance with the output level of the inverter IN2. Thus, a potential equivalent to the output level of the output terminal out is supplied to the backgate BG1 of the first transistor TN1 and the backgate BG3 of the third transistor TN3, and it becomes possible to reduce backgate dependency of the first and the third transistors TN1 and TN3 to the utmost.

With this, it becomes possible to maintain the output terminal out of the 19th output circuit in a high impedance state similarly to the 17th and the 18th output circuits, and to raise the output "H" level to the utmost at time of normal operation. Thus, when the 19th output circuit is integrated, stabilization of the output level thereof is aimed at similarly to the first to the 18th output circuits, thereby improving the reliability of the semiconductor integrated circuit device.

(20) Description of the 20th embodiment

Figure 24A:
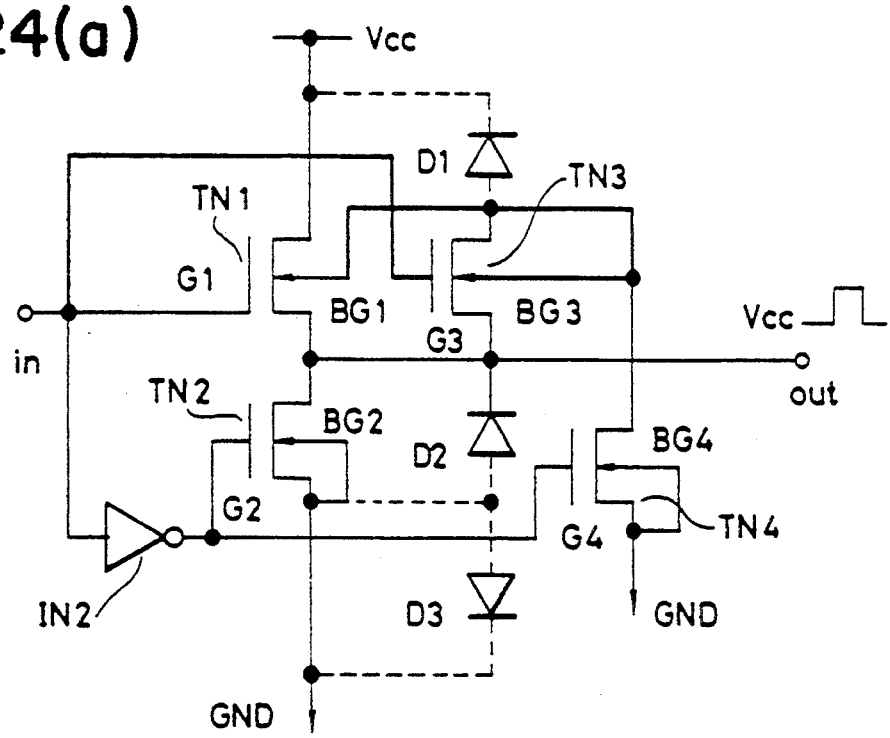
FIGS. 24(a) and 24(b) shows a circuit diagram of an output circuit according to a 20th embodiment of the present invention and an operation explanatory diagram thereof.
Figure 24B:
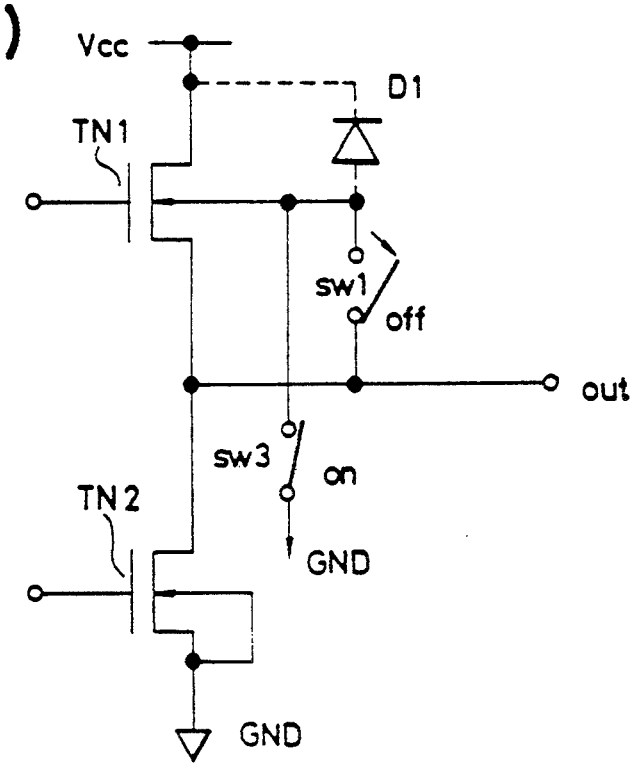

FIGS. 24(a) and 24(b) show a circuit diagram of an output circuit according to the 20th embodiment of the present invention and an operation explanatory diagram thereof, respectively. In FIG. 24(a), what differs from the 17th to the 19th embodiments is that the backgate BG3 of the third transistor TN3 is connected to the backgate BG1 of the first transistor TN1 in the 20th embodiment.

Namely, the first, the second, the third and the fourth field effect transistors T1, T2, T3 and T4 in the principle diagram (2) shown in FIG. 2 are composed of n-type field effect transistors TN1, TN2, TN3 and TN4 (hereinafter referred to simply as the first to the fourth transistors) similarly to the 17th to the 19th embodiments. Further, the third transistor TN3 is connected between the backgate BG1 of the first transistor TN1 and the output terminal out, and the gate G3 of the third transistor TN3 is connected to the gate G1 of the first transistor TN1. Furthermore, the backgate BG3 of the third transistor TN3 is connected to the backgate BG1 of the first transistor TN1, and the backgate BG2 of the second transistor TN2 is connected to the ground line GND. Besides, the fourth transistor TN4 is connected between the backgate BG1 of the first transistor TN1 and the ground line GND, and the gate G4 of the fourth transistor TN4 is connected to the inverter IN2. Further, the backgate BG4 of the fourth transistor TN4 is connected to the ground line GND. Thus, according to the output circuit related to the 20th embodiment of the present invention, the fourth transistor TN4 is provided between the backgate BG1 of the first transistor TN1 and the ground line GND, the gate G3 of the third transistor TN3 is connected to the gate G1 of the first transistor TN1, and the backgate BG3 of the third transistor TN3 is connected to the backgate BG1 of the first transistor TN1 as shown in FIG. 24(a).

As a result, even if a voltage at a level higher than that of the power supply line Vcc is applied to the output terminal out as shown in FIG. 24(b) at time of suspension of output operation of the 20Th output circuit, the third transistor TN3 (=SW1) performs OFF operation and the fourth transistor TN4 (=SW3) performs ON operation. Thus, it becomes possible to bring the backgate BG1 of the transistor TN1 to the level of the ground line GND as in the 17th output circuit without bringing the backgate BG1 of the first transistor TN1 to an electrically floating state as in the fourth output circuit. With this, it becomes possible to cut off a passage of a current which is going to flow to the power supply line Vcc through the forward diode D1 which is parasitic between the power supply line Vcc and the backgate BG1 of the first transistor TN1.

Further, at time of normal operation of the 20th output circuit, the third transistor TN3 performs ON operation based on the input level of the gate G1 of the first transistor TN1 and the fourth transistor TN4 performs OFF operation in accordance with the output level of the inverter IN2. Thus, a potential equivalent to the output level of the output terminal out is supplied to the backgate BG1 of the first transistor TN1 and the backgate BG3 of the third transistor TN3, and it becomes possible to reduce backgate dependency of the first and the third transistors TN1 and TN3 to the utmost.

With this, it becomes possible to maintain the output terminal out of the 20th output circuit in a high impedance state similarly to the 17th to the 19th output circuits, and to raise the output "H" level to the utmost at time of normal operation. Thus, when the 20th output circuit is integrated, stabilization of the output level thereof is aimed at similarly to the first to the 19th output circuits, thereby improving the reliability of the semiconductor integrated circuit device.

(21) Description of the 21st embodiment

Figure 25A:
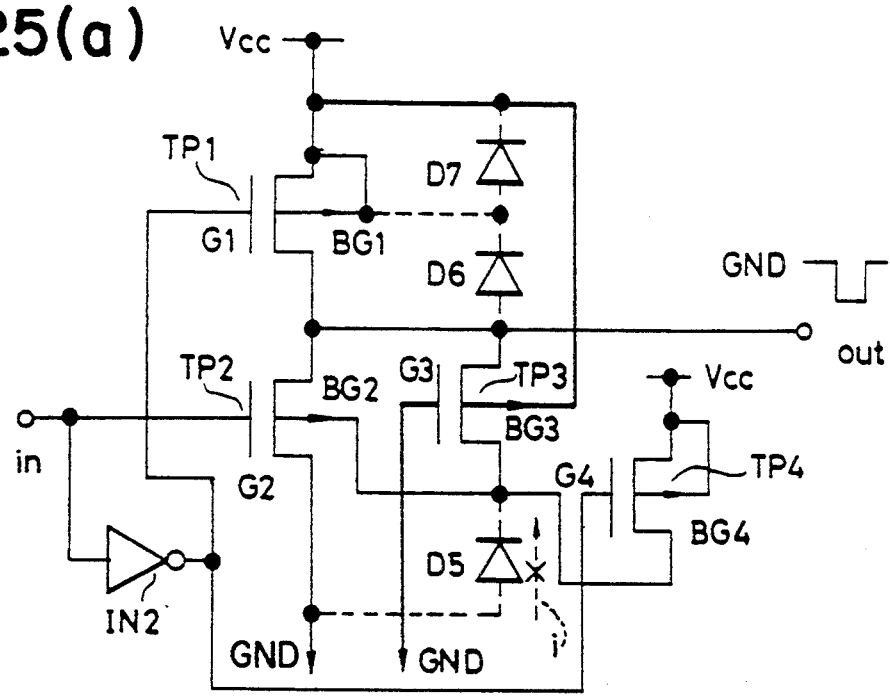
FIGS. 25(a) and 25(b) shows a circuit diagram of an output circuit according to a 21st embodiment of the present invention and an operation explanatory diagram thereof.
Figure 25B:
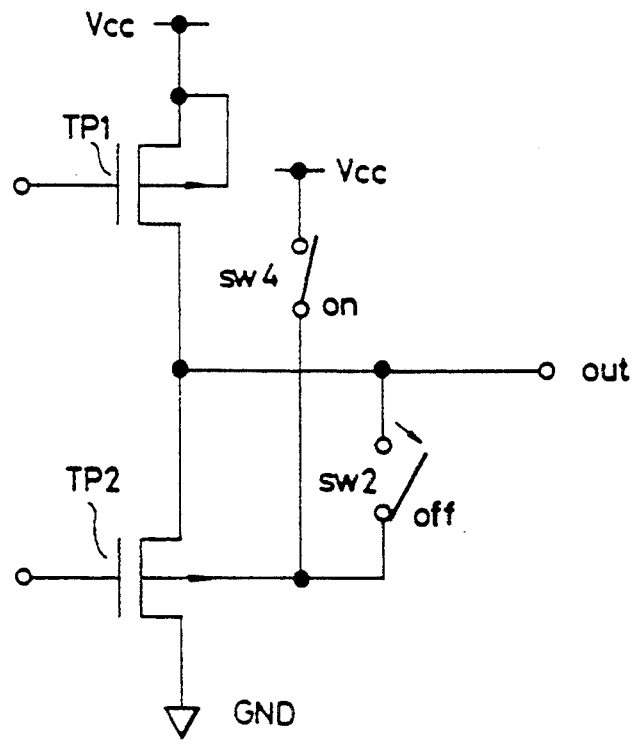

FIGS. 25(a) and 25(b) show a circuit diagram of an output circuit according to the 21st embodiment of the present invention and an operation explanatory diagram thereof, respectively. In FIG. 25(a), what differs from the 17th to the 20th embodiments is that the first to the fourth transistors TN1, TN2, TN3 and TN4 are composed of p-type field effect transistors in the 21st embodiment.

Namely, the first to the fourth field effect transistors in the principle diagram (2) shown in FIG. 2 are composed of p-type field effect transistors TP1, TP2, TP3 and TP4 (hereinafter referred to simply as the first to the fourth transistors). Further, the gate G1 of the first transistor TP1 is connected to the input terminal in, and the gate G2 of the second transistor TP2 is connected to the input terminal in through the inverter IN2. Besides, the backgate BG1 of the first transistor TP1 is connected to the power supply line Vcc. and the third transistor TP3 is connected between the backgate BG2 of the second transistor TP2 and the output terminal out. Further, the gate G3 of the third transistor TP3 is connected to the ground line GND, and the backgate BG3 of the third transistor TP3 is connected to the power supply line Vcc. Furthermore, the fourth transistor TP4 is connected between the backgate BG2 of the second transistor TP2 and the power supply line Vcc, and the gate G4 of the fourth transistor TP4 is connected to the gate G1 of the first transistor TP1. Besides, the backgate BG4 of the fourth transistor TP4 is connected to the power supply line Vcc. Thus, according to the output circuit related to the 21st embodiment of the present invention, the fourth transistor TP4 is provided between the backgate BG2 of the second transistor TP2 and the power supply line Vcc, the gate G3 of the third transistor TP3 is connected to the ground line GND, and the backgate BG3 thereof is connected to the power supply line Vcc as shown in FIG. 25(a). Further, the gate G4 of the fourth transistor TP4 is connected to the gate G1 of the first transistor TP1.

As a result, even if a voltage at a level lower than that of the power supply line GND is applied to the output terminal out as shown in FIG. 25(b) at time of suspension of output operation of the 21st output circuit, the third transistor TP3 (=SW2) performs OFF operation and the fourth transistor TP4 (=SW4) performs ON operation. Thus, it becomes possible to bring the backgate BG2 of the transistor TP2 to the level of the power supply line Vcc without bringing the backgate BG1 of the first transistor TP1 to an electrically floating state as in the fifth output circuit. With this, it becomes possible to cut off a passage of a current i which is going to flow out to the output terminal out from the power supply line GND through a forward diode D5 which is parasitic between the ground line GND and the backgate BG2 of the second transistor TP2. Besides, the output terminal is held in a high impedance state by means of a reverse diode D7 which is parasitic between the backgate BG1 of the first transistor TP1 and the power supply line Vcc and a reverse diode D6 which is parasitic between the backgate BG1 and the output terminal out.

Further, at time of normal operation of the 21st output circuit, the third transistor TP3 performs ON operation based on the potential of the ground line GND and the fourth transistor TP4 performs OFF operation in accordance with the input level of the gate G1 of the first field effect transistor TP1. Thus, a potential equivalent to the output level of the output terminal out is supplied to the backgate BG2 of the second transistor TP2, and it becomes possible to reduce backgate dependency of the second transistor TP2 to the utmost.

With this, it becomes possible to maintain the output terminal out of the 21st output circuit in a high impedance state similarly to the 17th to the 20th embodiments, and to lower the output "L" level to the utmost at time of normal operation. Thus, when the 21st output circuit is integrated, stabilization of the output level is aimed at similarly to the first to the 20th output circuits, thereby improving the reliability of the semiconductor integrated circuit device.

(22) Description of the 22nd embodiment

Figure 26A:
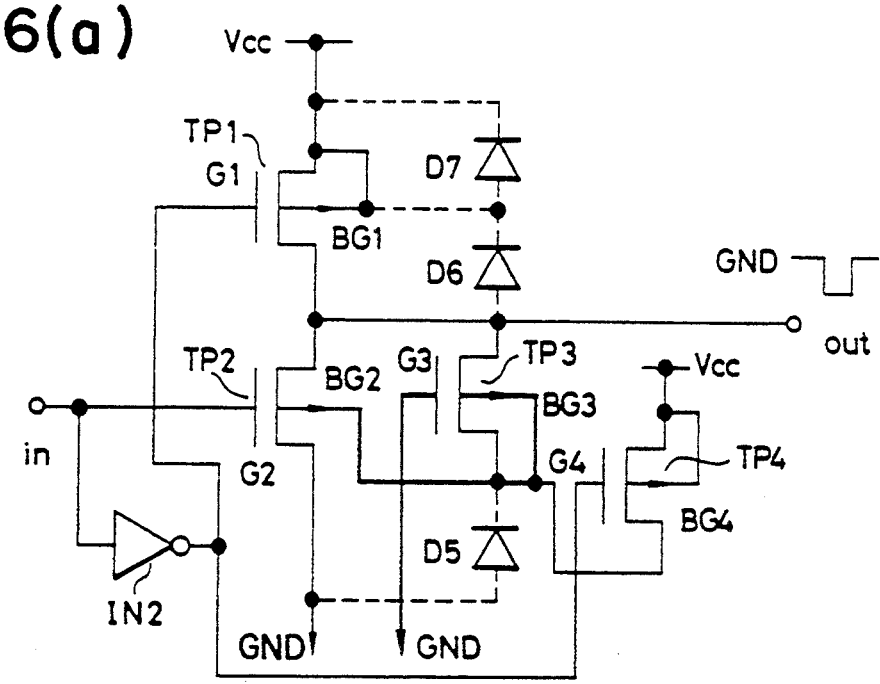
Figure 26A:
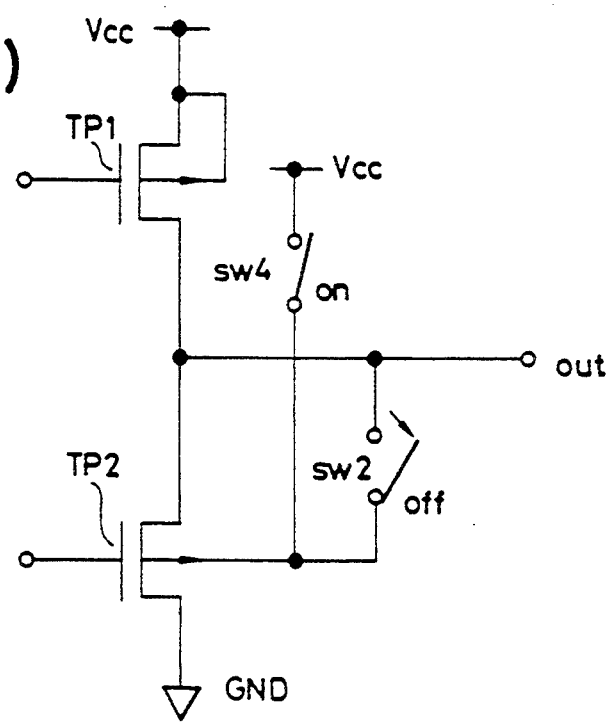

FIGS. 26(a) and 26(b) show a circuit diagram of an output circuit according to the 22nd embodiment of the present invention and an operation explanatory diagram thereof, respectively. In FIG. 26(a), what differs from the 21st embodiment is that the backgate BG3 of the third transistor TP3 is connected to the backgate BG2 of the second transistor TP2 in the 22nd output circuit.

Namely, the first, the second, the third and the fourth field effect transistors T1, T2, T3 and T4 in the principle diagram (2) shown in FIG. 2 are composed of P-type field effect transistors TP1, TP2, TP3 and TP4 (hereinafter referred to simply as the first to the fourth transistors) similarly to the 21st embodiment. Further, the backgate BG1 of the first transistor TP1 is connected to the power supply line Vcc, and the third transistor TP3 is connected between the backgate BG2 of the second transistor TP2 and the output terminal out. Furthermore, the gate G3 of the third transistor TP3 is connected to the ground line GND, and the backgate BG3 of the transistor TP3 is connected to the backgate BG2 of the second transistor TP2. Furthermore, the fourth transistor TP4 is connected between the backgate BG2 of the second transistor TP2 and the power supply line Vcc, and the gate G4 of the fourth transistor TP4 is connected to the gate G1 of the first transistor TP1. Besides, the backgate BG4 of the fourth transistor TP4 is connected to the power supply line Vcc. Thus, according to the output circuit related to the 22nd embodiment of the present invention, the fourth transistor TP4 is provided between the backgate BG2 of the second transistor TP2 and the power supply line Vcc, the gate G3 of the third transistor TP3 is connected to the ground line GND, and the backgate BG3 thereof is connected to the backgate BG2 of the second transistor TP2 as shown in FIG. 26(a). Further, the gate G4 of the fourth transistor TP4 is connected to the gate G1 of the first transistor TP1.

As a result, even if a voltage at a level lower than that of the power supply line GND is applied to the output terminal out as shown in FIG. 26(b) at time of suspension of output operation of the 22nd output circuit, the third transistor TP3 (=SW2) performs OFF operation and the fourth transistor TP4 (=SW4) performs ON operation. Thus, it becomes possible to bring the backgate BG2 of the transistor TP2 to the level of the power supply line Vcc without bringing the backgate BG1 of the first transistor TP1 to an electrically floating state as in the sixth output circuit. With this, it becomes possible to cut off a passage of a current i which is going to flow out to the output terminal out from the power supply line GND through a forward diode D5 which is parasitic between the ground line GND and the backgate BG2 of the second transistor TP2. Besides, the output terminal is held in a high impedance state by means of a reverse diode D7 which is parasitic between the backgate BG1 of the first transistor TP1 and the power supply line Vcc and a reverse diode D6 which is parasitic between the backgate BG1 and the output terminal out.

Further, at time of normal operation of the 22nd output circuit, the third transistor TP3 performs ON operation based on the potential of the ground line GND and the fourth transistor TP4 performs OFF operation in accordance with the input level of the gate G1 of the first transistor TP1. Thus, a potential equivalent to the output level of the output terminal out is supplied to the backgate BG2 of the second transistor TP2 and the backgate BG3 of the third transistor TP3, and it becomes possible to reduce backgate dependency of the second transistor TP2 to the utmost.

With this, it becomes possible to maintain the output terminal out of the 22nd output circuit in a high impedance state similarly to the 17th to the 21st embodiments, and to lower the output "L" level to the utmost at time of normal operation. Thus, when the 22nd output circuit is integrated, stabilization of the output level is aimed at similarly to the first to the 21st output circuits, thereby improving the reliability of the semiconductor integrated circuit device.

(23) Description of the 23rd embodiment

Figure 27A:
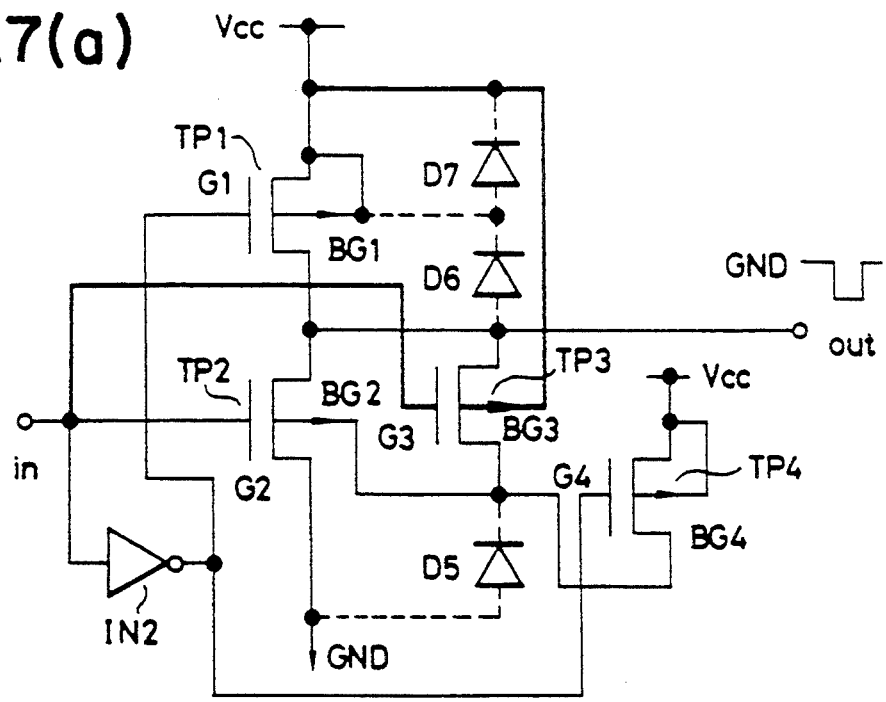
FIGS. 27(a) and 27(b) shows a circuit diagram of an output circuit according to a 23rd embodiment of the present invention and an operation explanatory diagram thereof.
Figure 27B:
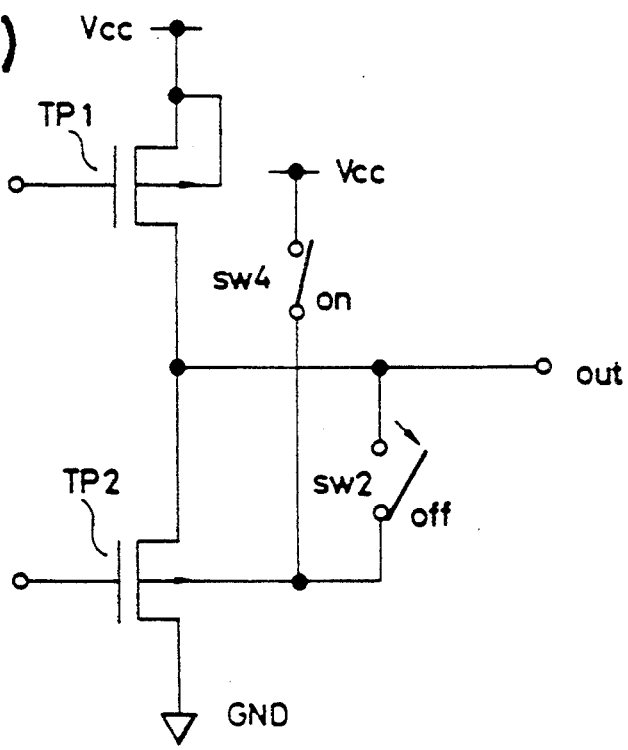

FIGS. 27(a) and 27(b) show a circuit diagram of an output circuit according to the 23rd embodiment of the present invention and an operation explanatory diagram thereof, respectively. In FIG. 27(a), what differs from the 21st and the 22nd embodiments is that the gate G3 of the third transistor TP3 is connected to the gate G2 of the second transistor TP2 in the 22nd output circuit.

Namely, the first to the fourth field effect transistors T1. T2, T3 and T4 in the principle diagram (2) shown in FIG. 2 are composed of P-type field effect transistors TP1, TP2, TP3 and TP4 (hereinafter referred to simply as the first to the fourth transistors) similarly to the 21st and the 22nd embodiments. Further, the backgate BG1 of the first transistor TP1 is connected to the power supply line Vcc, and the third transistor TP3 is connected between the backgate BG2 of the second transistor TP2 and the output terminal out. Furthermore, the gate G3 of the third transistor TP3 is connected to the gate G2 of the third second transistor TP2, and the backgate BG3 of the transistor TP3 is connected to the power supply line Vcc. Furthermore, the fourth transistor TP4 is connected between the backgate BG2 of the second transistor TP2 and the power supply line Vcc, and the gate G4 of the fourth transistor TP4 is connected to the gate G1 of the first transistor TP1. Besides, the backgate BG4 of the fourth transistor TP4 is connected to the power supply line Vcc. Thus, according to the output circuit related to the 23rd embodiment of the present invention, the fourth transistor TP4 is provided between the backgate BG2 of the second transistor TP2 and the power supply line Vcc, the gate G3 of the third transistor TP3 is connected to the gate G2 of the second transistor TP2, and the backgate BG3 thereof is connected to the power supply line Vcc as shown in FIG. 27(a).

As a result, even if a voltage at a level lower than that of the power supply line Vcc is applied to the output terminal out as shown in FIG. 27(b) at time of suspension of output operation of the 23rd output circuit, the third transistor TP3 (=SW2) performs OFF operation and the fourth transistor TP4 (=SW4) performs ON operation. Thus, it becomes possible to bring the backgate BG2 of the transistor TP2 to the level of the power supply line Vcc without bringing the backgate BG1 of the first transistor TP1 to an electrically floating state as in the seventh output circuit. With this, it becomes possible to cut off a passage of a current which is going to flow out to the output terminal out from the ground GND through a forward diode D5 which is parasitic between the power supply line Vcc and the backgate BG2 of the second transistor TP2.

Further, at time of normal operation of the 23rd output circuit, the third transistor TP3 performs ON operation based on the potential of the ground line GND and the fourth transistor TP4 performs ON operation in accordance with the input level of the gate G1 of the first transistor TP1. Thus, a potential equivalent to the output level of the output terminal out is supplied to the backgate BG2 of the second transistor TP2, and it becomes possible to reduce backgate dependency of the second transistor TP2 to the utmost.

With this, it becomes possible to maintain the output terminal out of the 23rd output circuit in a high impedance state similarly to the 17th to the 22nd embodiments, and to lower the output "L" level to the utmost at time of normal operation. Thus, when the 23rd output circuit is integrated, stabilization of the output level is aimed at similarly to the first to the 22nd output circuits, thereby improving the reliability of the semiconductor integrated circuit device.

(24) Description of the 24th embodiment

Figure 28A:
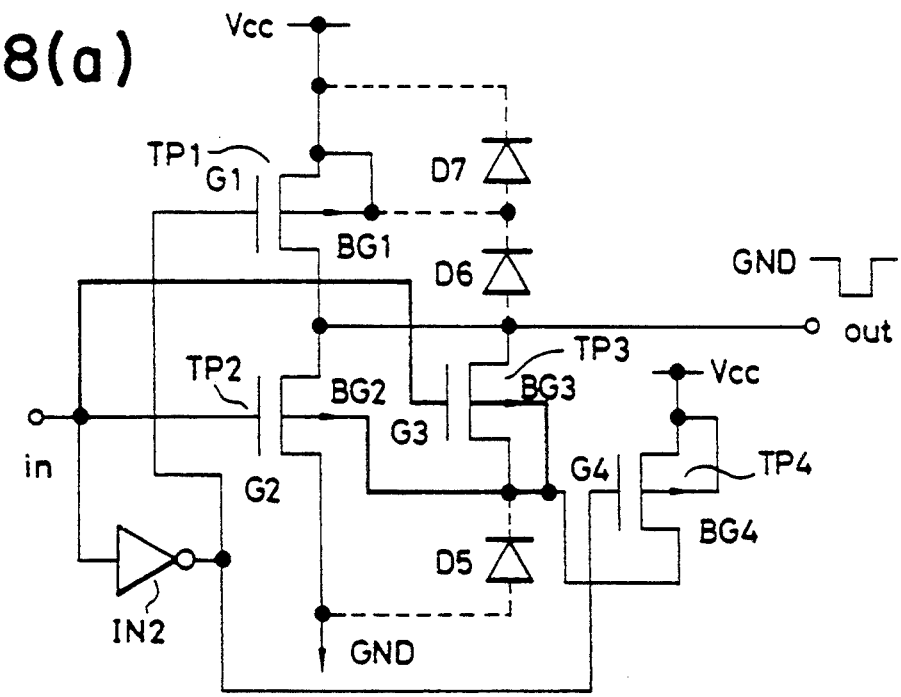
FIGS. 28(a) and 28(b) shows a circuit diagram of an output circuit according to a 24th embodiment of the present invention and an operation explanatory diagram thereof.
Figure 28B:
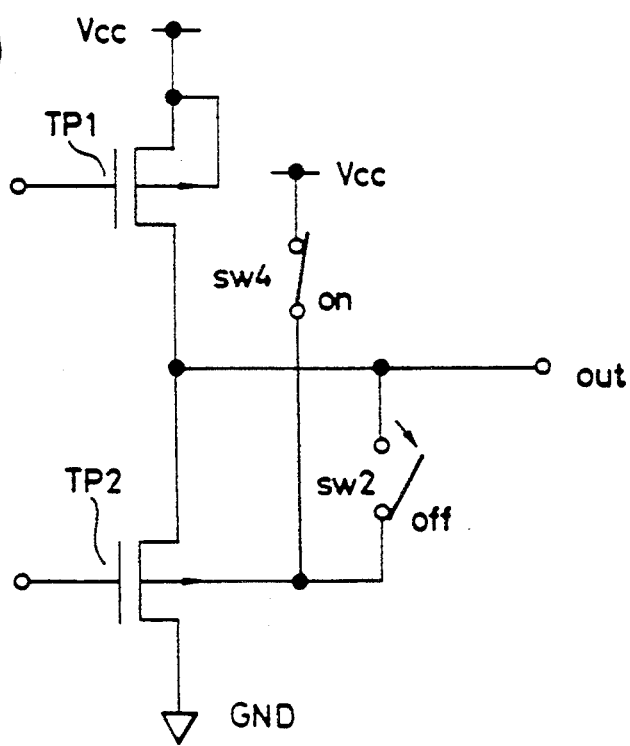

FIGS. 28(a) and 28(b) show a circuit diagram of an output circuit according to the 24th embodiment of the present invention and an operation explanatory diagram thereof, respectively. In FIG. 28(a), what differs from the 17th to the 23rd embodiments is that the backgate BG3 of the third transistor TP3 is connected to the backgate BG2 of the second transistor TP2 and the gate G3 thereof is connected to the gate G2 of the second transistor TP2 in the 22nd output circuit.

Namely, the first, the second, the third and the fourth field effect transistors T1, T2, T3 and T4 in the principle diagram (2) shown in FIG. 2 are composed of P-type field effect transistors TP1, TP2, TP3 and TP4 (hereinafter referred to simply as the first to the fourth transistors) similarly to the 21st to the 23rd embodiments. Further, the backgate BG1 of the first transistor TP1 is connected to the power supply line Vcc, and the third transistor TP3 is connected between the backgate BG2 of the second transistor TP2 and the output terminal out. Furthermore, the gate G3 of the third transistor TP3 is connected to the gate G2 of the second transistor TP2, and the backgate BG3 of the transistor TP3 is connected to the backgate BG2 of the second transistor TP2.

Furthermore, the fourth transistor TP4 is connected between the backgate BG2 of the second transistor TP2 and the power supply line Vcc, and the gate G4 of the fourth transistor TP4 is connected to the gate G1 of the first transistor TP1. Besides, the backgate BG4 of the fourth transistor TP4 is connected to the power supply line Vcc. Thus, according to the output circuit related to the 24th embodiment of the present invention, the fourth transistor TP4 is provided between the backgate BG2 of the second transistor TP2 and the power supply line Vcc, the gate G3 of the third transistor TP3 is connected to the gate G2 of the second transistor TP2, and the backgate BG3 thereof is connected to the backgate BG2 of the second transistor TP2 as shown in FIG. 28(a). Further, the gate G4 of the fourth transistor TP4 is connected to the gate G1 of the first transistor TP1.

As a result, even if a voltage at a level lower than that of the power supply line Vcc is applied to the output terminal out as shown in FIG. 28(b) at time of suspension of output operation of the 24th output circuit, the third transistor TP3 (=SW2) performs OFF operation and the fourth transistor TP4 (=SW4) performs ON operation. Thus, it becomes possible to bring the backgate BG2 of the transistor TP2 to the level of the power supply line Vcc without bringing the backgate BG1 of the first transistor TP1 to an electrically floating state in the eighth output circuit. With this, it becomes possible to cut off a passage of a current which is going to flow out to the output terminal out from the ground line GND through a forward diode D5 which is parasitic between the power supply line Vcc and the backgate BG2 of the second transistor TP2. Besides, the output terminal is held in a high impedance state by means of a reverse diode D7 which is parasitic between the backgate BG1 of the first transistor TP1 and the power supply line Vcc and a reverse diode D6 which is parasitic between the backgate BG1 and the output terminal out.

Further, at time of normal operation of the 24th output circuit, the third transistor TP3 performs ON operation based on the potential of the ground line GND and the fourth transistor TP4 performs ON operation in accordance with the input level of the gate G1 of the first transistor TP1. Thus, a potential equivalent to the output level of the output terminal out is supplied to the backgate BG2 of the second transistor TP2 and the backgate BG3 of the third transistor TP3, and it becomes possible to reduce backgate dependency of the second transistor TP2 to the utmost.

With this, it becomes possible to maintain the output terminal out of the 24th output circuit in a high impedance state similarly to the 17th to the 23rd embodiments, and to lower the output "L" level to the utmost at time of normal operation. Thus, when the 24th output circuit is integrated, stabilization of the output level is aimed at similarly to the first to the 23rd output circuits, thereby improving the reliability of the semiconductor integrated circuit device.

(25) Description of the 25th embodiment

Figure 29A:
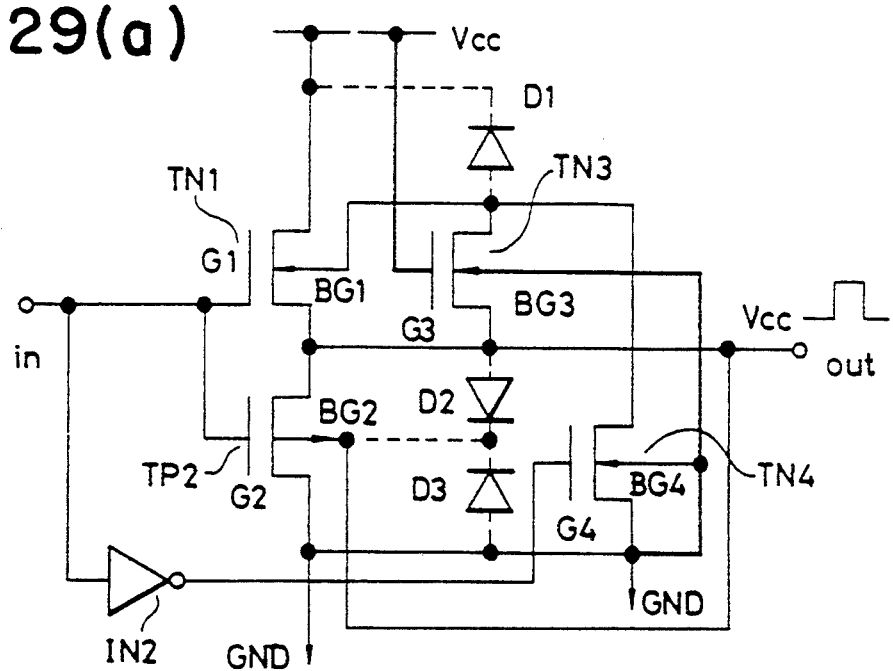
FIGS. 29(a) and 29(b) shows a circuit diagram of an output circuit according to a 25th embodiment of the present invention and an operation explanatory diagram thereof.
Figure 29B:
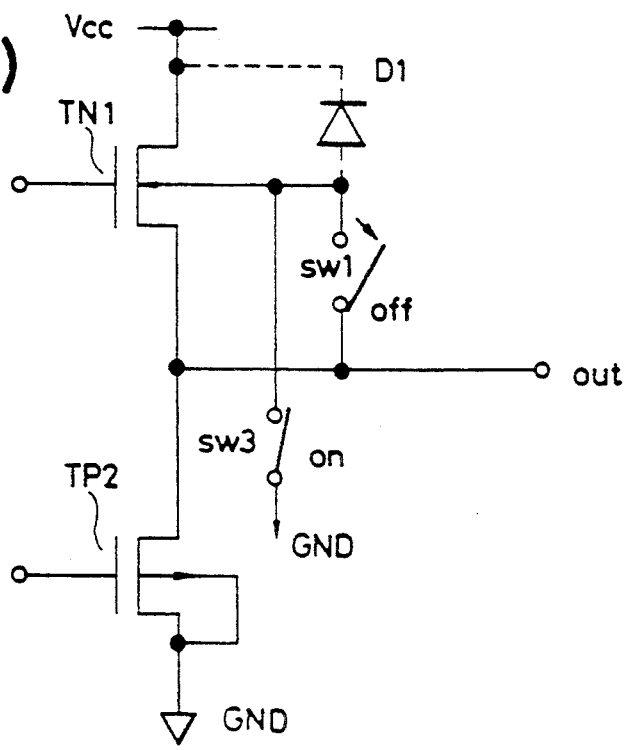

FIGS. 29(a) and 29(b) show a circuit diagram of an output circuit according to the 25th embodiment of the present invention and an operation explanatory diagram thereof, respectively. In FIG. 29(a), what differs from the 17th to the 24th embodiments is that the second transistor TP2 is composed of a p-type field effect transistor while first, third and fourth transistors TN1, TN3 and TN4 are composed of N-type field effect transistors, respectively.

Namely, the first, the third and the fourth field effect transistors T1, T3 and T4 in the principle diagram (2) shown in FIG. 2 are composed of n-type field effect transistors TN1, TN3 and TN4 (hereinafter referred to simply as the first, the third and the fourth transistors) similarly to the 17th to the 24th embodiments, and the second field effect transistor T2 is composed of a p-type field effect transistor TP2 (hereinafter referred to simply as the second transistor) similarly to the 5th embodiment. Further, the third transistor TN3 is connected between the backgate BG1 of the first transistor TN1 and the output terminal out, and the gate G3 of the third transistor TN3 is connected to the power supply line (high potential side) Vcc. Furthermore, the backgate BG3 of the third transistor TN3 is connected to the ground line (low potential side) GND, and the backgate BG2 of the second transistor TP2 is connected to the output terminal out. Besides, the fourth transistor TN4 is connected between the backgate BG1 of the first transistor TN1 and the ground line GND, and the gate G4 of the transistor TN4 is connected to the inverter IN2. Further, the backgate BG4 of the fourth transistor TN4 is connected to the ground line GND. Thus, according to the output circuit related to the 25th embodiment of the present invention, the fourth transistor TN4 is provided between the backgate BG1 of the first transistor TN1 and the ground line GND, the gate G3 of the third transistor TN3 is connected to the power supply line Vcc, and the backgate BG3 of the third transistor TN3 is connected to the ground line GND as shown in FIG. 29(a).

As a result, even if a voltage at a level higher than that of the power supply line Vcc is applied to the output terminal out as shown in FIG. 29(b) for instance at time of suspension of output operation of the 25th output circuit, the third transistor TN3 (=SW1) performs OFF operation and the fourth transistor TN4 (=SW3) performs ON operation. Thus, it becomes possible to bring the backgate BG1 of the first transistor TN1 to the level of the ground line GND as in the 17th to the 24th output circuits without bringing the backgate BG1 of the first transistor TN1 to an electrically floating state as in the ninth output circuit. With this, it becomes possible to cut off a passage of a current which is going to flow to the power supply line Vcc through a forward diode D1 which is parasitic between the power supply line Vcc and the backgate BG1 of the first transistor TN1. Besides, since the backgate BG2 of the second transistor TP2 is connected to the output terminal out, the influence by the forward diode D2 which is parasitic between the backgate BG2 of the second transistor TP2 and the output terminal out is removed by the reverse diode D3 which is parasitic between the backgate BG2 of the second transistor TP2 and the ground line GND, and the output terminal out is held in a high impedance state.

Further, at time of normal operation of the 25th output circuit, the third transistor TN3 (=SW1) performs ON operation based on the supply from the power supply line Vcc and the fourth transistor TN4 (=SW3) performs OFF operation in accordance with the output level of the inverter IN2. Thus, a potential equivalent to the output level of the output terminal out is supplied to the backgate BG1 of the first transistor TN1 and the backgate BG3 of the third transistor TN3, and it becomes possible to reduce backgate dependency thereof to the utmost.

With this, it becomes possible to maintain the output terminal out of the 25th output circuit in a high impedance state similarly to the 17th to 24th output circuits, and to raise the output "H" level to the utmost at time of normal operation. Thus, when the 25th output circuit is integrated, stabilization of the output level is aimed at similarly to the first to the 24th output circuits, thereby improving reliability of the semiconductor integrated circuit device.

(26) Description of the 26th embodiment

Figure 30A:
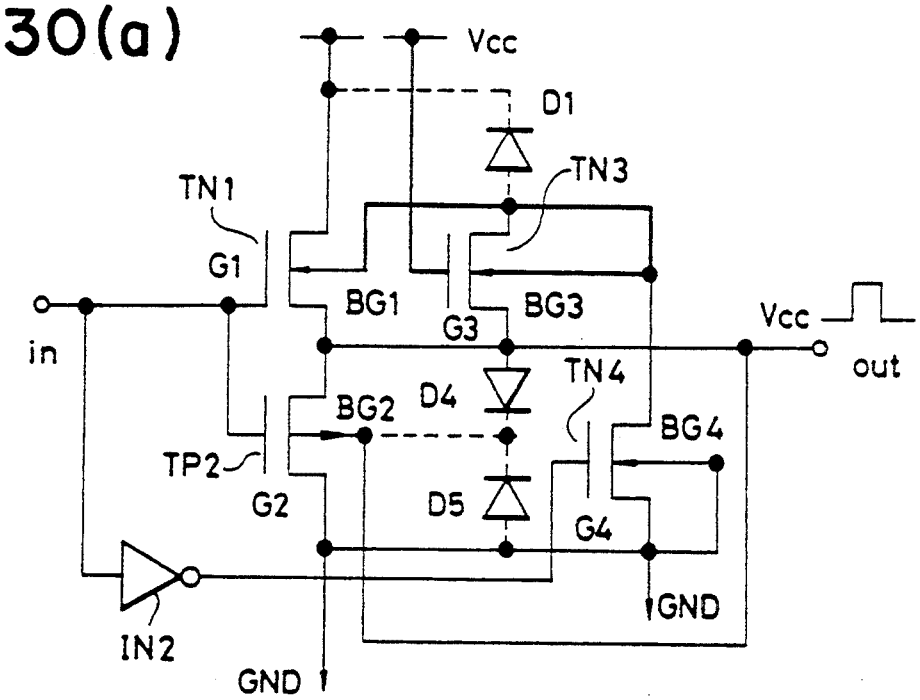
FIGS. 30(a) and 30(b) shows a circuit diagram of an output circuit according to a 26th embodiment of the present invention and an operation explanatory diagram thereof.
Figure 30B:
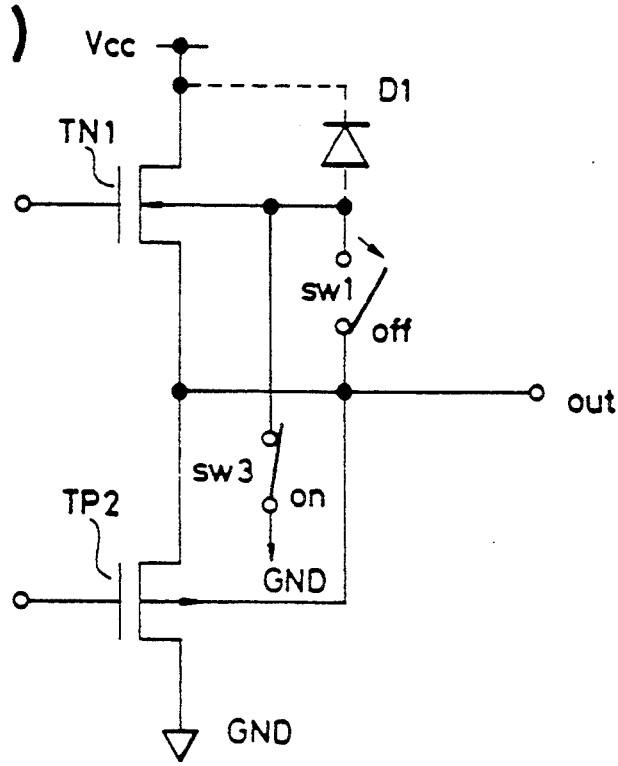

FIGS. 30(a) and 30(b) show a circuit diagram of an output circuit according to the 26th embodiment of the present invention and an operation explanatory diagram thereof, respectively. In FIG. 30(a), what differs from the 17th to the 25th embodiments is that the backgate BG3 of the third transistor TN3 is connected to the backgate BG1 of the first transistor TN1 in the 26th embodiment.

Namely, the first, the third and the fourth field effect transistors T1, T3 and T4 in the principle diagram (2) shown in FIG. 2 are composed of n-type field effect transistors TN1, TN3 and TN4 (hereinafter referred to simply as the first, the third and the fourth transistors) similarly to the 25th embodiment, and the second field effect transistor T2 is composed of a p-type field effect transistor TP2 (hereinafter referred to simply as the second transistor). Further, the third transistor TN3 is connected between the backgate BG1 of the first transistor TN1 and the output terminal out, and the gate G3 of the third transistor TN3 is connected to the power supply line Vcc. Furthermore, the backgate BG3 of the third transistor TN3 is connected to the backgate BG1 of the first transistor TN1, and the backgate BG2 of the second transistor TP2 is connected to the output terminal out. Besides, the fourth transistor TN4 is connected between the backgate BG1 of the first transistor TN1 and the ground line GND, and the gate G4 of the transistor TN4 is connected to the inverter IN2. Further, the backgate BG4 of the fourth transistor TN4 is connected to the ground line GND. Thus, according to the output circuit related to the 26th embodiment of the present invention, the fourth transistor TN4 is provided between the backgate BG1 of the first transistor TN1 and the ground line GND, the gate G8 of the third transistor TN3 is connected to the power supply line Vcc, and the backgate BG3 of the third transistor TN3 is connected to the backgate BG1 of the first transistor TN1 as shown in FIG. 30(a).

As a result, even if a voltage at a level higher than that of the power supply line Vcc is applied to the output terminal out as shown in FIG. 30(b), for instance, at time of suspension of output operation of the 26th output circuit, the third transistor TN3 (=SW1) performs OFF operation and the fourth transistor TN4 (=SW3) performs ON operation. Thus, it becomes possible to bring the backgate BG1 of the first transistor TN1 to the level of the ground line GND as in the 17th to the 25th output circuits without bringing the backgate BG1 of the first transistor TN1 to an electrically floating state as in the tenth output circuit. With this, it becomes possible to cut off a passage of a current which is going to flow to the power supply line Vcc through a forward diode D1 which is parasitic between the power supply line Vcc and the backgate BG1 of the first transistor TN1. Besides, since the backgate BG2 of the second transistor TP2 is connected to the output terminal out, the influence by the forward diode D4 which is parasitic between the backgate BG2 of the second transistor TP2 and the output terminal out is removed by the reverse diode D5 which is parasitic between the backgate BG2 of the second transistor TP2 and the ground line GND, and the output terminal out is held in a high impedance state.

Further, at time of normal operation of the 25th output circuit, the third transistor TN3 (=SW1) performs ON operation based on the supply from the power supply line Vcc and the fourth transistor TN4 (=SW3) performs OFF operation in accordance with the output level of the inverter IN2. Thus, a potential equivalent to the output level of the output terminal out is supplied to the backgate BG1 of the first transistor TN1 and the backgate BG3 of the third transistor TN3, and it becomes possible to reduce backgate dependency thereof to the utmost.

With this, it becomes possible to maintain the output terminal out of the 26th output circuit in a high impedance state similarly to the 17th to the 25th output circuits, and to raise the output "H" level to the utmost at time of normal operation. Thus, when the 26th output circuit is integrated, stabilization of the output level is aimed at similarly to the first to the 25th output circuits, thereby improving the reliability of the semiconductor integrated circuit device.

(27) Description of the 27th embodiment

Figure 31A:
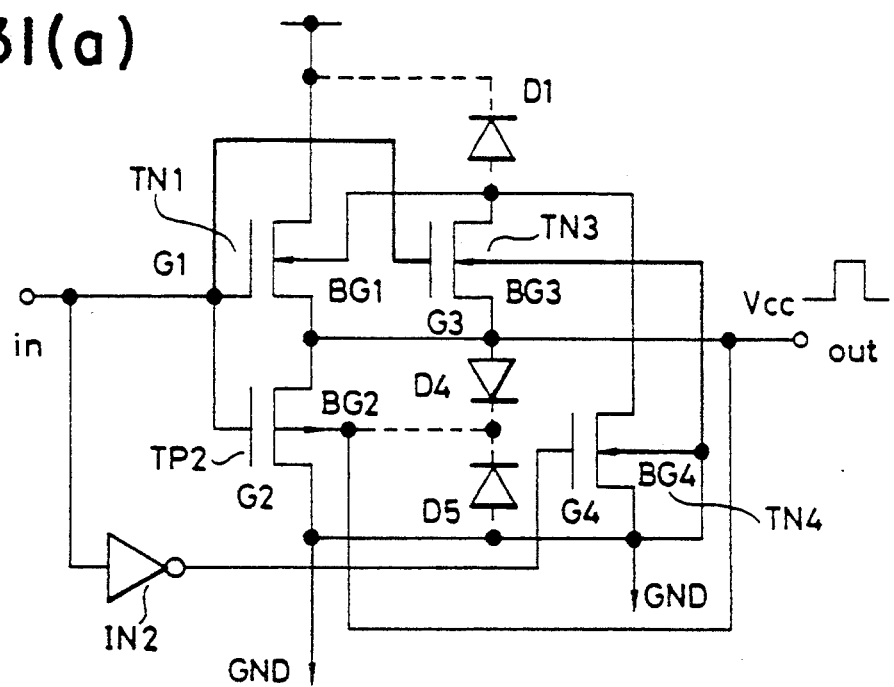
FIGS. 31(a) and 31(b) shows a circuit diagram of an output circuit according to a 27th embodiment of the present invention and an operation explanatory diagram thereof.
Figure 31B:
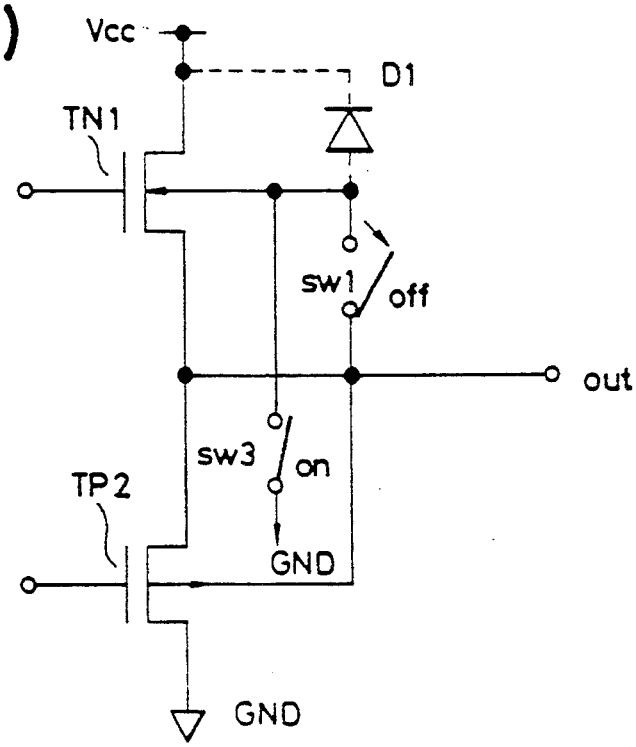

FIGS. 31(a) and 31(b) show a circuit diagram of an output circuit according to the 27th embodiment of the present invention and an operation explanatory diagram thereof, respectively. In FIG. 31(a), what differs from the 17th to the 26th embodiments is that the gate G3 of the third transistor TN3 is connected to the gate G1 of the first transistor TN1 and the backgate BG3 thereof is connected to the ground line GND in the 27th embodiment.

Namely, the first, the third and the fourth field effect transistors T1. T3 and T4 in the principle diagram (2) shown in FIG. 2 are composed of n-type field effect transistors TN1, TN3 and TN4 (hereinafter referred to simply as the first, the third and the fourth transistors) similarly to the 25th and the 26th embodiments, and the second field effect transistor T2 is composed of a p-type field effect transistor TP2 (hereinafter referred to simply as the second transistor). Further, the third transistor TN3 is connected between the backgate BG1 of the first transistor TN1 and the output terminal out, and the gate G3 of the third transistor TN3 is connected to the gate G1 of the first transistor TN1. Furthermore, the backgate BG3 of the third transistor TN3 is connected to the ground line GND, and the backgate BG2 of the second transistor TP2 is connected to the output terminal out. Besides, the fourth transistor TN4 is connected between the backgate BG1 of the first transistor TN1 and the ground line GND, and the gate G4 of the transistor TN4 is connected to the inverter IN2. Further, the backgate BG4 of the fourth transistor TN4 is connected to the ground line GND. Thus, according to the output circuit related to the 27th embodiment of the present invention, the fourth transistor TN4 is provided between the backgate BG1 of the first transistor TN1 and the ground line GND, the gate G3 of the third transistor TN3 is connected to the gate G1 of the first transistor TN1, and the backgate BG3 of the third transistor TN3 is connected to the ground line GND as shown in FIG. 31(a).

As a result, even if a voltage at a level higher than that of the power supply line Vcc is applied to the output terminal out as shown in FIG. 31(b), for instance, at time of suspension of output operation of the 27th output circuit, the third transistor TN3 (=SWl) performs OFF operation and the fourth transistor TN4 (=SW3) performs ON operation. Thus, it becomes possible to bring the backgate BG1 of the first transistor TN1 to the level of the ground line GND as in the 17th output circuit without bringing the backgate BG1 of the first transistor TN1 to an electrically floating state as in the 11th output circuit. With this, it becomes possible to cut off a passage of a current which is going to flow to the power supply line Vcc through a forward diode D1 which is parasitic between the power supply line Vcc and the backgate BG1 of the first transistor TN1. Besides, since the backgate BG2 of the second transistor TP2 is connected to the output terminal out, the influence by the forward diode D4 which is parasitic between the backgate BG2 of the second transistor TP2 and the output terminal out is removed by the reverse diode D5 which is parasitic between the backgate BG2 of the second transistor TP2 and the ground line GND, and the output terminal out is held in a high impedance state.

Further, at time of normal operation of the 27th output circuit, the third transistor TN3 performs ON operation based on the input level of the gate G1 of the first transistor TN1 and the fourth transistor TN4 performs ON operation in accordance with the output level of the inverter IN2. Thus, a potential equivalent to the output level of the output terminal out is supplied to the backgate BG1 of the first transistor TN1 and the backgate BG3 of the third transistor TN3, and it becomes possible to reduce backgate dependency thereof to the utmost.

With this, it becomes possible to maintain the output terminal out of the 27th output circuit in a high impedance state similarly to the 17th to the 26th output circuits, and to raise the output "H" level to the utmost at time of normal operation. Thus, when the 27th output circuit is integrated, stabilization of the output level is aimed at similarly to the first to the 26th output circuits, thereby enabling to aim at improvement of reliability of the semiconductor integrated circuit device.

(28) Description of the 28th embodiment

Figure 32A:
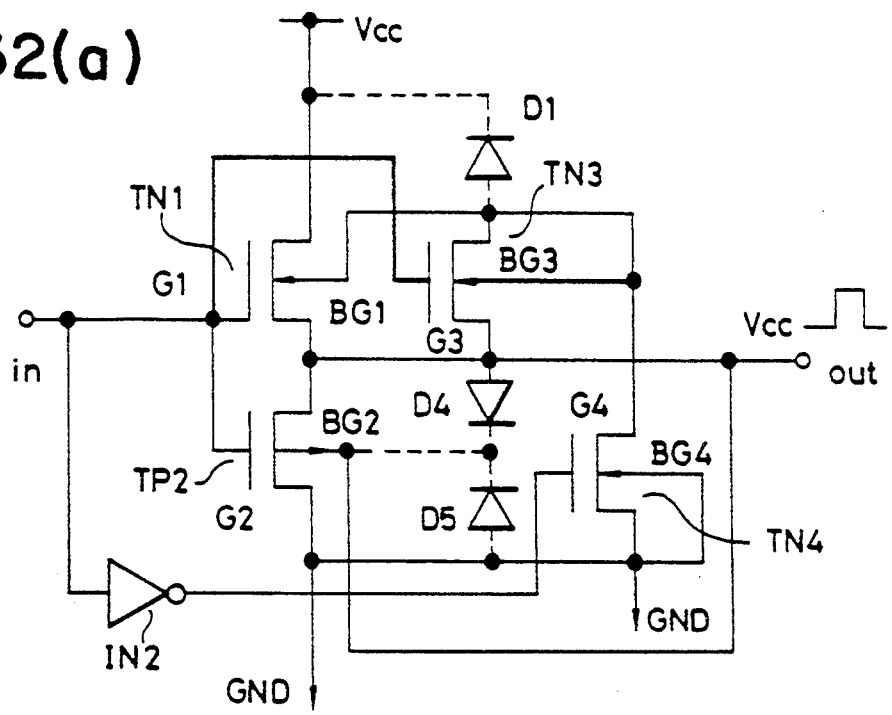
FIGS. 32(a) and 32(b) shows a circuit diagram of an output circuit according to a 28th embodiment of the present invention and an operation explanatory diagram thereof.
Figure 32B:
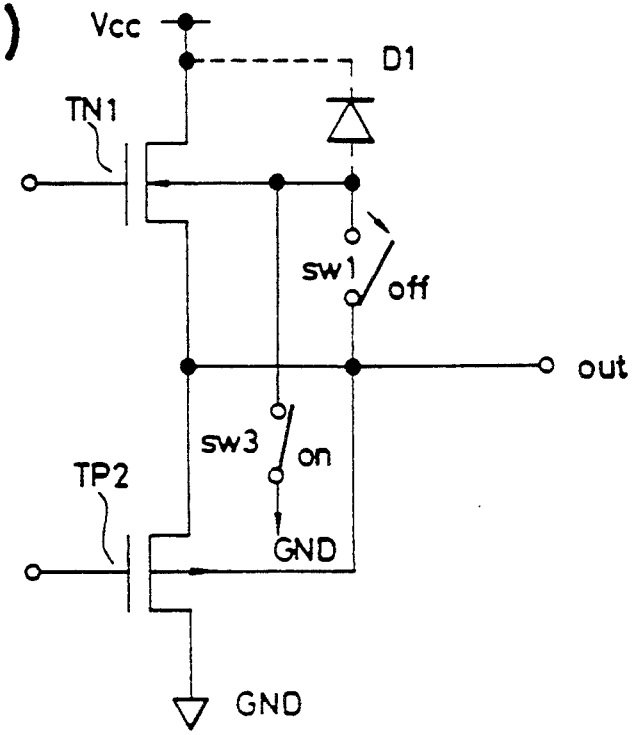

FIGS. 32(a) and 32(b) show a circuit diagram of an output circuit according to the 28th embodiment of the present invention and an operation explanatory diagram thereof, respectively. In FIG. 32(a), what differs from the 17th to the 27th embodiments is that the backgate BG3 of the third transistor TN3 is connected to the backgate BG1 of the first transistor TN1 and the gate G3 thereof is connected to the gate G1 of the first transistor TN1 in the 28th embodiment.

Namely, the first, the third and the fourth field effect transistors T1, T3 and T4 in the principle diagram (2) shown In FIG. 2 are composed of n-type field effect transistors TN1, TN3 and TN4 (hereinafter referred to simply as the first, the third and the fourth transistors) similarly to the 25th to the 27th embodiments, and the second field effect transistor T2 is composed of a p-type field effect transistor TP2 (hereinafter referred to simply as the second transistor). Further, the third transistor TN3 is connected between the backgate BG1 of the first transistor TN1 and the output terminal out, and the gate G3 of the third transistor TN3 is connected to the gate G1 of the first transistor TN1. Furthermore, the backgate BG3 of the third transistor TN3 is connected to the backgate BG1 of the first transistor TN1, and the backgate BG2 of the second transistor TP2 is connected to the output terminal out. Besides, the fourth transistor TN4 is connected between the backgate BG1 of the first transistor TN1 and the ground line GND, and the gate G4 of the transistor TN4 is connected to the inverter IN2. Further, the backgate BG4 of the fourth transistor TN4 is connected to the ground line GND. Thus, according to the output circuit related to the 28th embodiment of the present invention, the fourth transistor TN4 is provided between the backgate BG1 of the first transistor TN1 and the ground line GND, the gate G3 of the third transistor TN3 is connected to the gate G1 of the first transistor TN1, and the backgate BG3 of the third transistor TN3 is connected to the backgate BG1 of the first transistor TN1 as shown In FIG. 32(a).

As a result, even if a voltage at a level higher than that of the power supply line Vcc is applied to the output terminal out as shown in FIG. 32(b) for instance at time of suspension of output operation of the 28th output circuit, the third transistor TN3 (=SW1) performs OFF operation and the fourth transistor TN4 (=SW3) performs ON operation. Thus, it becomes possible to bring the backgate BG1 of the first transistor TN1 to the level of the ground line GND as In the 17th output circuit without bringing the backgate BG1 of the first transistor TN1 to an electrically floating state as in the 12th output circuit. With this, it becomes possible to cut off a passage of a current which is going to flow to the power supply line Vcc through a forward diode D1 which is parasitic between the power supply line Vcc and the backgate BG1 of the first field effect transistor TN1. Besides, since the backgate BG2 of the second transistor TP2 is connected to the output terminal out, the influence by the forward diode D4 which is parasitic between the backgate BG2 of the second transistor TP2 and the output terminal out is removed by the reverse diode D5 which is parasitic between the backgate BG2 of the second transistor TP2 and the ground line GND, and the output terminal out is held in a high impedance state.

Further, at time of normal operation of the 28th output circuit, the third transistor TN3 performs ON operation based on the input level of the gate G1 of the first transistor TN1 and the fourth transistor TN4 performs OFF operation in accordance with the output level of the inverter IN2. Thus, a potential equivalent to the output level or the output terminal out is supplied to the backgate BG1 of the first transistor TN1 and the backgate BG3 of the third transistor TN3, and it becomes possible to reduce backgate dependency thereof to the utmost.

With this, it becomes possible to maintain the output terminal out of the 28th output circuit in a high impedance state similarly to the 17th to the 27th output circuits, and to raise the output "H" level to the utmost at time of normal operation. Thus, when the 28th output circuit is integrated, stabilization of the output level is aimed at similarly to the first to the 27th output circuits, thereby improving the reliability of the semiconductor integrated circuit device.

(29) Description of the 29th embodiment

Figure 33A:
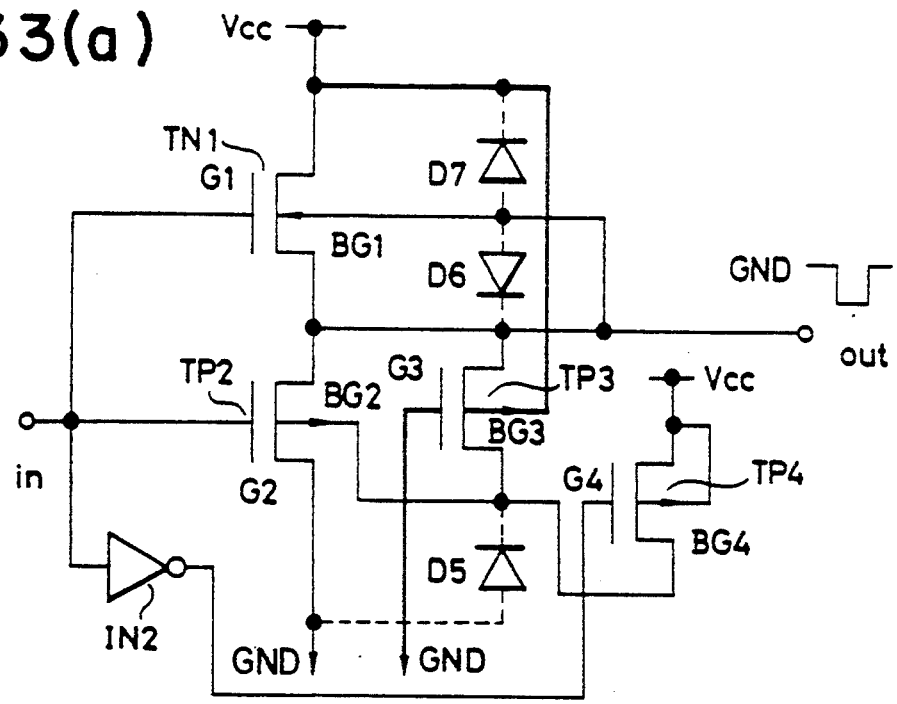
FIGS. 33(a) and 33(b) shows a circuit diagram of an output circuit according to a 29th embodiment of the present invention and an operation explanatory diagram thereof.
Figure 33B:
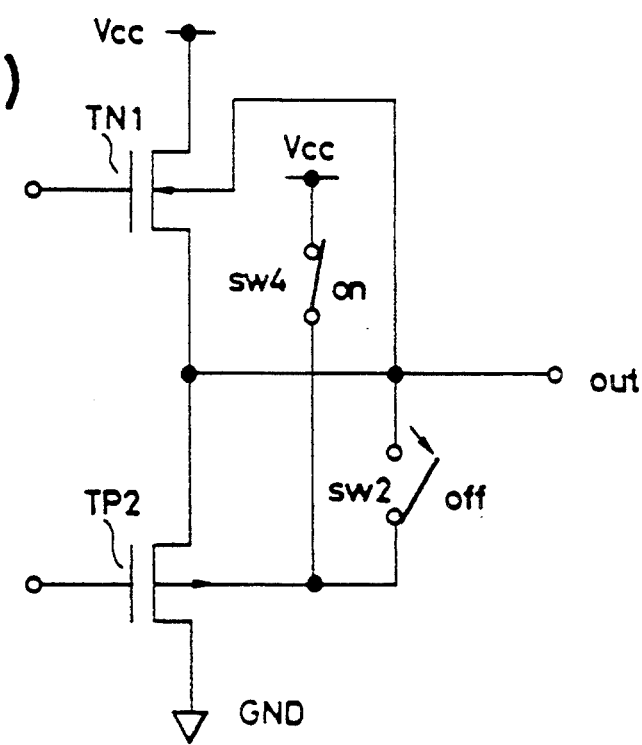

FIGS. 33(a) and 33(b) show a circuit diagram of an output circuit according to the 29th embodiment of the present invention and an operation explanatory diagram thereof, respectively. In FIG. 33(a), what differs from the 17th to the 28th embodiments is that the first transistor the second, third and fourth transistors are p-type field effect transistors, respectively, TN1 is replaced with an n-type field effect transistor, and the gates G1 and G2 of the first and the second transistors TN1 and TP2 are made common to each other so as to constitute a CMOS circuit in the 29th embodiment.

Namely, the first field effect transistor T1 in the principle diagram (2) shown in FIG. 2 is composed of an n-type field effect transistor TN1 (hereinafter referred to simply as the first transistor), and the second, the third and the fourth field effect transistors T2, T3 and T4 are composed of p-type field effect transistors TP2, TP3 and TP4 (hereinafter referred to simply as the second to the fourth transistors). Further, the backgate BG1 of the first transistor TN1 is connected to the output terminal out, and the third transistor TP3 is connected between the backgate BG2 of the second transistor TP2 and the output terminal out. Furthermore, the gate G3 of the third transistor TP3 is connected to the ground line GND, and the backgate BG3 of the third transistor TP3 is connected to the power supply line Vcc. Besides, the fourth transistor TP4 is connected between the backgate BG2 of the second transistor TP2 and the power supply line Vcc, and the gate G4 of the fourth transistor TP4 is connected to the inverter IN2. Further, the backgate BG4 of the fourth transistor TP4 is connected to the power supply line Vcc. Thus, according to the output circuit related to the 29th embodiment of the present invention, the fourth transistor TP4 is provided between the backgate BG2 of the second transistor TP2 and the power supply line Vcc, the gate G3 of the third transistor TP3 is connected to the ground line GND, the backgate BG3 thereof is connected to the power supply line Vcc, and the gate G4 of the fourth transistor TP4 is connected to the inverter IN2 as shown in FIG. 33(a).

As a result, even if a voltage at a level lower than that of the ground line GND is applied to the output terminal out for instance as shown in FIG. 33(b) at time of suspension of output operation of the 29th output circuit, the third transistor TP3 (=SW2) performs OFF operation and the fourth transistor TP4 (=SW4) performs ON operation. Thus, it becomes possible to bring the backgate BG2 of the second transistor TP2 to the level of the power supply line Vcc without bringing the backgate BG2 of the second transistor TP2 to an electrically floating state as in the 13th output circuit. With this, it becomes possible to cut off a passage of a current which is going to flow out to the output terminal out from the ground line GND through a forward diode D5 which is parasitic between the ground line GND and the backgate BG2 of the second transistor TP2. Besides, the influence by a reverse diode D6 which is parasitic between the backgate BG1 of the first transistor TN1 and the output terminal out is removed by a forward diode D7 which is parasitic between the backgate BG1 of the first transistor TN1 and the power supply line Vcc, and the output terminal out is held in a high impedance state.

Further, at time of normal operation of the 29th output circuit, the third transistor TP3 performs ON operation based on the potential of the ground line GND, and the fourth transistor TP4 performs OFF operation in accordance with the output level of the inverter IN2. Thus, a potential equivalent to the output level of the output terminal out is supplied to the backgate BG2 of the second transistor TP2, and it becomes possible to reduce backgate dependency of the second transistor TP2 to the utmost.

With this, it becomes possible to maintain the output terminal out of the 29th output circuit in a high impedance state similarly to the 17th to the 28th output circuits, and to lower the output "L" level to the utmost at time of normal operation. Thus, when the 29th output circuit is integrated, stabilization of the output level is aimed at similarly to the first to the 28th output circuits, thereby improving the reliability of the semiconductor integrated circuit device.

(30) Description of the 30th embodiment

Figure 34A:
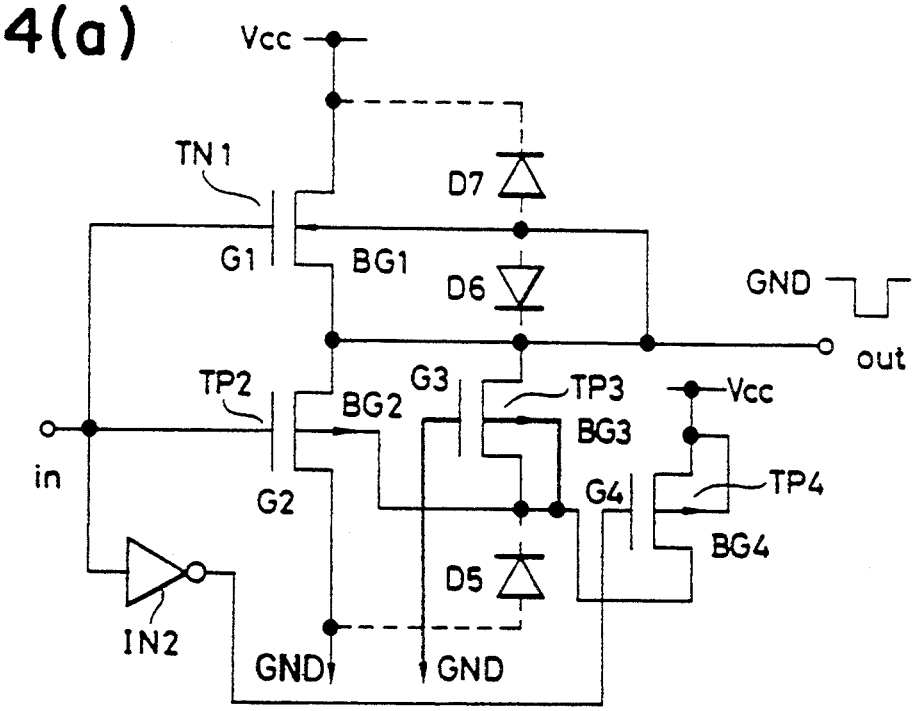
FIGS. 34(a) and 34(b) shows a circuit diagram of an output circuit according to a 30th embodiment of the present invention and an operation explanatory diagram thereof.
Figure 34B:
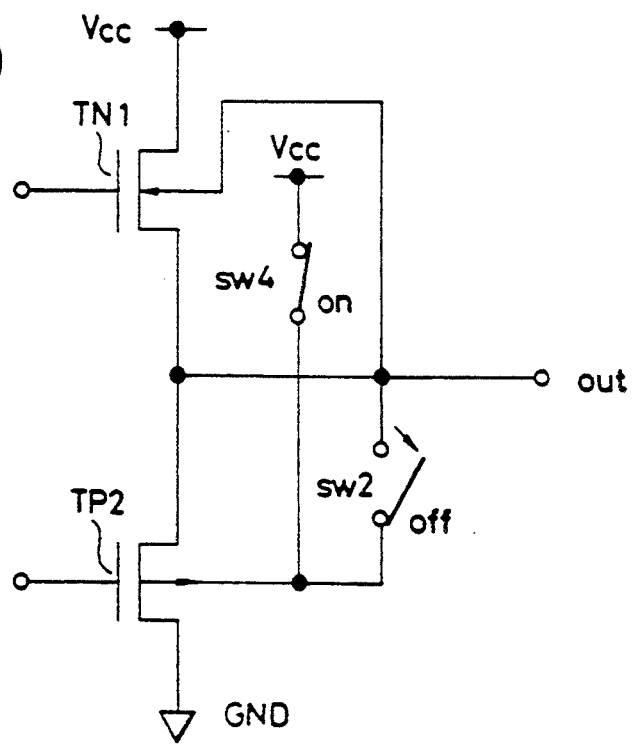

FIGS. 34(a) and 34(b) show a circuit diagram of an output circuit according to the 30th embodiment of the present invention and an operation explanatory diagram thereof, respectively. In FIG. 34(a), what differs from the 17th to the 29th embodiments is that the backgate BG3 of the third transistor TP3 is connected to the backgate BG2 of the second transistor TP2 in the 30th embodiment.

Namely, the first field effect transistor T1 in the principle diagram (2) shown in FIG. 2 is composed of an n-type field effect transistor TN1 (hereinafter referred to simply as the first transistor), and the second, the third and the fourth field effect transistors T2, T3 and T4 are composed of p-type field effect transistors TP2, TP3 and TP4 (hereinafter referred to simply as the second to the fourth transistors) similarly to the 29th embodiment. Further, the backgate BG1 of the first transistor TN1 is connected to the output terminal out, and the third transistor TP3 is connected between the backgate BG2 of the second transistor TP2 and the output terminal out. Furthermore, the gate G3 of the third transistor TP3 is connected to the ground line GND, and the backgate BG3 of the third transistor TP3 is connected to the backgate BG2 of the second transistor TP2. Besides, the fourth transistor TP4 is connected between the backgate BG2 of the second transistor TP2 and the power supply line Vcc, and the gate G4 of the fourth transistor TP4 is connected to the inverter IN2. Further, the backgate BG4 of the fourth transistor TP4 is connected to the power supply line Vcc. Thus, according to the output circuit related to the 30th embodiment of the present invention, the fourth transistor TP4 is provided between the backgate BG2 of the second transistor TP2 and the power supply line Vcc, the gate G3 of the third transistor TP3 is connected to the ground line GND, the backgate BG3 thereof is connected to the backgate BG2 of the second transistor TP2, and the gate G4 of the fourth transistor TP4 is connected to the gate G1 of the first transistor TP1 as shown in FIG. 34(a).

As a result, even if a voltage at a level lower than that of the ground line GND is applied to the output terminal out for instance as shown in FIG. 34(b) at time of suspension of output operation of the 30th output circuit, the third transistor TP3 (=SW2) performs OFF operation and the fourth transistor TP4 (=SW4) performs ON operation. Thus, it becomes possible to bring the backgate BG2 of the second transistor TP2 to the level of the power supply line Vcc without bringing the backgate BG2 of the second transistor TP2 to an electrically floating state as in the 14th output circuit. With this, it becomes possible to cut off a passage of a current which is going to flow out to the output terminal out from the ground line GND through a forward diode D5 which is parasitic between the ground line GND and the backgate BG2 of the second transistor TP2. Besides, the influence by a reverse diode D6 is parasitic between the backgate BG1 of the first transistor TN1 and the output terminal out is removed by a forward diode D7 which is parasitic between the backgate BG1 of the first transistor TN1 and the power supply line Vcc, and the output terminal out is held in a high impedance state.

Further, at time of normal operation of the 30th output circuit, the third transistor TP3 performs ON operation based on the potential of the ground line GND, and the fourth transistor TP4 performs OFF operation in accordance with the output level of the inverter IN2. Thus, a potential equivalent to the output level of the output terminal out is supplied to the backgate BG2 of the second transistor TP2 and the backgate BG3 of the third transistor TP3, and it becomes possible to reduce backgate dependency of the second transistor TP2 to the utmost.

With this, it becomes possible to maintain the output terminal out of the 30th output circuit in a high impedance state similarly to the 17th to the 29th output circuits, and to lower the output "L" level to the utmost at time of normal operation. Thus, when the 30th output circuit is integrated, stabilization of the output level is aimed at similarly to the first to the 29th output circuits, thereby improving reliability of the semiconductor integrated circuit device.

(31) Description of the 31st embodiment

Figure 35A:
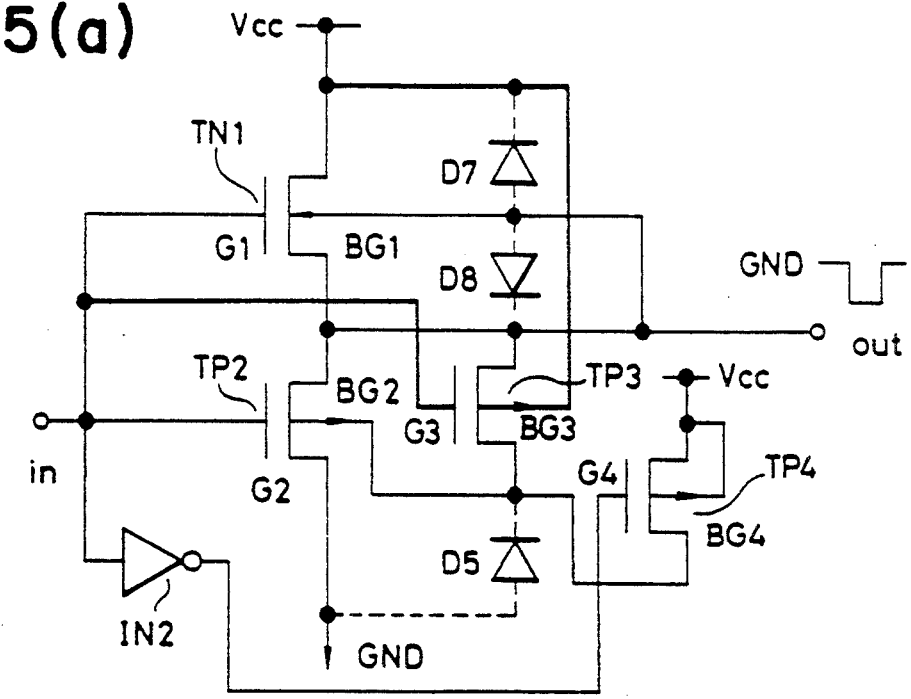
FIGS. 35(a) and 35(b) shows a circuit diagram of an output circuit according to a 31st embodiment of the present invention and an operation explanatory diagram thereof.
Figure 35B:
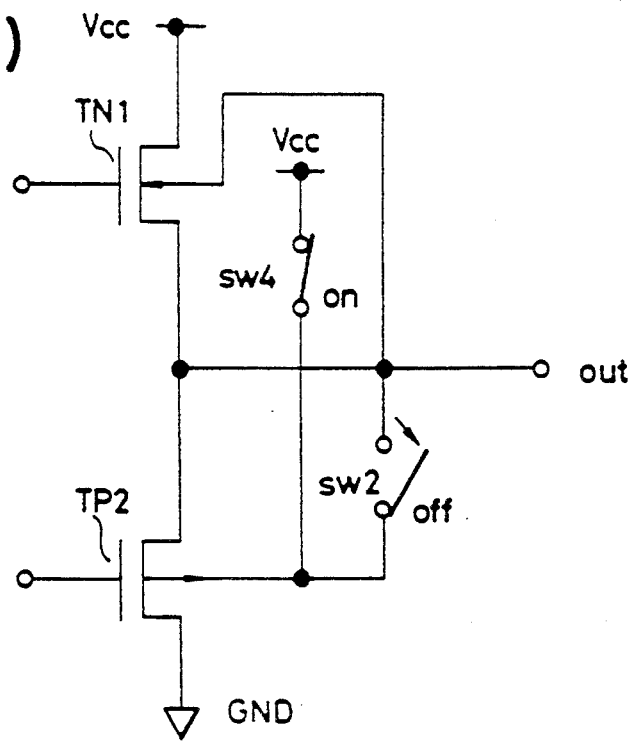

FIGS. 35(a) and 35(b) show a circuit diagram of an output circuit according to the 31st embodiment of the present invention and an operation explanatory diagram thereof, respectively. In FIG. 35(a), what differs from the 17th to the 30th embodiments is that the backgate BG3 of the third transistor TP3 is connected to the power supply line Vcc and the gate G3 thereof is connected to the common gates G1 and G2 of the first and the second transistors TN1 and TP2 in the 31st embodiment.

Namely, the first field effect transistor T1 in the principle diagram (2) shown in FIG. 2 is composed of an n-type field effect transistor TN1 (hereinafter referred to simply as the first transistor), and the second, the third and the fourth field effect transistors T2, T3 and T4 are composed of p-type field effect transistors TP2, TP3 and TP4 (hereinafter referred to simply as the second to the fourth transistors) similarly to the 29th and the 30th embodiments. Further, the backgate BG1 of the first transistor TN1 is connected to the output terminal out, and the third transistor TP3 is connected between the backgate BG2 of the second transistor TP2 and the output terminal out. Furthermore, the gate G3 of the third transistor TP3 is connected to the gate G2 of the second transistor TP2, and the backgate BG3 of the third transistor TP3 is connected to the power supply line Vcc. Besides, the fourth transistor TP4 is connected between the backgate BG2 of the second transistor TP2 and the power supply line Vcc, and the gate G4 of the fourth transistor TP4 is connected to the common gates G1 and G2 of the first and the second transistors TN1 and TP2. Further, the backgate BG4 of the fourth transistor TP4 is connected to the power supply line Vcc. Thus, according to the output circuit related to the 31st embodiment of the present invention, the fourth transistor TP4 is provided between the backgate BG2 of the second transistor TP2 and the power supply line Vcc, the gate G3 of the third transistor TP3 is connected to the gate G2 of the second transistor TP2, the backgate BG3 thereof is connected to the power supply line Vcc as shown in FIG. 35(a).

As a result, even if a voltage at a level lower than that of the ground line GND is applied to the output terminal out for instance as shown in FIG. 35(b) at time of suspension of output operation of the 31st output circuit, the third transistor TP3 (=SW2) performs OFF operation and the fourth transistor TP4 (=SW4) performs ON operation. Thus, it becomes possible to bring the backgate BG2 of the second transistor TP2 to the level of the power supply line Vcc without bringing the backgate BG2 of the second transistor TP2 to an electrically floating state as in the 15th output circuit. With this, it becomes possible to cut off a passage of a current which is going to flow out to the output terminal out from the ground line GND through a forward diode D5 which is parasitic between the ground line GND and the backgate BG2 of the second transistor TP2. Besides, the influence by a reverse diode D8 is parasitic between the backgate BG1 of the first transistor TN1 and the output terminal out is removed by a forward diode D7 which is parasitic between the backgate BG1 of the first transistor TN1 and the power supply line Vcc, and the output terminal out is held in a high impedance state.

Further, at time of normal operation of the 31st output circuit, the third transistor TP3 performs ON operation based on the input level of the gate G2 of the second transistor TP2, and the fourth transistor TP4 performs OFF operation in accordance with the output level of the inverter IN2. Thus, a potential equivalent to the output level of the output terminal out is supplied to the backgate BG2 of the second transistor TP2, and it becomes possible to reduce backgate dependency of the second transistor TP2 to the utmost.

With this, it becomes possible to maintain the output terminal out of the 31st output circuit in a high impedance state similarly to the 17th to the 30th output circuits, and to lower the output "L" level to the utmost at time of normal operation. Thus, when the 31st output circuit is integrated, stabilization of the output level is aimed at similarly to the first to the 30th output circuits, thereby improving the reliability of the semiconductor integrated circuit device.

(32) Description of the 32nd embodiment

Figure 36A:
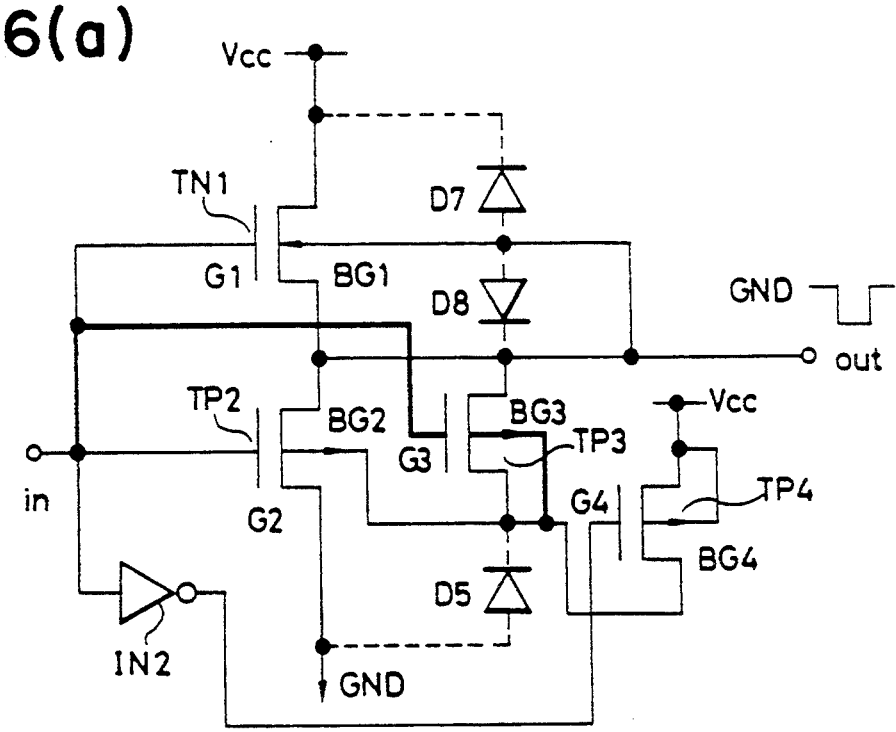
FIGS. 36(a) and 36(b) shows a circuit diagram of an output circuit according to a 32nd embodiment of the present invention and an operation explanatory diagram thereof.
Figure 36B:
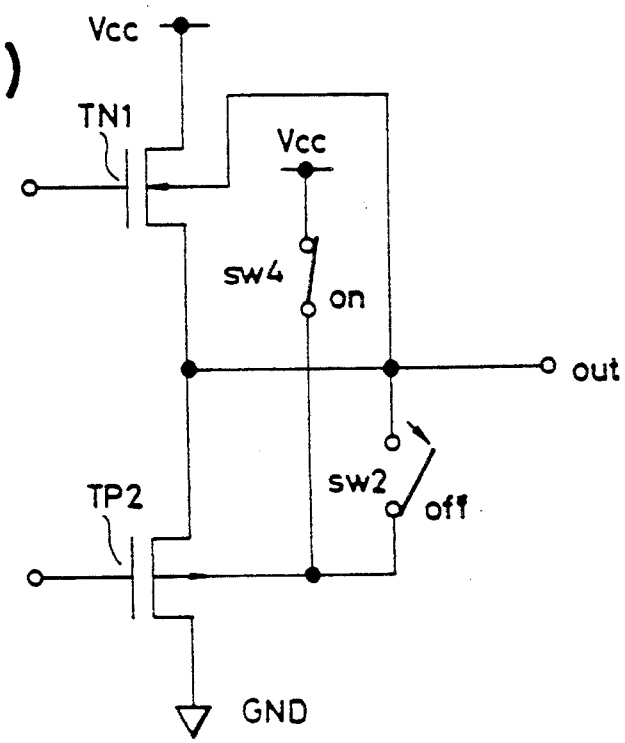

FIGS. 36(a) and 36(b) show a circuit diagram of an output circuit according to the 32nd embodiment of the present invention and an operation explanatory diagram thereof, respectively. In FIG. 36(a), what differs from the 17th to the 31st embodiments is that the backgate BG3 of the third transistor TP3 is connected to the backgate BG2 of the second transistor TP2 in the 32nd embodiments.

Namely, the first field effect transistor T1 in the principle diagram (2) shown in FIG. 2 is composed of an n-type field effect transistor TN1 (hereinafter referred to simply as the first transistor), and the second, the third and the fourth field effect transistors T2, T3 and T4 are composed of p-type field effect transistors TP2, TP3 and TP4 (hereinafter referred to simply as the second to the fourth transistors) similarly to the 29th to the 31st embodiments. Further, the backgate BG1 of the first transistor TN1 is connected to the output terminal out, and the third transistor TP3 is connected between the backgate BG2 of the second transistor TP2 and the output terminal out. Furthermore, the gate G3 of the third transistor TP3 is connected to the gate G2 of the second transistor TP2, and the backgate BG3 of the third transistor TP3 is connected to the backgate BG2 of the second transistor TP2. Besides, the fourth transistor TP4 is connected between the backgate BG2 of the second transistor TP2 and the power supply line Vcc, and the gate G4 of the fourth transistor TP4 is connected to the gate G1 of the first transistor TP1. Further, the backgate BG4 of the fourth transistor TP4 is connected to the power supply line Vcc. Thus, according to the output circuit related to the 32nd embodiment of the present invention, the fourth transistor TP4 is provided between the backgate BG2 of the second transistor TP2 and the power supply line Vcc, the gate G3 of the third transistor TP3 is connected to the gate G2 of the second transistor TP2, the backgate BG3 thereof is connected to the backgate BG2 of the second transistor TP2 as shown in FIG. 36(a).

As a result, even If a voltage at a level lower than that of the ground line GND is applied to the output terminal out for Instance as shown in FIG. 36(b) at time of suspension of output operation of the 32nd output circuit, the third transistor TP3 (=SW2) performs OFF operation and the fourth transistor TP4 (=SW4) performs ON operation. Thus, it becomes possible to bring the backgate BG2 of the second transistor TP2 to the level of the power supply line Vcc without bringing the backgate BG2 of the second transistor TP2 to an electrically floating state as in the 16th output circuit. With this, it becomes possible to cut off a passage of a current which is going to flow out to the output terminal out from the ground line GND through a forward diode D5 which is parasitic between the ground line GND and the backgate BG2 of the second transistor TP2. Besides, the influence by a reverse diode D8 is parasitic between the backgate BG1 of the first transistor TN1 and the output terminal out is removed by a forward diode D7 which is parasitic between the backgate BG1 of the first transistor TN1 and the power supply line Vcc, and the output terminal out is held in a high impedance state.

Further, at time of normal operation of the 32nd output circuit, the third transistor TP3 performs ON operation based on the input level of the gate G2 of the second transistor TP2, and the fourth transistor TP4 performs OFF operation in accordance with the output level of the inverter IN2. Thus, a potential equivalent to the output level of the output terminal out is supplied to the backgate BG2 of the second transistor TP2 and the backgate BG3 of the third transistor TP3, and it becomes possible to reduce backgate dependency of the second transistor TP2 to the utmost.

With this, it becomes possible to maintain the output terminal out of the 32nd output circuit in a high impedance state similarly to the first to the 31st output circuits, and to lower the output "L" level to the utmost at time of normal operation. Thus, when the 32nd output circuit is integrated, stabilization of the output level is aimed at similarly to the first to the 31st output circuits, thereby improving the reliability of the semiconductor integrated circuit device.

(33) Description of application example (1)

FIG. 37 shows an explanatory diagram (1) of a semiconductor integrated circuit device according to respective embodiments of the present invention. In FIG. 37, a semiconductor Integrated circuit device 101 applied with the output circuit in the principle diagram (1) shown in FIG. 1 is provided with a complementary MOS high impedance output circuit 201 (hereinafter referred to simply as a CMOS.HiZ output circuit) at an output stage thereof.

Figure 3:
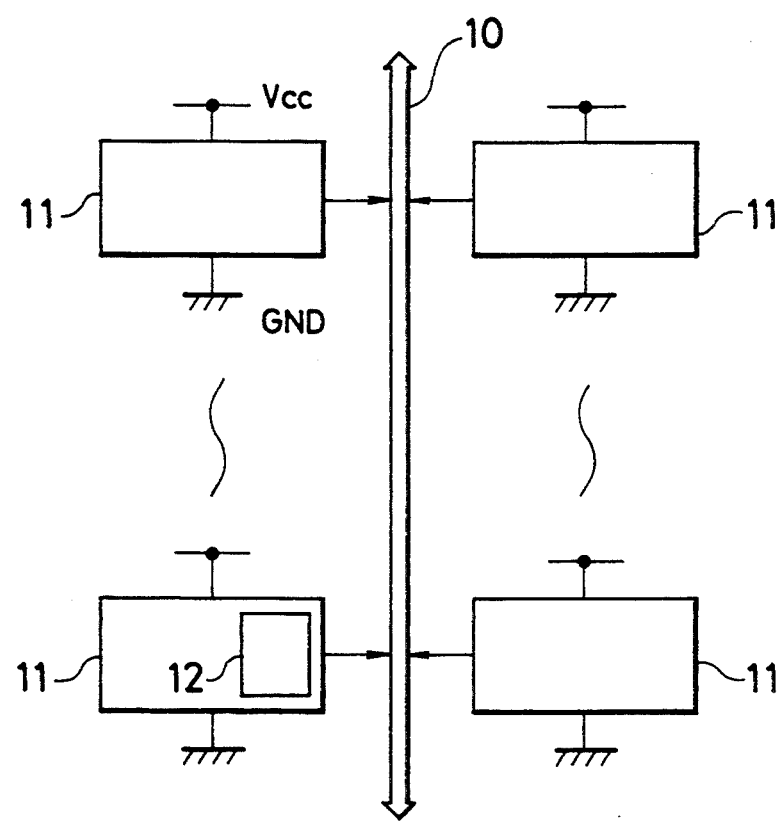
FIG. 3 is a principle diagram of a semiconductor integrated circuit device according to the present invention.

Namely, the CMOS.HiZ output circuit 201 is an embodiment of the complementary MOS high impedance output circuit 12 in the principle diagram shown in FIG. 3, and is composed of the first to the 16th output circuits of the present invention. Further, the semiconductor integrated circuit device 101 is connected to a common bus 20 representing an example of the signal transmission line 10, and each CMOS.HiZ output circuit 201 is connected to a first power supply line Vcc1 for instance. Besides, the fist power supply line Vcc1 is connected to the main power supply line Vcc through a switching element SW1.

Further, another semiconductor integrated circuit device 102 including CMOS.HiZ output circuits 201 composed of the first to the 16th output circuits of the present invention is connected to the common bus 20, and each CMOS.HiZ output circuit 201 is connected to a second power supply line Vcc2, for instance. Besides, the second power supply line Vcc2 is connected to the main power supply line Vcc through a switching element SW2. With this, it is possible to deactivate (OFF) the first power supply line Vcc1 of the semiconductor integrated circuit device 101 so as to sustain output operation thereof, and activate (ON) the second power supply line Vcc2 of another semiconductor integrated circuit device 102 so as to continue output operation thereof from the necessity for selecting a logical output signal. Thus, according to the application example (1) of the semiconductor integrated circuit device according to respective embodiments of the present invention, the first to the 16th output circuits of the present invention are applied to the CMOS.HiZ output circuits 201 of the semiconductor integrated circuit devices 101 and 102 connected to the common bus 20 as shown in FIG. 37.

As a result, even in the case that semiconductor integrated circuit devices 101 and 102, in which the first to the 16th output circuits are integrated, are packaged on a printed circuit board and the like, and power supply control is such that output operation of the semiconductor integrated circuit device 101 is sustained and output operation of the other semiconductor integrated circuit device 102 is continued, a forward diode which is parasitic in a direction toward the power supply from the output side of the semiconductor integrated circuit device 101 in which output operation has been sustained is eliminated. Hence, it becomes possible to suppress lowering of the output "H" level of the common bus 20 to the utmost.

With this, the output impedance of the semiconductor integrated circuit device 101 in which output operation has been sustained is Increased. Thus, it becomes possible to maintain the output "H" level outputted to the common bus 20 from the other semiconductor integrated circuit device 102 at a predetermined amplitude. With this, it also becomes possible to improve the reliability of the semiconductor integrated circuit device.

(34) Description of application example (2)

Figure 38:
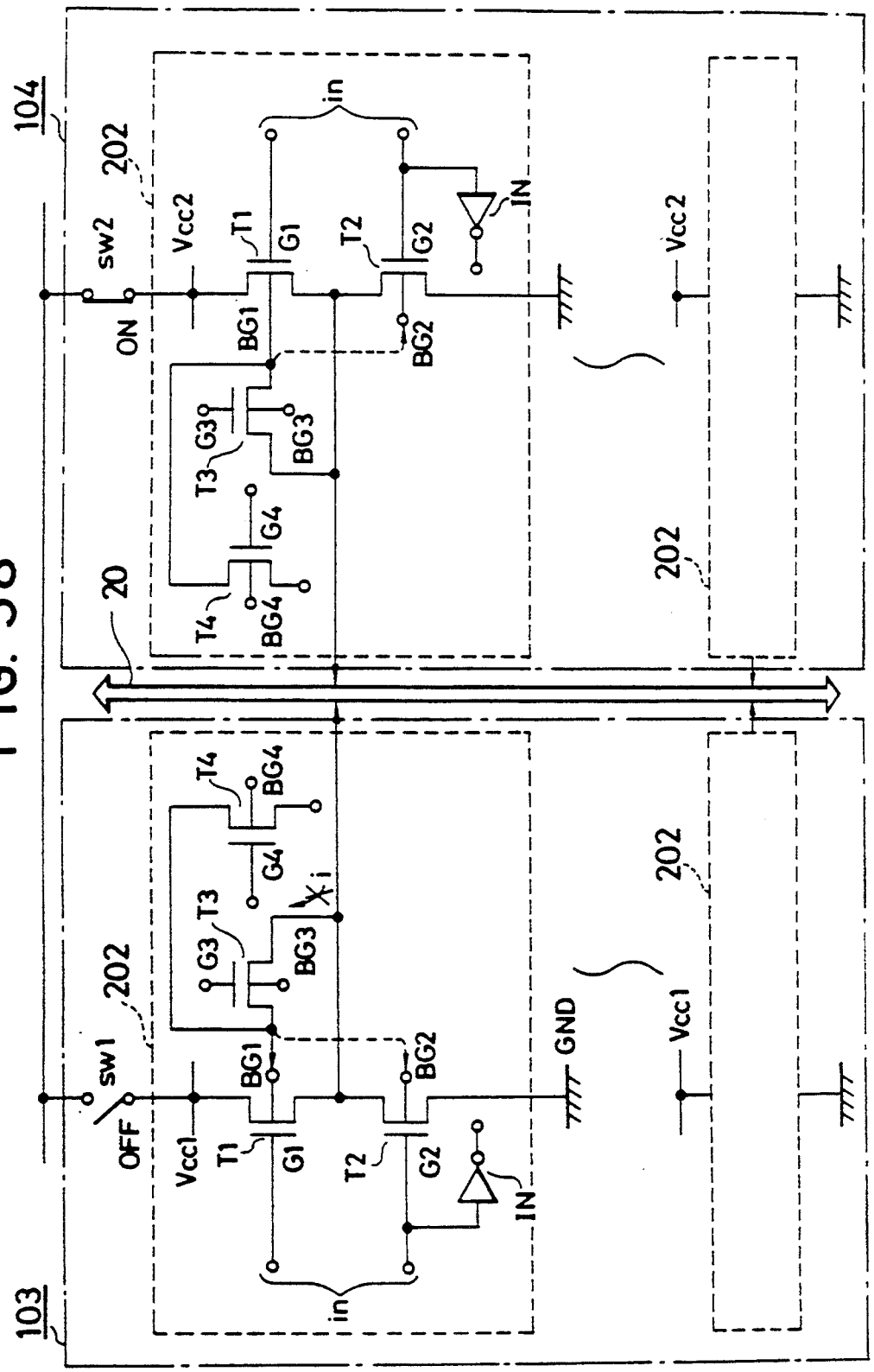
FIG. 38 is an explanatory diagram (2) of a semiconductor integrated circuit device according to respective embodiments of the present invention.
Figure 39A:
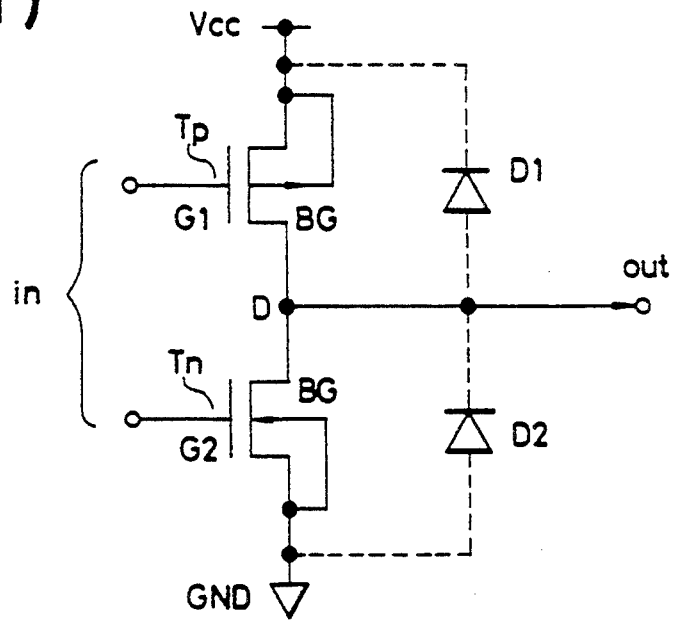
FIGS. 39(a) and 39(b) shows a first output circuit according to a conventional example and a semiconductor integrated circuit device thereof.
Figure 39B:
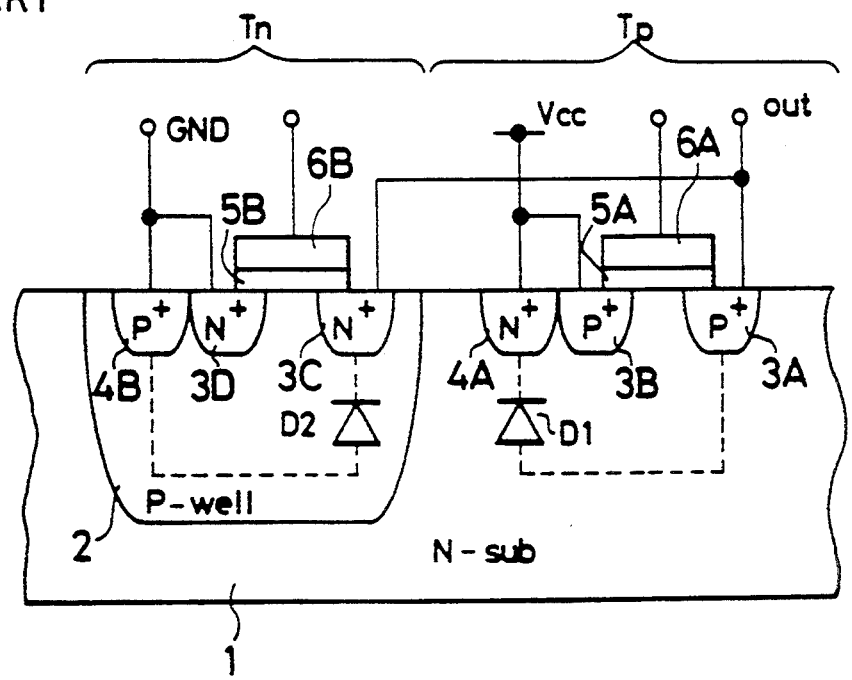
Figure 40A:
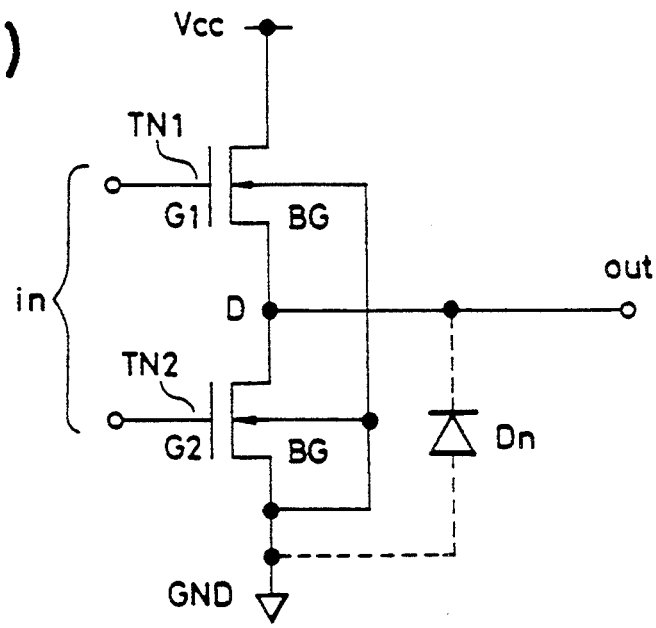
FIGS. 40(a) and 40(b) shows a second output circuit according to a conventional example and a semiconductor integrated circuit device thereof.
Figure 40B:
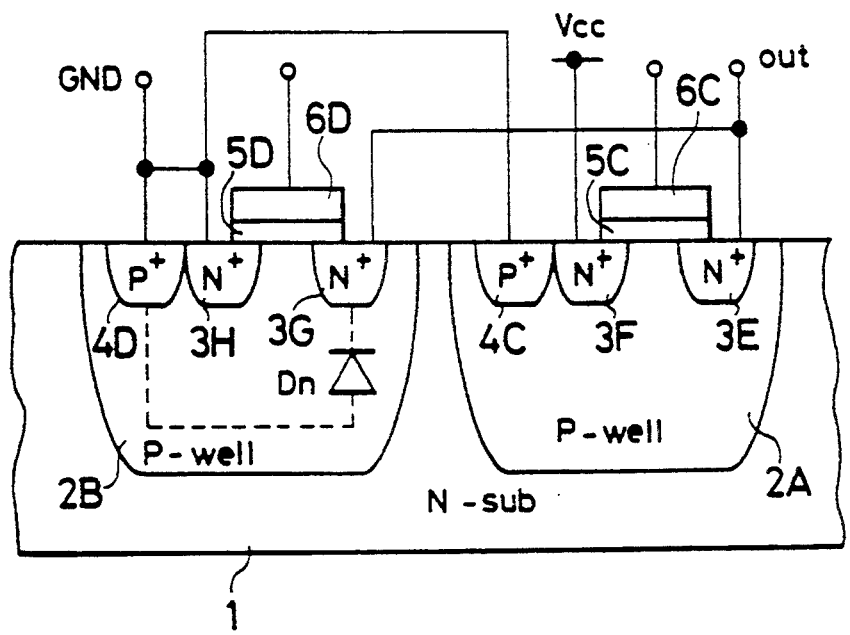
Figure 41A:
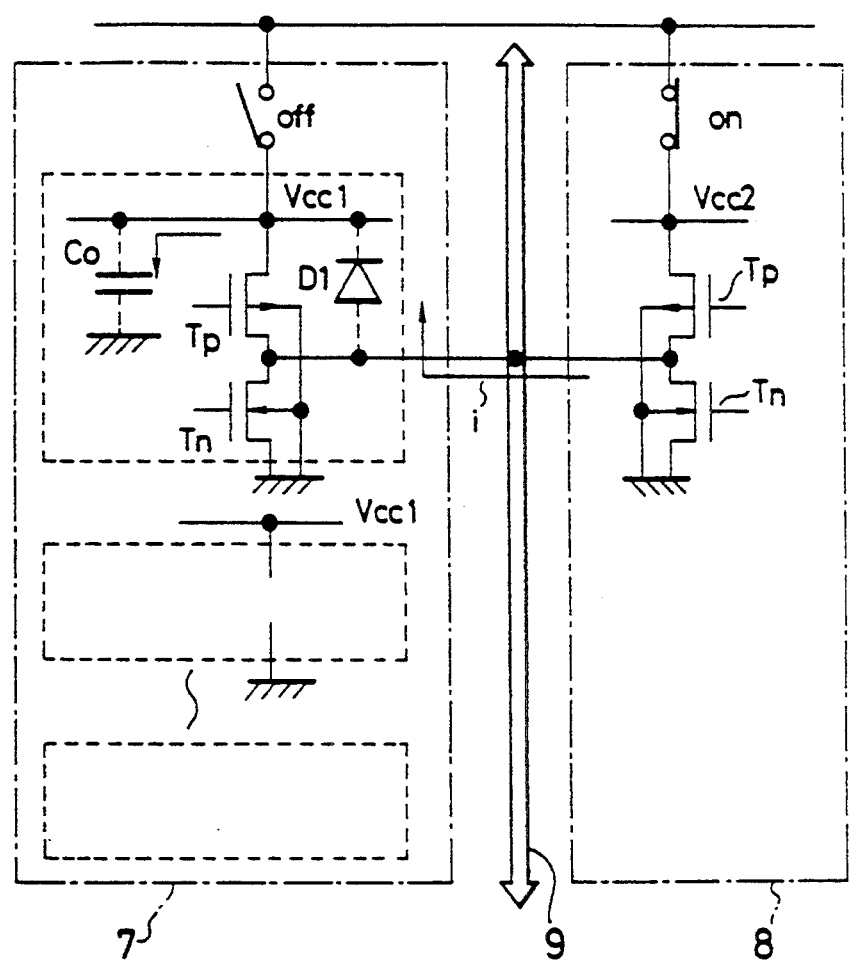
FIGS. 41(a) and 41(b) is a circuit block diagram for explaining problems of a conventional device.
Figure 41B:
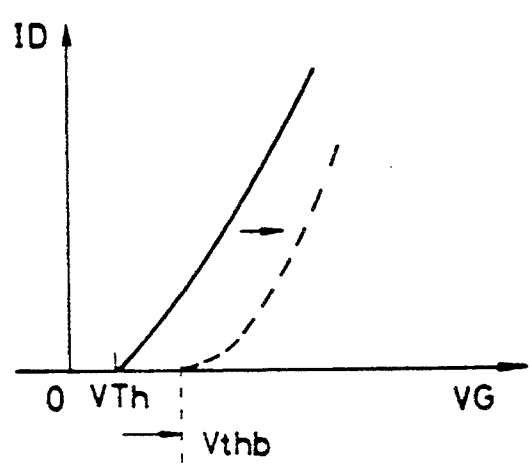

FIG. 38 shows an explanatory diagram (2) of a semiconductor integrated circuit device according to respective embodiments of the present invention. In FIG. 38, a semiconductor integrated circuit device 103 applied with the output circuit in the principle diagram (2) shown in FIG. 2 is provided with a CMOS.HiZ output circuit at an output stage thereof.

Namely, the CMOS.HiZ output circuit 202 is an embodiment of the complementary MOS high impedance output circuit 12 in the principle diagram shown in FIG. 3, and is composed of the 17th to the 32nd output circuits of the present invention. Further, the semiconductor integrated circuit device 103 is connected to a common bus 20, and each CMOS.HiZ output circuit 202 is connected to a first power supply line Vcc1, for Instance. Besides, the fist power supply line Vcc1 is connected to the main power supply line Vcc through a switching element SW1.

Further, another semiconductor integrated circuit device 104 including CMOS.HiZ output circuits 202 composed of the 17th to the 32nd output circuits of the present invention is connected to the common bus 20, and each CMOS.HiZ output circuit 202 is connected to a second power supply line Vcc2 for instance. Besides, the second power supply line Vcc2 is connected to the main power supply line Vcc through a switching element SW2. With this, it is possible to deactivate (OFF) the first power supply line Vcc1 of the semiconductor integrated circuit device 101 so as to sustain output operation thereof, and activate (ON) the second power supply line Vcc2 of another semiconductor integrated circuit device 102 so as to continue output operation thereof from the necessity for selecting a logical output signal. Thus, according to the application example (2) of the semiconductor integrated circuit device according to respective embodiments of the present invention, the 17th to the 32nd output circuits of the present invention are applied to the CMOS.HiZ output circuits 202 of the semiconductor integrated circuit devices 103 and 104 connected to the common bus 20 as shown in FIG. 38.

As a result, even in the case that semiconductor integrated circuit devices 103 and 104, in which the 17th to the 32nd output circuits are integrated, are packaged on a printed circuit board and the like, power supply control is such that output operation of the semiconductor integrated circuit device 103 is sustained and output operation of the other semiconductor integrated circuit device 104 is continued, a forward diode which is parasitic in a direction toward the power supply from the output side of the semiconductor integrated circuit device 103 in which output operation has been sustained is eliminated. Hence, it becomes possible to suppress lowering of the output "H" level of the common bus 20 to the utmost.

With this, the output impedance of the semiconductor integrated circuit device 103 in which output operation has been sustained is increased. Thus, it becomes possible to maintain the output "H" level outputted to the common bus 20 from the other semiconductor integrated circuit device 104 at a predetermined amplitude. With this, it also becomes possible to improve the reliability of the semiconductor integrated circuit device.

What is claimed is:

1. An output circuit connected between first and second power supply lines of different, respective power source potentials and receiving complementary input signals and having an output terminal, said output circuit comprising:
    a first field effect transistor of a first conductivity type having a first gate, a first backgate and a channel, the channel having a first end connected to the first power supply line and a second end, comprising a drain junction, connected to the output terminal;
    a second field effect transistor of said first conductivity type having a second gate, a second backgate and a channel, the channel having a first end connected to said drain junction of said first field effect transistor and a second end connected to the second power supply line and thereby being connected in series with the channel of said first field effect transistor between the first and second power supply lines;
    said first and second gates respectively receiving the complementary input signals;
    a third field effect transistor having a third gate, a third backgate and a channel, the channel having a first end connected to one of said first and second backgates and a second end connected to said output terminal, said third field effect transistor controlling said one of said first and second backgates;
    wherein,
    each of said first, second and third field effect transistors is an n-type field effect transistor;
    the first end of the channel of said third field effect transistor is connected to the first backgate and the second end of the channel of said third field effect transistor is connected to said output terminal;
    the third gate is connected to one of the first power supply line and the first gate;
    the third backgate is connected to one of the second power supply line and the first backgate; and
    the second backgate is connected to the second power supply line.

2. The output circuit according to claim 1, further comprising:
    a fourth field effect transistor having a fourth gate, a fourth backgate and a channel, the channel having a first end connected to said one of said first and second backgates and a second end connected to one of the first and second power supply lines, said fourth field effect transistor operating complementarily with said third field effect transistor and controlling said one of said first and second backgates;
    wherein,
    said fourth field effect transistor is an n-type field effect transistor;
    the third gate is connected to the first power supply line;
    the first end of the channel of said fourth field effect transistor is connected to the first backgate and the second end of the channel of said fourth field effect transistor is connected to said second power supply line;
    the fourth backgate is connected to the second power supply line; and
    the fourth gate is connected to the second gate.

3. The output circuit according to claim 1, further comprising:
    a fourth field effect transistor having a fourth gate, a fourth backgate and a channel, the channel having a first end connected to said one of said first and second backgates and a second end connected to one of the first and second power supply lines, said fourth field effect transistor operating complementarily with said third field effect transistor and controlling said one of said first and second backgates;
    wherein,
    said fourth field effect transistor is an n-type field effect transistor;
    the third gate is connected to the first gate;
    the first end of the channel of said fourth field effect transistor is connected to the first backgate and the second end of the channel of said fourth field effect transistor is connected to said second power supply line;
    the fourth backgate is connected to the second power supply line; and
    the fourth gate is connected to the second gate.

4. An output circuit connected between first and second power supply lines of different, respective power source potentials and receiving complementary input signals and having an output terminal, said output circuit comprising:
    a first field effect transistor of a first conductivity type having a first gate, a first backgate and a channel, the channel having a first end connected to the first power supply line and a second end, comprising a drain junction, connected to the output terminal;
    a second field effect transistor of said first conductivity type having a second gate, a second backgate and a channel, the channel having a first end connected to said drain junction of said first field effect transistor and a second end connected to the second power supply line and thereby being connected in series with the channel of said first field effect transistor between the first and second power supply lines;
    said first and second gates respectively receiving the complementary input signals;
    a third field effect transistor having a third gate, a third backgate and a channel, the channel having a first end connected to one of said first and second backgates and a second end connected to said output terminal, said third field effect transistor controlling said one of said first and second backgates;

wherein,
each of said first, second and third field effect transistors is a p-type field effect transistor;
the first backgate is connected to the first power supply line;
the first end of the channel of said third field effect transistor is connected to the second backgate and the second end of the channel of said third field effect transistor is connected to said output terminal;
the third gate is connected to one of the second power supply line and the second gate; and
the third backgate is connected to one of the first power supply line and the second backgate.

5. The output circuit according to claim 4, further comprising:
a fourth field effect transistor having a fourth gate, a fourth backgate and a channel, the channel having a first end connected to said one of said first and second backgates and a second end connected to one of the first and second power supply lines, said fourth field effect transistor operating complementarily with said third field effect transistor and controlling said one of said first and second backgates;
wherein,
said fourth field effect transistor is a p-type field effect transistor;
the third gate is connected to the second power supply line;
the first end of the channel of said fourth field effect transistor is connected to the second backgate and the second end of the channel of said fourth field effect transistor is connected to said first power supply line;
the fourth backgate is connected to the first power supply line; and
the fourth gate is connected to the first gate.

6. The output circuit according to claim 4, further comprising:
a fourth field effect transistor having a fourth gate, a fourth backgate and a channel, the channel having a first end connected to said one of said first and second backgates and a second end connected to one of the first and second power supply lines, said fourth field effect transistor operating complementarily with said third field effect transistor and controlling said one of said first and second backgates;
wherein,
said fourth field effect transistor is a p-type field effect transistor;
the third gate is connected to the second gate;
the first end of the channel of said fourth field effect transistor is connected to the second backgate and the second end of the channel of said fourth field effect transistor is connected to said first power supply line;
the fourth backgate is connected to the first power supply line; and
the fourth gate is connected to the first gate.

7. An output circuit connected between first and second power supply lines respectively of relatively high and low potentials and receiving identical input signals and having an output terminal, said output circuit comprising:
a first field effect transistor of n-type having a first gate, a first backgate and a channel, the channel having a first end connected to the first power supply line and a second end, comprising a drain junction, connected to the output terminal;
a second field effect transistor of p-type having a second gate, a second backgate and a channel, the channel having a first end connected to said drain junction of said first field effect transistor and a second end connected to the second power supply line and thereby being connected in series with the channel of said first field effect transistor between the first and second power supply lines;
said first and second gates respectively receiving the identical input signals;
a third field effect transistor having a third gate, a third backgate and a channel, the channel having a first end connected to one of said first and second backgates and a second end connected to said output terminal, said third field effect transistor controlling said one of said first and second backgates;
wherein,
each of said first and third field effect transistors is an n-type field effect transistor;
said second field effect transistor is a p-type field effect transistor;
the first end of the channel of said third field effect transistor is connected to the first backgate and the second end of the channel of said third field effect transistor is connected to said output terminal;
the third gate of said third field effect transistor is connected to one of the first power supply line and the first gate;
the third backgate is connected to one of the second power supply line and the first backgate; and
the second backgate is connected to said output terminal.

8. The output circuit according to claim 7, further comprising:
a fourth field effect transistor having a fourth gate, a fourth backgate and a channel, the channel having a first end connected to said one of said first and second backgates and a second end connected to one of the first and second power supply lines, said fourth field effect transistor operating complementarily with said third field effect transistor and controlling said one of said first and second backgates;
wherein,
said fourth field effect transistor is an n-type field effect transistor;
the third gate is connected to the first power supply line;
the first end of the channel of said fourth field effect transistor is connected to the first backgate and the second end of the channel of said fourth field effect transistor is connected to said second power supply line;
the fourth backgate is connected to the second power supply line; and
the fourth gate receives a corresponding input signal that is inverted with respect to the identical input signals.

9. The output circuit according to claim 7, further comprising:
a fourth field effect transistor having a fourth gate, a fourth backgate and a channel, the channel having a first end connected to said one of said first and second backgates and a second end connected to one of the first and second power supply lines, said fourth field effect transistor operating complementarily with said third field effect transistor and controlling said one of said first and second backgates;

wherein, said fourth field effect transistors is an n-type field effect transistor;

the third gate is connected to the first gate;

the first end of the channel of said fourth field effect transistor is connected to the first backgate and the second end of the channel of said fourth field effect transistor is connected to said second power supply line;

the fourth backgate is connected to the second power supply line; and the fourth gate receives a corresponding input signal that is inverted with respect to the identical input signals.

10. An output circuit connected between first and second power supply lines respectively of relatively high and low potentials and receiving identical input signals and having an output terminal, said output circuit comprising:

a first field effect transistor of n-type having a first gate, a first backgate and a channel, the channel having a first end connected to the first power supply line and a second end, comprising a drain junction, connected to the output terminal;

a second field effect transistor of p-type having a second gate, a second backgate and a channel, the channel having a first end connected to said drain junction of said first field effect transistor and a second end connected to the second power supply line and thereby being connected in series with the channel of said first field effect transistor between the first and second power supply lines;

said first and second gates respectively receiving the identical input signals;

a third field effect transistor having a third gate, a third backgate and a channel, the channel having a first end connected to one of said first and second backgates and a second end connected to said output terminal, said third field effect transistor controlling said one of said first and second backgates;

wherein, said first field effect transistor is an n-type field effect transistor;

each of said second and third field effect transistors is a p-type field effect transistor;

said first backgate is connected to said output terminal;

the first end of the channel of said third field effect transistor is connected to the second backgate and the second end of the channel of said third field effect transistor is connected to said output terminal;

the third gate is connected to one of the second power supply line and the second gate; and the third backgate is connected to one of the first power supply line and the second backgate.

11. The output circuit according to claim 10, further comprising:

a fourth field effect transistor having a fourth gate, a fourth backgate and a channel, the channel having a first end connected to said one of said first and second backgates and a second end connected to one of the first and second power supply lines, said fourth field effect transistor operating complementarily with said third field effect transistor and controlling said one of said first and second backgates;

wherein, said fourth field effect transistor is a p-type field effect transistor;

the third gate is connected to the second power supply line;

the first end of the channel of said fourth field effect transistor is connected to the second backgate and the second end of the channel of said fourth field effect transistor is connected to said first power supply line;

the fourth backgate is connected to the first power supply line; and the fourth gate receives a corresponding input signal that is inverted with respect to the identical input signals.

12. An output circuit according to claim 10, further comprising:

a fourth field effect transistor having a fourth gate, a fourth backgate and a channel, the channel having a first end connected to said one of said first and second backgates and a second end connected to one of the first and second power supply lines, said fourth field effect transistor operating complementarily with said third field effect transistor and controlling said one of said first and second backgates;

wherein, said fourth field effect transistor is a p-type field effect transistor;

the third gate is connected to the second gate;

the first end of the channel of said fourth field effect transistor is connected to the second backgate and the second end of the channel of said fourth field effect transistor is connected to said first power supply line;

the fourth backgate is connected to the first power supply line; and the fourth gate receives a corresponding input signal that is inverted with respect to the identical input signals.

* * * * *

UNITED STATES PATENT AND TRADEMARK OFFICE
CERTIFICATE OF CORRECTION

PATENT NO. : 5,434,526
DATED : July 18, 1995
INVENTOR(S) : Syouichi TANIGASHIRA, et al.

It is certified that error appears in the above-indentified patent and that said Letters Patent is hereby corrected as shown below:

Col. 7, line 67, "tills," should be --this--;
line 68, "suspension the" should be --suspension of the--.

Col. 8, line 49, "a 8th" should be --an 8th--;
line 60, "a 11th" should be --an 11th--.

Col. 10, line 32, "1st to a 32nd" should be --1st to 32nd--.

Col. 11, line 64, "to" should be deleted.

Col. 16, line 26, "to," should be --to--.

Col. 22, line 17, "rollability" should be --reliability--;
line 46, "13th invention shown in FIG. 17(a) of the present em-" should be --13th embodiment of the present invention shown in FIG. 17(a),--
line 47, "bodiment," should be deleted.

UNITED STATES PATENT AND TRADEMARK OFFICE
CERTIFICATE OF CORRECTION

PATENT NO. : 5,434,526
DATED : July 18, 1995
INVENTOR(S) : Syouichi TANIGASHIRA, et al.

It is certified that error appears in the above-indentified patent and that said Letters Patent is hereby corrected as shown below:

Col. 23, line 43, "14th invention" should be --14th embodiment--;
         line 43, "embodiment," should be --invention,--.

Col. 24, line 45, "15th invention shown in FIG. 19(a) of the present em-" should be --15th embodiment of the present invention shown in FIG. 19(a)--;
         line 46, "bodiment," should be deleted.

Col. 25, line 49, "16th invention" should be --16th embodiment--;
         line 49, "embodiment," should be --invention,--.

Col. 26, line 18, "is provide" should be --is provided--.

Col. 33, line 35, "the transistor" should be --the third transistor--.

UNITED STATES PATENT AND TRADEMARK OFFICE
CERTIFICATE OF CORRECTION

PATENT NO. : 5,434,526
DATED : July 18, 1995
INVENTOR(S) : Syouichi TANIGASHIRA, et al.

It is certified that error appears in the above-indentified patent and that said Letters Patent is hereby corrected as shown below:

Col. 40, line 40, "tor the second, third and fourth transistors are p-type" should be --tor TN1 is an n-type field effect transistor the second, third and fourth transistors are p-type field effect transistors, respectively,--;

line 41, "field effect transistors, respectively, TN1 is replaced" should be deleted.

line 42, "with an n-type field effect transistor," should be deleted.

Col. 42, line 63, "improving" should be --improving the--.

Signed and Sealed this

Seventh Day of May, 1996

Attest:

BRUCE LEHMAN

Attesting Officer

Commissioner of Patents and Trademarks